US008637929B2

(12) United States Patent
Satoh et al.

(10) Patent No.: US 8,637,929 B2
(45) Date of Patent: Jan. 28, 2014

(54) LDMOS TRANSISTOR HAVING A GATE ELECTRODE FORMED OVER THICK AND THIN PORTIONS OF A GATE INSULATION FILM

(75) Inventors: Shigeo Satoh, Yokohama (JP); Takae Sukegawa, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 72 days.

(21) Appl. No.: 13/270,661

(22) Filed: Oct. 11, 2011

(65) Prior Publication Data

US 2012/0161230 A1  Jun. 28, 2012

(30) Foreign Application Priority Data

Dec. 28, 2010  (JP) ................................. 2010-294230

(51) Int. Cl.
*H01L 29/76* (2006.01)

(52) U.S. Cl.
USPC ........... 257/336; 257/339; 257/340; 257/343; 257/409; 257/E29.267

(58) Field of Classification Search
USPC ........... 257/336, 339, 340, 343, 409, E29.268
See application file for complete search history.

(56) References Cited

U.S. PATENT DOCUMENTS

| 5,907,173 | A  | * | 5/1999  | Kwon et al. ................... 257/336 |
| 6,441,431 | B1 | * | 8/2002  | Efland et al. ................... 257/335 |
| 6,468,870 | B1 |   | 10/2002 | Kao et al. |
| 7,279,744 | B2 | * | 10/2007 | Gammel et al. ............... 257/335 |
| 7,315,062 | B2 | * | 1/2008  | Ohtake ........................... 257/335 |
| 7,405,443 | B1 | * | 7/2008  | Zuniga et al. ................... 257/328 |
| 2003/0141559 | A1 | * | 7/2003 | Moscatelli et al. ............ 257/406 |
| 2005/0179085 | A1 |   | 8/2005 | Yamauchi et al. |
| 2006/0113627 | A1 |   | 6/2006 | Chen et al. |
| 2007/0252212 | A1 | * | 11/2007 | Onsongo et al. .............. 257/355 |
| 2009/0267145 | A1 | * | 10/2009 | Pearce et al. .................. 257/336 |
| 2012/0319182 | A1 | * | 12/2012 | Satoh et al. ................... 257/288 |

FOREIGN PATENT DOCUMENTS

| JP | 2004-207517 A | 7/2004 |
| JP | 2005-228906 A | 8/2005 |
| JP | 2006-086272 A | 3/2006 |
| JP | 2006-156990 A | 6/2006 |

OTHER PUBLICATIONS

Contiero, C. et al., "Progress in Power ICs and MEMS, 'Analog' Technologies to interface the Real World", Proc. 2004 International Symposium on Power Semiconductor Devices & ICs, Kitakyushu, 2004, p. 3-12.

* cited by examiner

*Primary Examiner* — Anh Mai

(74) *Attorney, Agent, or Firm* — Westman, Hattori, Daniels & Adrian, LLP

(57) ABSTRACT

A disclosed MOS transistor has a drain region offset from a gate electrode structure, wherein the gate electrode structure includes at least a first gate electrode and a second gate electrode such that the second gate electrode is located at the drain side of the first gate electrode and the second gate electrode is isolated from the first gate electrode by an insulation film, and wherein the first and second gate electrodes are formed respectively on a first gate insulation film and a second gate insulation film having an increased thickness as compared with the first gate insulation film.

8 Claims, 46 Drawing Sheets

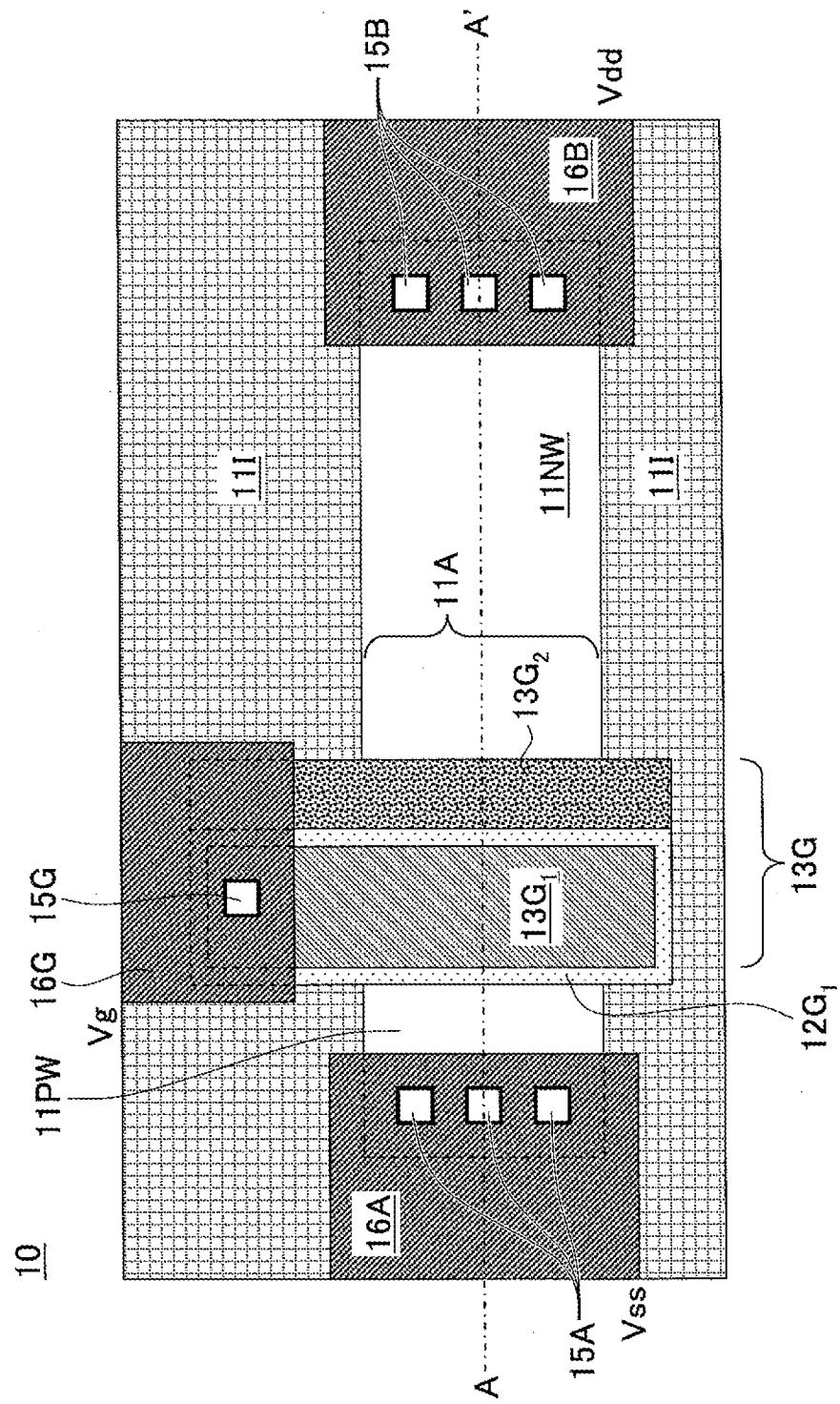

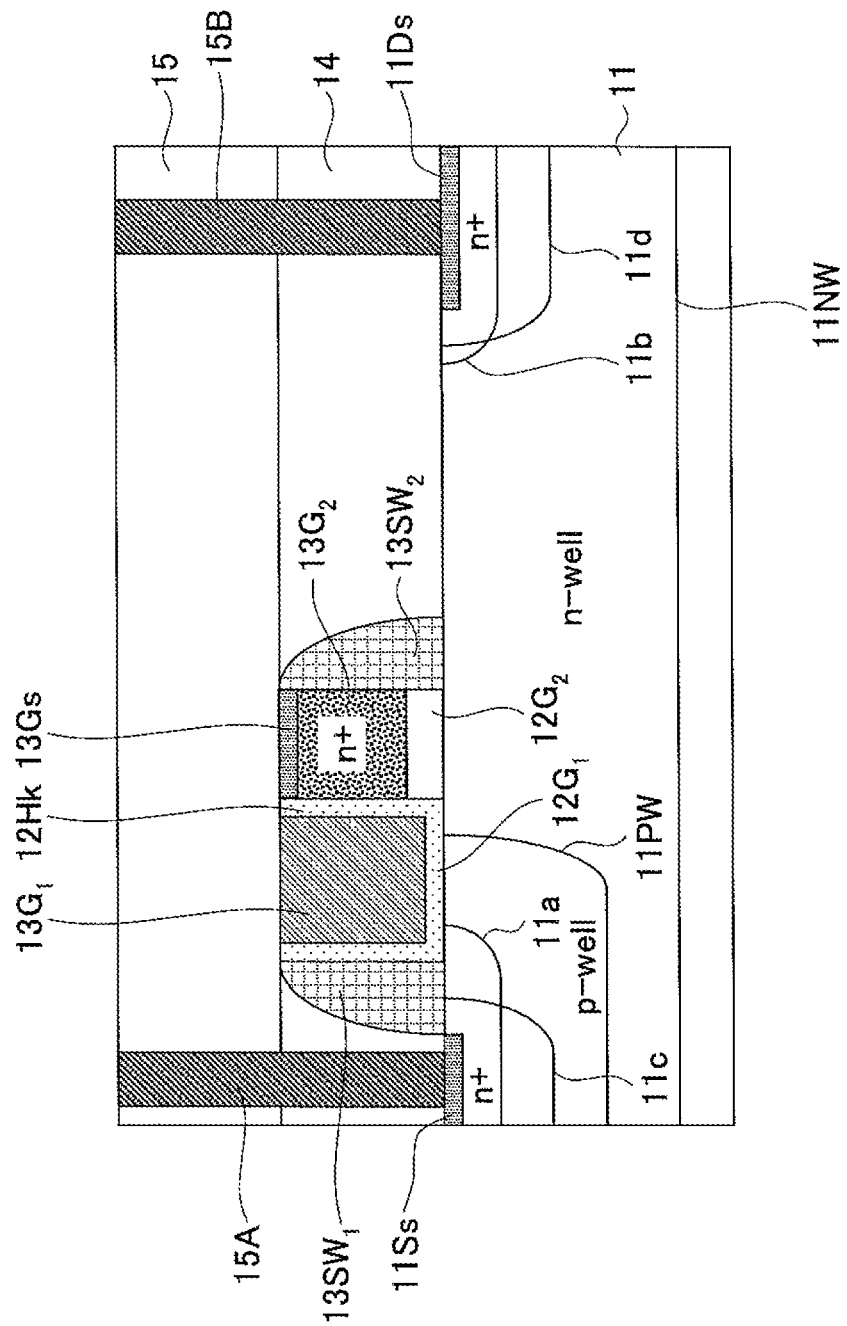

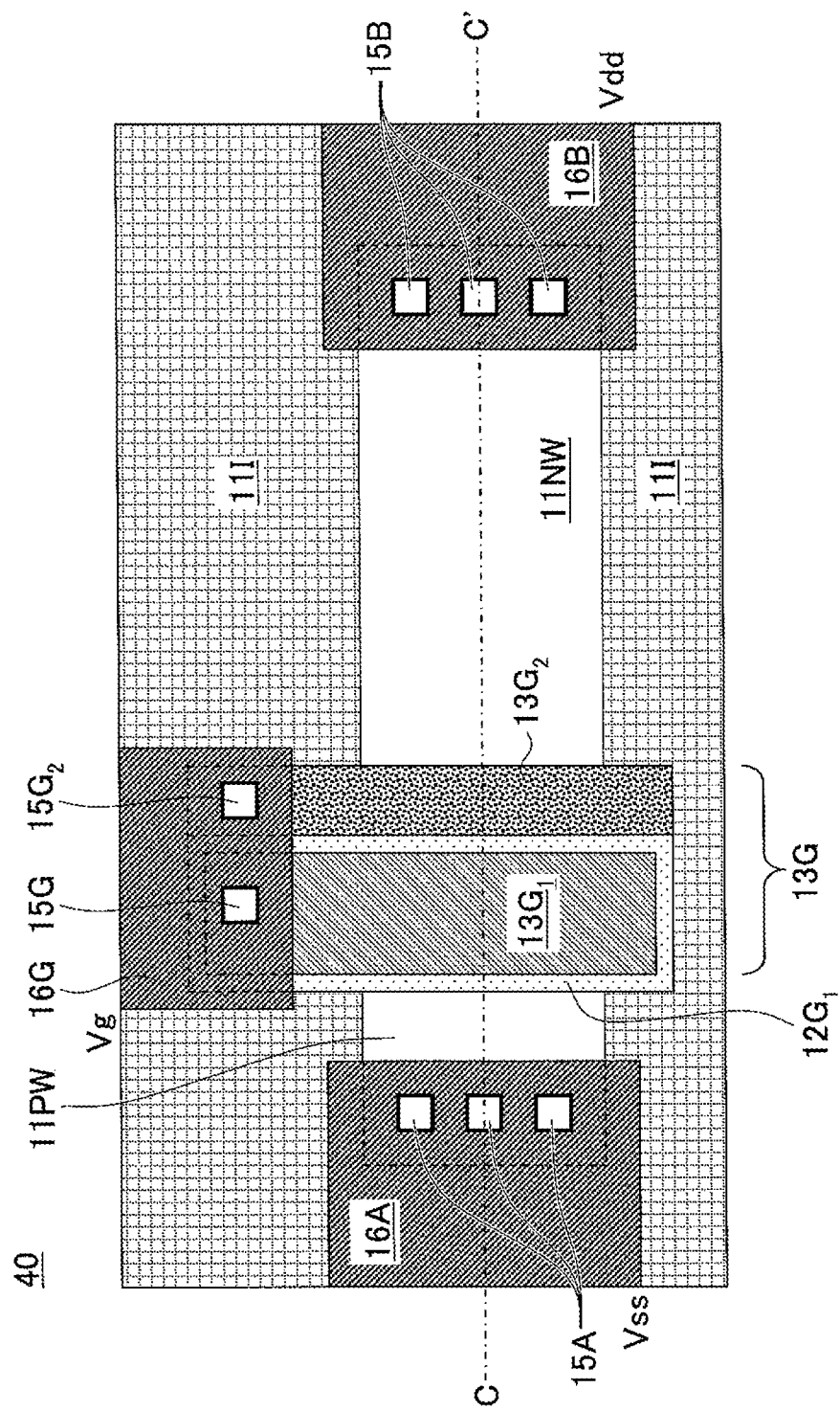

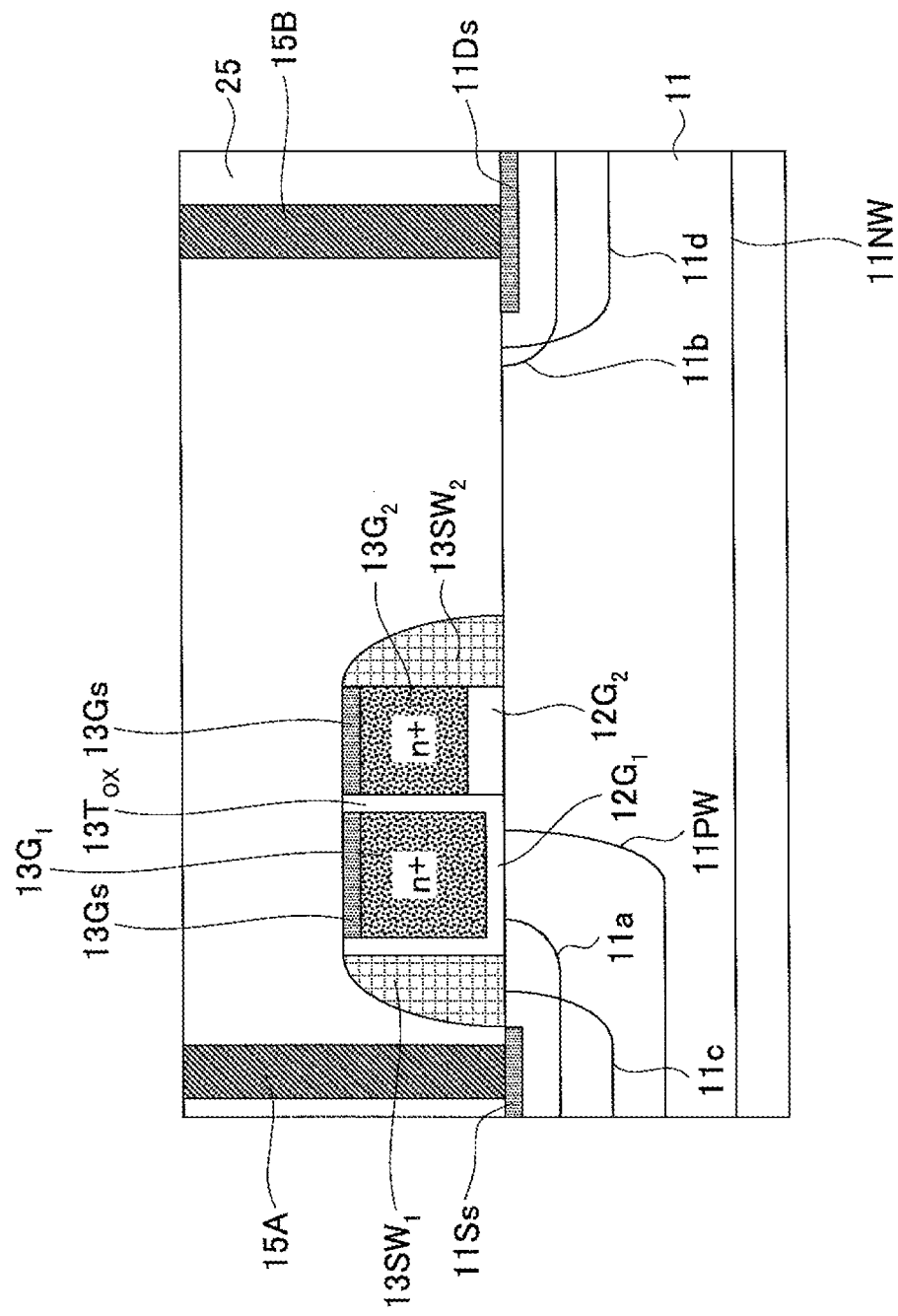

LDMOS TRANSISTOR HAVING A GATE ELECTRODE FORMED OVER THICK AND THIN PORTIONS OF A GATE INSULATION FILM

CROSS-REFERENCE TO RELATED APPLICATIONS

This application is based upon and claims the benefit of priority of the prior Japanese Patent Application 2010-294230, filed on Dec. 28, 2010, the entire contents of which are hereby incorporated herein by reference.

FIELD

The embodiments described herein relate to MOS transistors and fabrication process thereof.

BACKGROUND

In so-called high-voltage MOS transistors, there is a tendency that heavy concentration of electric field takes place in the vicinity of drain edge of the channel region, and thus, the breakdown voltage at the drain edge is an important issue. Such a high-voltage MOS transistor may be used in various applications such as in-vehicle applications, power applications, and the like.

It is preferable to integrate such a high-voltage MOS transistor in the form of an integrated circuit together with logic circuits, and the like. On the other hand, when such a high-voltage MOS transistor is integrated with logic circuits, the gate insulation film is formed to have a small thickness similarly to the transistors of logic circuits. Thus, in such a high-voltage MOS transistor, there is used a construction in which the drain region is formed with large separation from the gate electrode such that there is formed a drift region between the gate electrode and the drain region for improving the breakdown voltage in the vicinity of the drain edge. For example, there is a so-called LDMOS (Laterally Diffused MOS) structure. Reference should be made to the Patent References 1 and 2 and further the Non-Patent Reference 1.

With a high-voltage MOS transistor of the LDMOS structure, there is a demand for reducing the ON-resistance and at the same time to improve the breakdown voltage for enabling operation under further higher voltage.

With the construction of the Patent Reference 1 or 2, the gate insulation film is formed to have an increased film thickness at the drain edge of the gate electrode for improvement of the transistor breakdown voltage. With such a construction, there is a need for the carriers, flowing from the source region to the drain region, to flow under another insulation film formed underneath the gate insulation film along a flow path circumventing the another insulation film, while such a circumventing flow path of the carriers causes the problem of increased ON-resistance and also the problem of concentration of electric field associated with the bend of the carrier flow path underneath the another insulation film. When such concentration of electric field takes place, the breakdown voltage tends to be degraded.

PRIOR ART REFERENCES

Patent References

Patent Reference 1 U.S. Pat. No. 6,468,870
Patent Reference 2 Japanese Laid-Open Patent Publication 2006-156990
Patent Reference 3 Japanese Laid-Open Patent Publication 2004-207517
Patent Reference 4 Japanese Laid-Open Patent Publication 2005-228906
Patent Reference 5 Japanese Laid-Open Patent Publication 2006-86272

Non-Patent References

[Non-Patent Reference 1] Contiero, C., et al., Proc. 2004 International Symposium on Power Semiconductor Devices & ICs, Kitakyushu

SUMMARY

In an aspect, there is provided a MOS transistor having a drain region offset from a gate electrode structure, the gate electrode structure including at least a first gate electrode and a second gate electrode such that the second gate electrode is located at the drain side of the first gate electrode wherein the second gate electrode is isolated from the first gate electrode by an insulation film, and wherein the first and second gate electrodes are formed respectively on a first gate insulation film and a second gate insulation film having an increased thickness as compared with the first gate insulation film.

Additional objects and advantages of the embodiments will be set forth in part in the description which follows, and in part will be obvious from the description, or may be learned by practice of the disclosures. The object and advantages of the disclosures will be realized and attained by means of the elements and combinations particularly pointed out in the appended claims.

It is to be understood that both the foregoing general description and the following detailed description are exemplary and explanatory only and are not restrictive of the disclosures, as claimed.

BRIEF DESCRIPTION OF DRAWINGS

FIG. 1A is a plan view diagram representing a high-voltage MOS transistor according to a first embodiment;
FIGS. 3A-3K are diagrams depicting the fabrication process of the high-voltage MOS semiconductor of the first embodiment;
FIG. 8A is a plan view diagram representing a high-voltage MOS transistor according to a fourth embodiment.

FIGS. 11A-11H are diagrams depicting the fabrication process of the high-voltage MOS semiconductor of the fifth embodiment;

DESCRIPTION OF EMBODIMENT

Embodiments that describe the best mode for carrying out the present disclosures are explained next with reference to the drawings.

[First Embodiment]

Figure 1B:
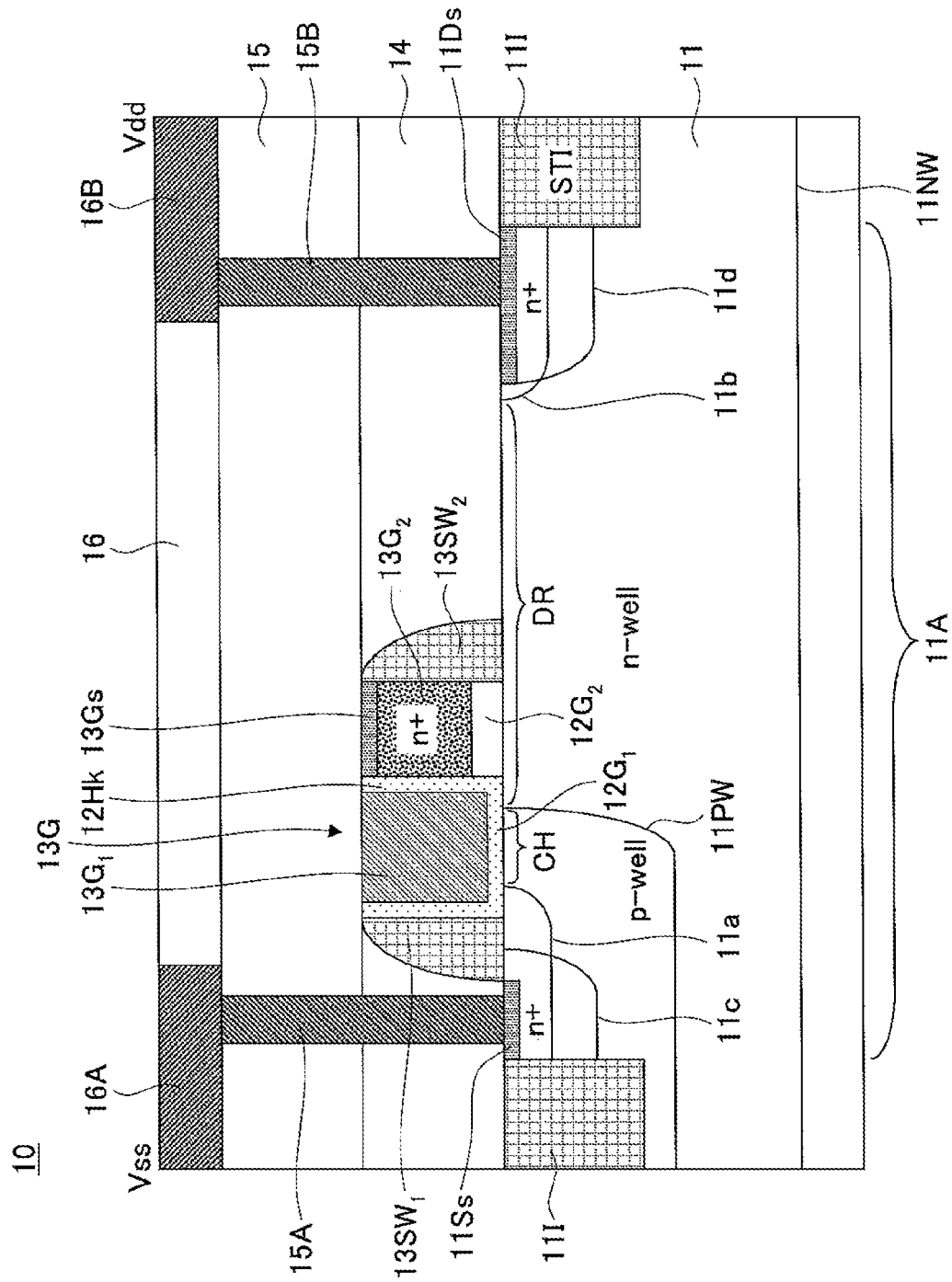
FIG. 1B is a cross-sectional diagram taken along a line A-A' of FIG. 1A.

FIG. 1A is a plan view diagram representing the construction of a high-voltage MOS transistor 10 according to a first embodiment while FIG. 1B is a cross-sectional diagram taken along a line A-A' of FIG. 1A.

Referring to FIGS. 1A and 1B, the high-voltage MOS transistor 10 is constructed on a p-type silicon substrate 11 having a flat principal surface of a (100) surface in which a device region 11A is defined by a device isolation region 11I, wherein there is formed an n-type well 11NW in the silicon substrate 11 so as to include the device region 11A.

Further, there is formed a p-type well 11PW in the device region 11A of the silicon substrate 11 such that the p-type well 11PW is formed in a part of the n-type well 11NW.

On the silicon substrate 11, there is formed a first gate electrode $13G_1$ of so-called "metal gate" formed of a metal film or a conductive metal nitride film such as a Ti film or a TiN film, wherein the first gate electrode $13G_1$ is formed over the p-type well 11PW via a first gate insulation film $12G_1$ of a so-called high-K dielectric film 12Hk having a specific dielectric constant larger than that of a silicon oxide film. For example, the high-K dielectric film 12Hk may be formed of an insulating metal oxide film such as a $HfO_2$ film or a $ZrO_2$ film. Alternatively, the high-K dielectric film may be formed of a metal silicate film such as a $HfSiO_4$ film or a $ZrSiO_4$ film.

Further, on the n-type well 11NW, there is formed a second gate electrode $13G_2$ of polysilicon doped to the $n^+$-type adjacent to the first gate electrode $13G_1$ via a second gate insulation film $12G_2$ typically of a thermal oxide film.

It should be noted that the high-K dielectric film 12Hk constituting the first gate insulation film $12G_1$ covers not only the bottom surface of the first gate insulation film $13G_1$ but also both sidewalls thereof, and as a result, the first gate electrode $13G_1$ and the second gate electrode $13G_2$ constitute a gate electrode structure via the high-K dielectric film 12Hk that extends from the gate insulation film $12G_1$.

Further, in the silicon substrate 11, there is formed a source extension region 11a of n-type at a first edge of the device region 11A adjacent to the first gate electrode $13G_1$ so as to be included in the p-type well 11PW, and there is further formed a drain extension region 11b of n-type at the other edge opposite to the foregoing first edge of the device region 11A so as to be included in the n-type well 11NW of the second gate electrode $13G_2$ with a separation from the gate electrode $13G_2$.

Further, the gate electrode structure 13G has a sidewall insulation film $13SW_1$ on the sidewall surface at the side where the source extension region 11a is formed and further a sidewall insulation film $13SW_2$ on the sidewall surface at the side opposite to the sidewall insulation film $13SW_1$. Further, in the p-type well 11PW, there is formed a source region 11c of $n^+$-type at the outer side of the sidewall insulation film $13SW_1$ as viewed from the gate electrode structure 13G in a partially overlapping manner but with an increased depth.

Further, in the device region 11A, there is formed a drain region 11d of $n^+$-type with partial overlapping with the drain extension region 11b but with an increased depth.

The gate structure 13G is covered with an interlayer insulation film 14 of a silicon oxide film formed over the silicon substrate 11, wherein the interlayer insulation film 14 has a thickness identical to the height of the gate electrode structure 13G, and because of this, the first gate electrode $13G_1$ and the second gate electrode $13G_2$ have respective top surfaces exposed at the top surface of the interlayer insulation film 14. Further, on the top surface of the second gate electrode $13G_2$, there is formed a silicide layer 13Gs, and similar silicide layers 11Ss and 11Ds are formed on the respective top surfaces of the source region 11c and the drain region 11d with a thickness of 20 nm, for example.

The exposed top surfaces of the first gate electrode $13G_1$ and the second gate electrode $13G_2$ are covered with an interlayer insulation film formed over the interlayer insulation film 14, wherein the interlayer insulation film 15 is formed with a via-plug 15A extending through the underlying interlayer insulation film 14 wherein the via-plug 15A makes a contact with the silicide layer 11Ss of the source region 11c. Further, a via-plug 15B is formed in the interlayer insulation film 14 to extend through the underlying interlayer insulation film 14 and makes a contact with the silicide layer 11Ds of the drain region 11d.

The via-plugs 15A and 15B make a contact respectively with interconnection patterns 16A and 16B embedded in an interlayer insulation film 16 formed over the interlayer insulation film 15, and a supply voltage Vss is supplied to the source region 11c from the interconnection pattern 16A via the via-plug 15A and the silicide layer 11Ss, while a supply voltage Vdd is supplied to the drain region 11d from the interconnection pattern 16B via the via-plug 15N and the silicide layer 11Ds.

Further, as represented in the plan view diagram of FIG. 1A, there is formed a via-plug 15G in the interlayer insulation film 15 in contact with the first gate electrode $13G_1$, wherein the via-plug 15G makes a contact with an interconnection pattern 16G embedded in the interlayer insulation film 16. With this, a gate voltage Vg is supplied from the interconnection pattern 16G to the first gate electrode $13G_1$.

Figure 2:
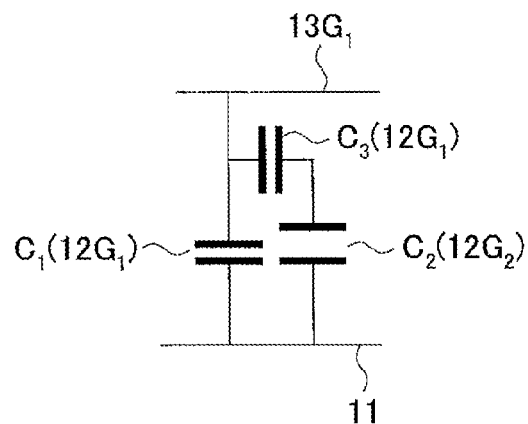
FIG. 2 is an equivalent circuit diagram of the gate insulation film of the high-voltage MOS transistor of FIGS. 1A and 1B.

FIG. 2 represents the equivalent circuit diagram of the first and second gate insulation films $12G_1$ and $12G_2$ of the gate electrode structure 13G of the high-voltage MOS transistor 10 of FIGS. 1A and 1B.

Referring to FIG. 2, there is formed a capacitor $C_1$ between the first gate electrode $13G_1$ and the silicon substrate 11 by the first gate insulation film $12G_1$ right underneath the gate electrode $13G_1$, and it will be noted further that there is formed a capacitor $C_3$ and a capacitor $C_2$ in series between the gate electrode $13G_1$ and the silicon substrate, wherein the capacitor $C_3$ is formed by the high-K dielectric film 12Hk intervening between the first gate electrode $13G_1$ and the second gate electrode $13G_2$, while the capacitor $C_2$ is formed by the second gate insulation film $12G_2$. This means that, in the high-voltage MOS transistor 10 of the present embodiment, the effective film thickness of the second gate insulation film $12G_2$ is increased right under the second gate electrode $13G_2$ as compared with its physical thickness.

In the operational state of the high-voltage MOS transistor 10 of such a construction, there is formed a channel region CH in the p-type well 11PW right underneath the first gate electrode $13G_1$, and the first gate electrode $13G_1$ controls formation of the inversion layer in the channel region CH in response to application of a gate voltage similarly to an ordinary MOS transistor. On the other hand, it should be noted that there is formed a long drift region DR right underneath the second gate electrode $13G_2$ so as to extend from the channel region CH to the drain extension region 11b, and the carriers, more specifically electrons, passed through the channel region CH migrate through the drift region DR toward the drain region 11d by drift when there is applied a positive voltage to the drain region 11d such that the positive voltage is higher than the voltage applied to the source region 11c.

Thereby, the drain region 11d is formed away from the gate electrode structure 13G, particularly from the first gate electrode $13G_1$, with a distance of 1 μm, for example. Thus, even in the operation under high supply voltage, it becomes possible to avoid excessive increase of electric field strength in the drift region DR.

While there is a possibility of occurrence of large electric field also in the high-voltage MOS transistor 10 of FIGS. 1A and 1B at the drain edge of the channel region CH when the transistor is operated under the supply voltage of 20V-50V or higher, the present embodiment, which forms the second gate electrode $13G_2$ having the thick second gate insulation film $12G_2$ at the drain side of the gate electrode $13G_1$, can successfully diminish the effect of such electric field concentration in the gate insulation film $12G_2$.

Further, with the present embodiment, the second gate electrode $13G_2$ makes a capacitive coupling with the first gate electrode $13G_1$ via the high-K dielectric film 12Hk, and because of this, the effective film thickness of the gate insulation film at the drain edge of the gate electrode $13G_1$ increases beyond the physical film thickness of the gate insulation film $12G_2$. As a result, it becomes possible to suppress the concentration of electric field in the gate insulation film $13G_2$ and associated breakdown of the gate insulation film $13G_2$ effectively.

Thus, the high-voltage MOS transistor 10 of the present embodiment is characterized by high breakdown voltage and can operate normally under the high supply voltage of 20-50V or more, for example.

Further, with the present embodiment, not only the first gate electrode $13G_1$ but also the second gate electrode $13G_2$ are formed on the flat surface of the silicon substrate 11, and because of this, the electrons travel from the source region 11c to the drain region 11d along the flat surface of the silicon substrate 11 without taking a circumventing flow path. Further, in view of the fact that the gate insulation film $12G_1$ right underneath the first gate electrode $13G_1$ is formed of the high-K dielectric film 12Hk of large physical thickness yet small oxide-equivalent thickness, it becomes possible with the present embodiment to reduce the ON-resistance effectively and it becomes possible to obtain a large output current.

Further, with the present embodiment, because the electrons travel from the source region 11c to the drain region 11d along the flat surface of the silicon substrate 11 without taking a circumventing flow path as noted above, there occurs no concentration of electric field at the bend of the flow path.

Hereinafter, the fabrication process of the high-voltage MOS transistor 10 of the present embodiment will be explained with reference to the process flow diagram of FIGS. 3A-3K.

Figure 3A:
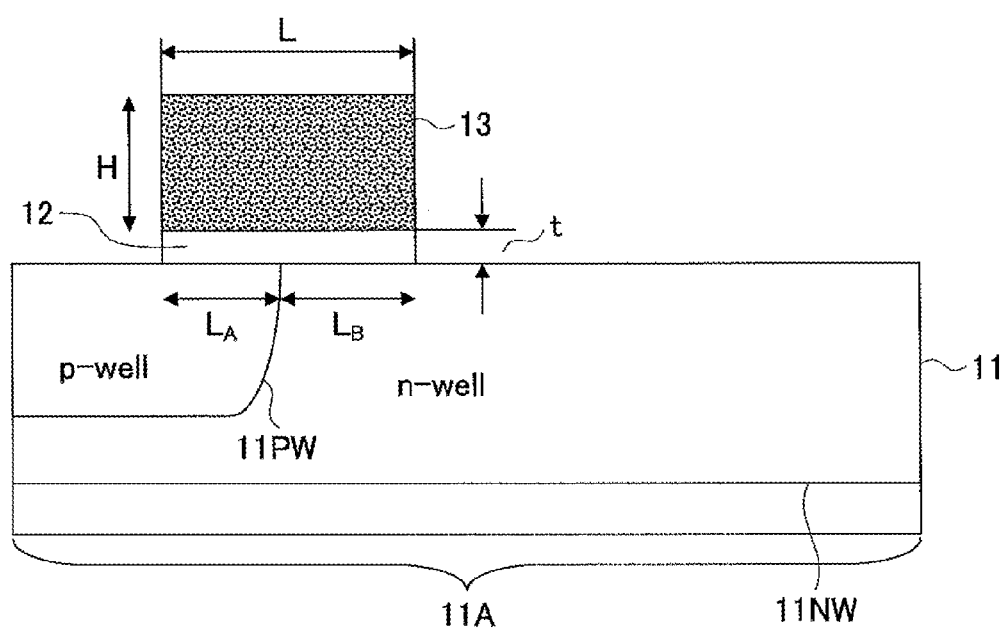

Referring to FIG. 3A, the p-type silicon substrate 11 is formed with the p-type well 11PW by an ion implantation process such that the p-type well 11PW is included in the device region 11A, by first introducing boron (B) under the acceleration voltage of 400 keV and the dose of $1 \times 10^{13}$ cm$^{-2}$, then by introducing boron under the acceleration voltage of 150 keV and the does of $5 \times 10^{12}$ cm$^{-2}$, and then by introducing boron under the acceleration voltage of 15 keV and the dose of $1 \times 10^{13}$ cm$^{-2}$ while using an ion implantation mask.

Next, the n-type well 11NW is formed by an ion implantation process by first introducing phosphorus (P) under the acceleration voltage of 500 keV and the dose of $2 \times 10^{12}$ cm$^{-2}$ over the area that includes the device region 11A, then by introducing phosphorus under the acceleration voltage of 15 keV and the dose of $1 \times 10^{12}$ cm$^{-2}$ so as to be included in the device region 11A while using an inversion mask, which is an inversion of the ion implantation mask used for the ion implantation of boron.

Further, in the step of FIG. 3A, there is formed a silicon oxide film 12 used for the second gate insulation film $12G_2$ by a thermal oxidation process with a thickness t sufficient for securing the desired breakdown voltage, such as 30 nm for example, and there is further formed a polysilicon film forming the second gate electrode $13G_2$ with a thickness H of 100 nm, for example.

The polysilicon film thus formed is patterned to have a width L of 1 μm, for example, such that the polysilicon film covers the p-type well over a distance $L_A$ corresponding to the desired gate length such as 0.6 μm and such that the polysilicon film covers the n-type well 11NW over a distance $L_B$ necessary for relaxation of the electric field such as 0.4 μm. As a result, there is formed a polysilicon pattern 13 over the silicon substrate 11 such that the polysilicon pattern covers the p-type well 11PW and the n-type well 11NW continuously.

In the step of FIG. 3A, it is also possible to form the n-type well 11NW before the formation of the p-type well 11PW.

Figure 3B:
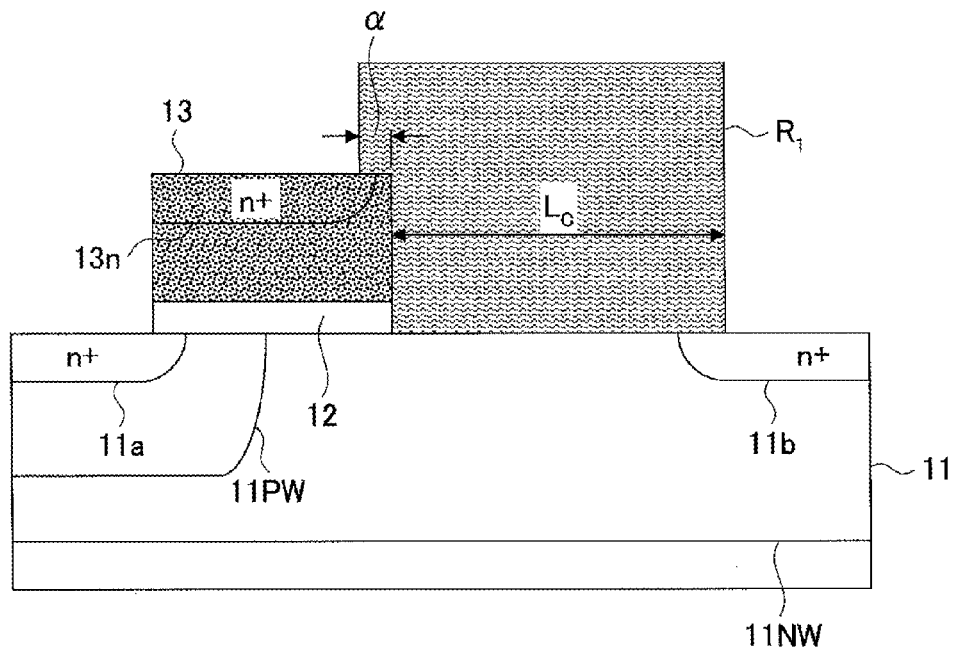

Next, in the step of FIG. 3B, there is formed a resist pattern $R_1$ so as to cover a part of the silicon substrate 11 at the drain region side of the polysilicon pattern 13 over a distance $L_C$ of 1 μm, for example, and ion implantation of phosphorus is conducted under the acceleration voltage of 5 keV and the dose of $1 \times 10^{14}$ cm$^{-2}$ while using the resist pattern $R_1$ as a mask. With this, the source extension region 11a is formed at the source region side of the polysilicon pattern 13, and at the same time, the drain extension region 11b is formed at the drain region side of the polysilicon pattern 13 with an offset of the distance $L_C$ from the polysilicon pattern 13. Further, in the step of FIG. 3B, the polysilicon pattern 13 is injected with phosphorous with the ion implantation process, and there is formed an ion implantation region 13n of n$^+$-type. In the example of FIG. 3B, the source extension region 11a invades slightly into the region right underneath the polysilicon pattern 13 as a result of diffusion of the phosphorous ions. Likewise, it can be seen that the drain extension region 11b invades slightly into the region right underneath the resist pattern $R_1$.

In the example of FIG. 3B, it should be noted that the resist pattern $R_1$ is formed in view of possible positional error with an overlap a of the distance of 0.1 μm, for example, at the drain side edge of the polysilicon pattern 13. With this, the chance that ion implantation of phosphorous is made at the drain region side of the polysilicon pattern 13 is eliminated.

Next, in the step of FIG. 3C, the sidewall insulation films 13SW$_1$ and 13SW$_2$ explained with reference to FIG. 1B previously are formed on the respective sidewall surfaces of the polysilicon pattern 13 at the source side and the drain side, and the structure thus obtained is covered with a CVD oxide film of the thickness of 100 nm, for example. The CVD oxide film is then patterned while using the same exposure mask used at the time of formation of the resist pattern $R_1$, and with this, there is formed a silicide block pattern 13SB of silicon oxide film in correspondence to the resist pattern $R_1$ over the length $L_C$ as measured from the drain edge of the polysilicon pattern 13.

Figure 3C:
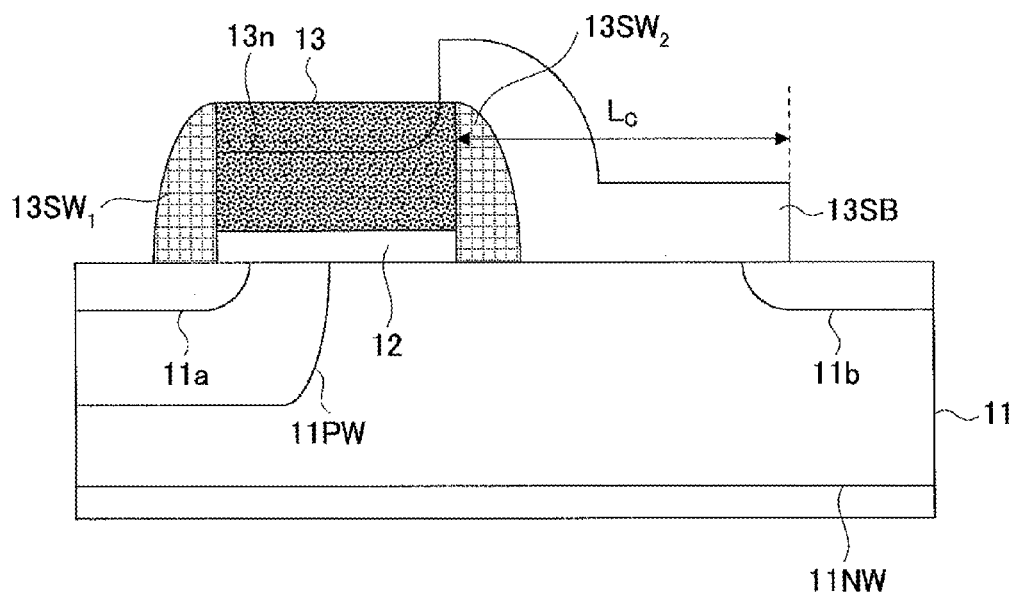
Figure 3D:
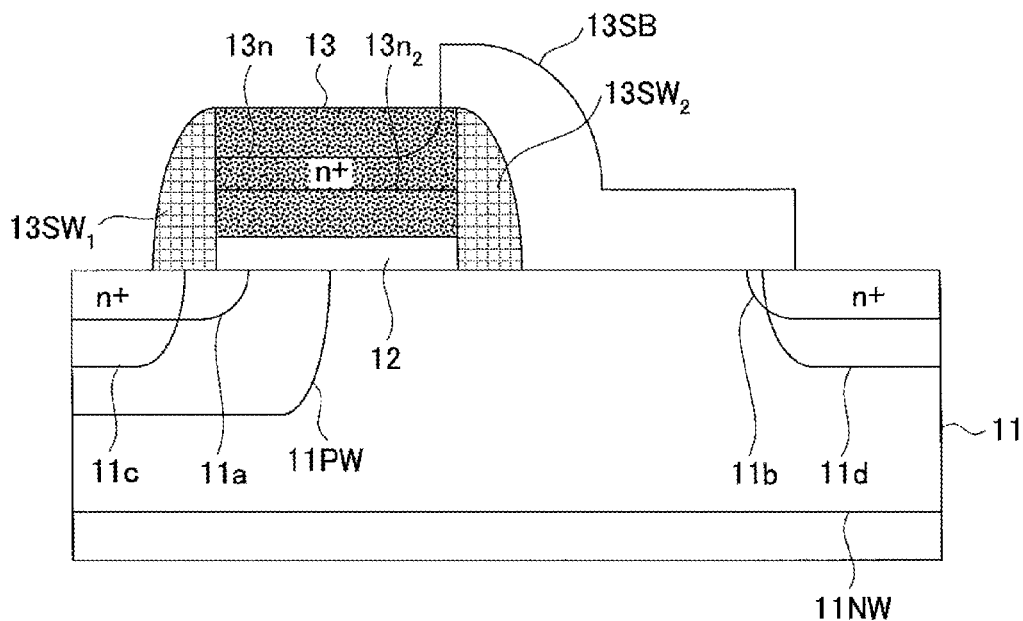

Next, in the step of FIG. 3D, there is conducted an ion implantation process of phosphorus into the silicon substrate 11 under the acceleration voltage of 15 keV and the dose of $2 \times 10^{15}$ cm$^{-2}$ while using the polysilicon pattern 13, the sidewall insulation film $13SW_1$ and the silicide block pattern 13SB as a mask, and with this, the source region 11c is formed at the source region side of the sidewall insulation film $13SW_1$ and the drain region 11d of n$^+$-type is formed at the drain region side of the silicide block pattern 13SB. Further, as a result of the ion implantation process of FIG. 3D, there is formed an ion implantation region $13n_2$ of n$^+$-type in the polysilicon pattern 13 deeper than the ion implantation region 13n. Here, it should be noted that the drain region 11d is formed with offset with the distance $L_C$ from the drain-side edge of the polysilicon pattern 13.

Figure 3E:
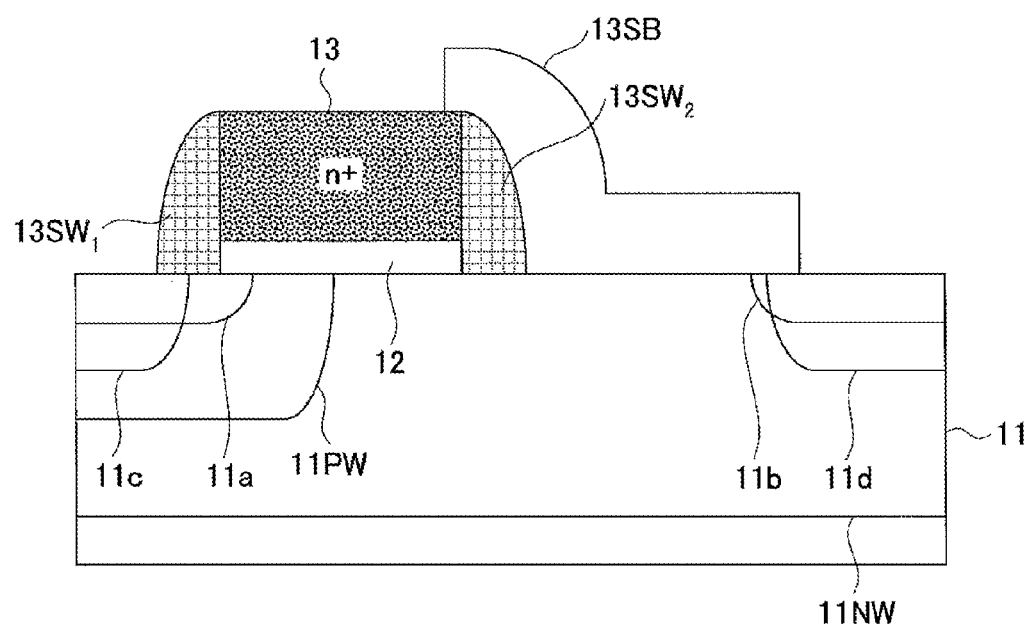
Figure 13A:
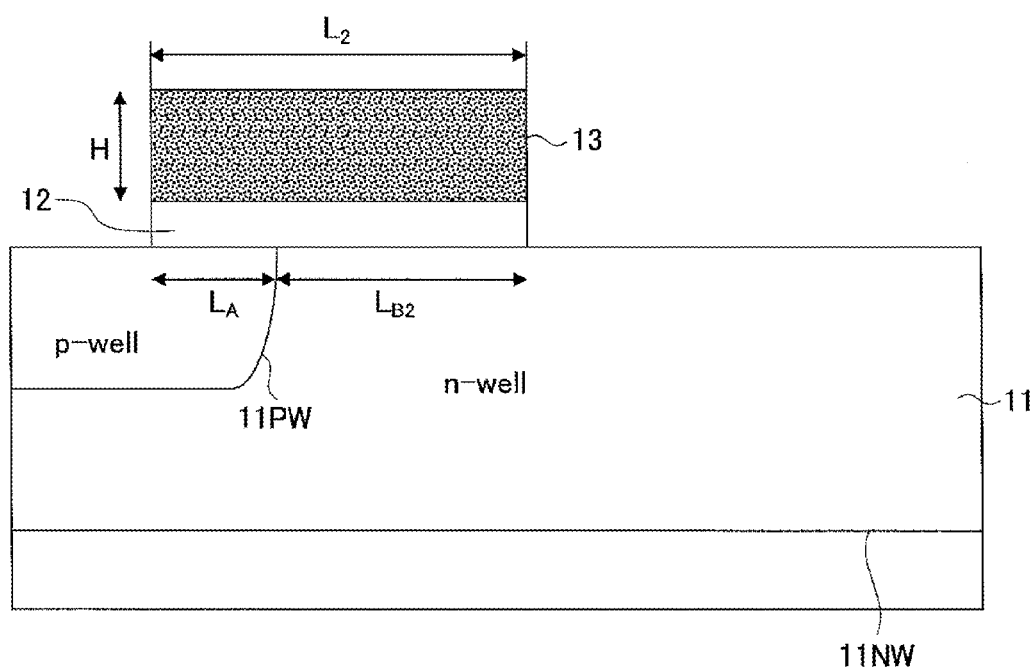
FIGS. 13A-13I are diagrams depicting the fabrication process of the high-voltage MOS semiconductor of the sixth embodiment.
Figure 13B:
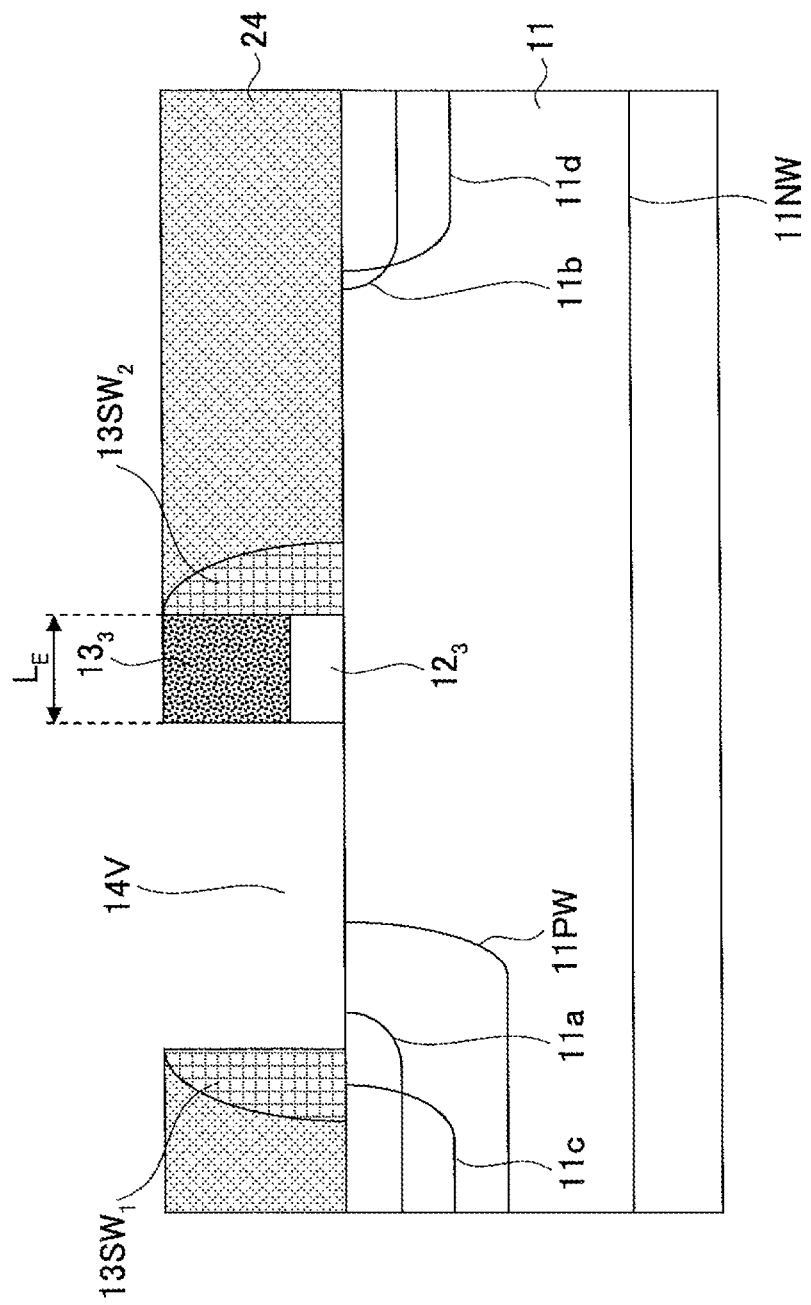
Figure 13C:
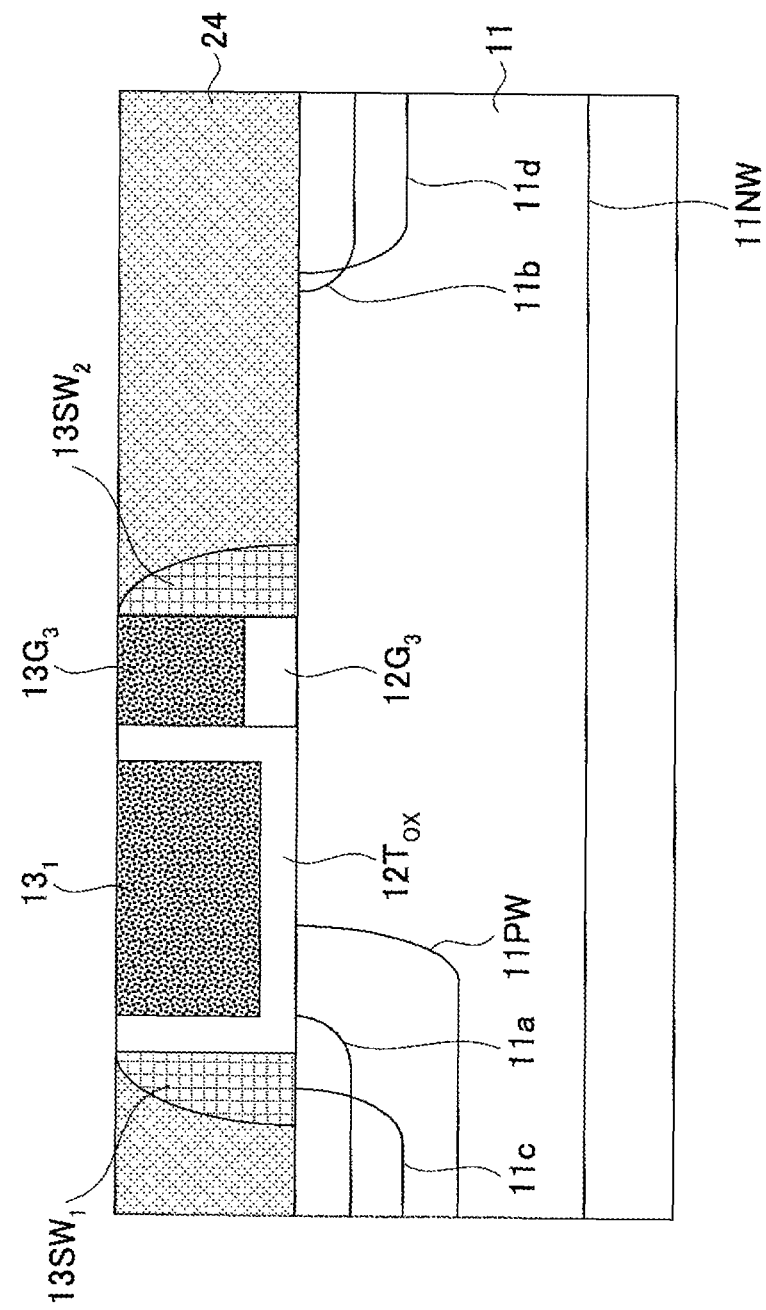
Figure 13D:
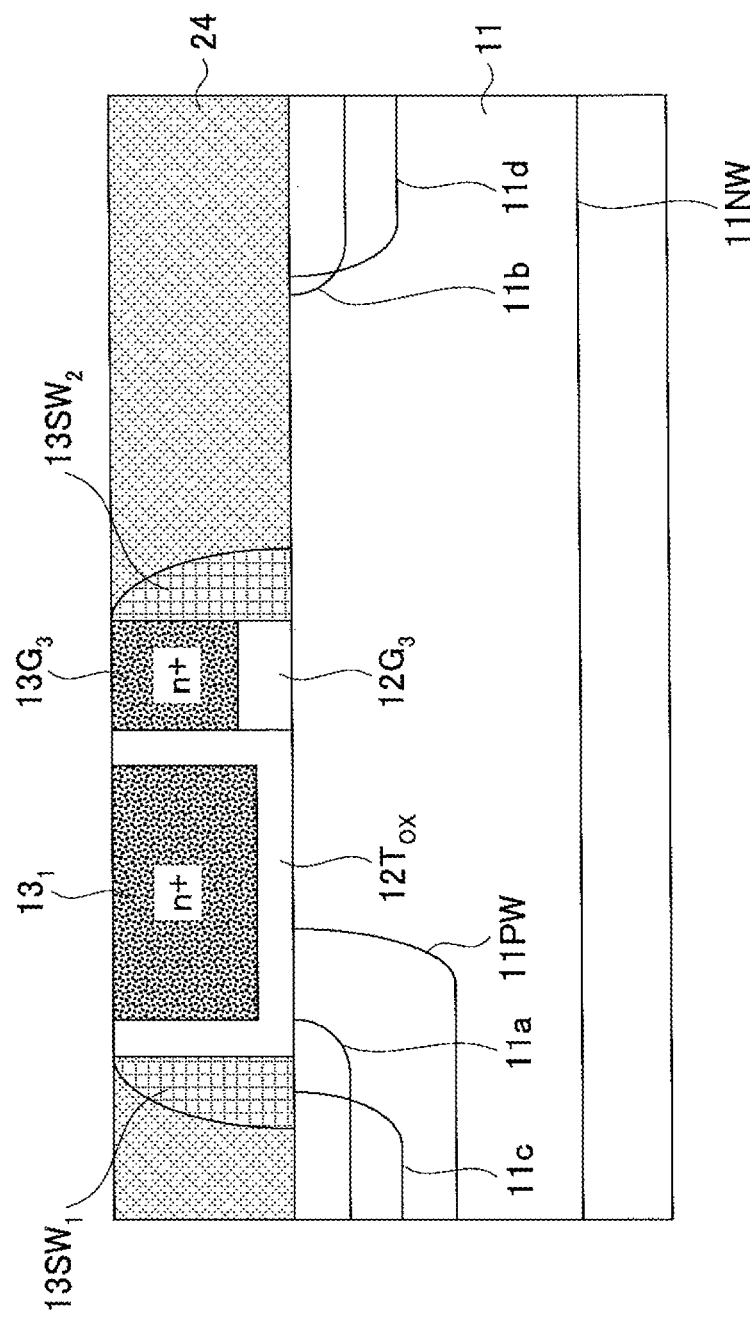

Further, in the step of FIG. 3E, the structure of FIG. 13D is subjected to a thermal annealing process at the temperature of 1000° C. over the duration of 10 seconds for activation of phosphorus thus introduced into the polysilicon pattern 13. Thereby, the phosphorus atoms cause homogenizing diffusion in the polysilicon pattern 13 and the polysilicon pattern 13 is doped uniformly to n$^+$-type.

Figure 3F:
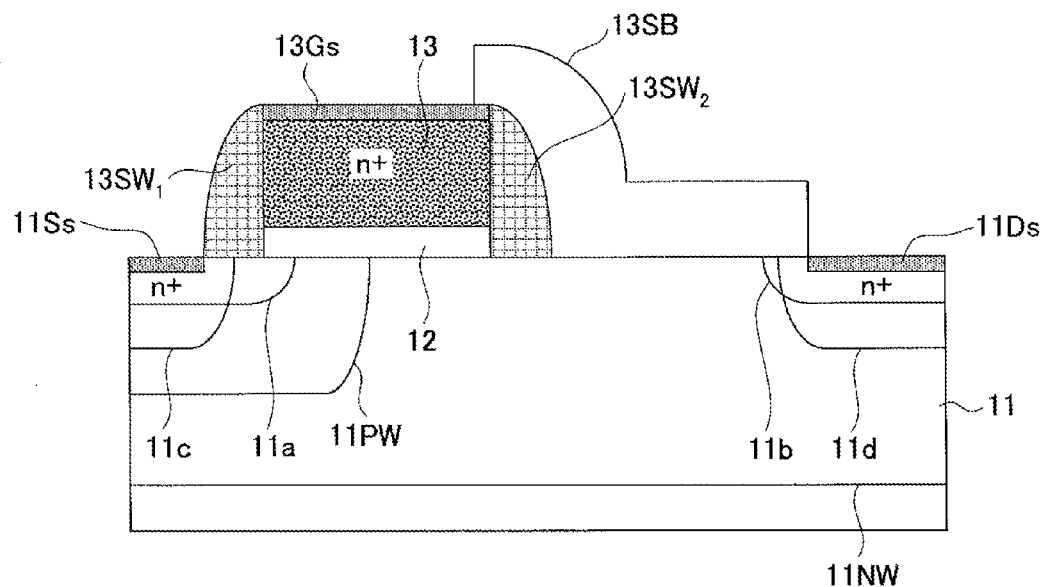

Next, in the step of FIG. 3F, a silicide layer is formed in the exposed part of the silicon substrate 11 and also in the exposed part of the polysilicon pattern 13 by a salicide process while leaving the silicide block pattern 13SB as it is. With this, the source region 11c is formed with the silicide layer 11Ss, the drain region 11d is formed with the silicide layer 11Ds and the polysilicon pattern 13 is formed with the silicide layer 13Gs.

Figure 3G:
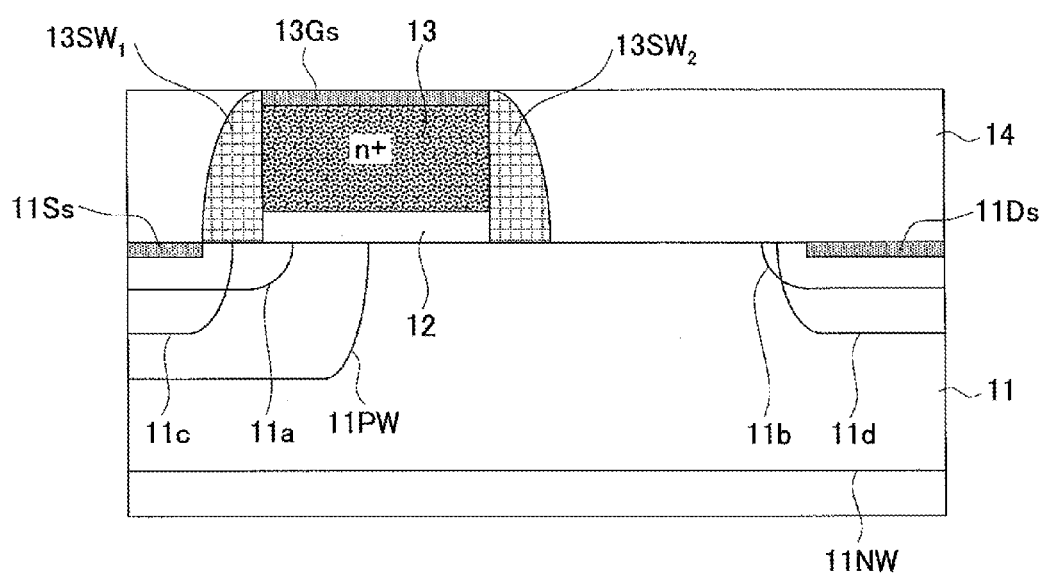

Next, in the step of FIG. 3G, the structure of FIG. 3F is covered with the interlayer insulation film 14 of a silicon oxide film of the thickness of 150 nm, for example, followed by a planarization process conducted by chemical mechanical polishing (CMP), and with this, the silicide layer 13Gs on the polysilicon pattern 13 is exposed at the surface of the interlayer insulation film 14.

Figure 3H:
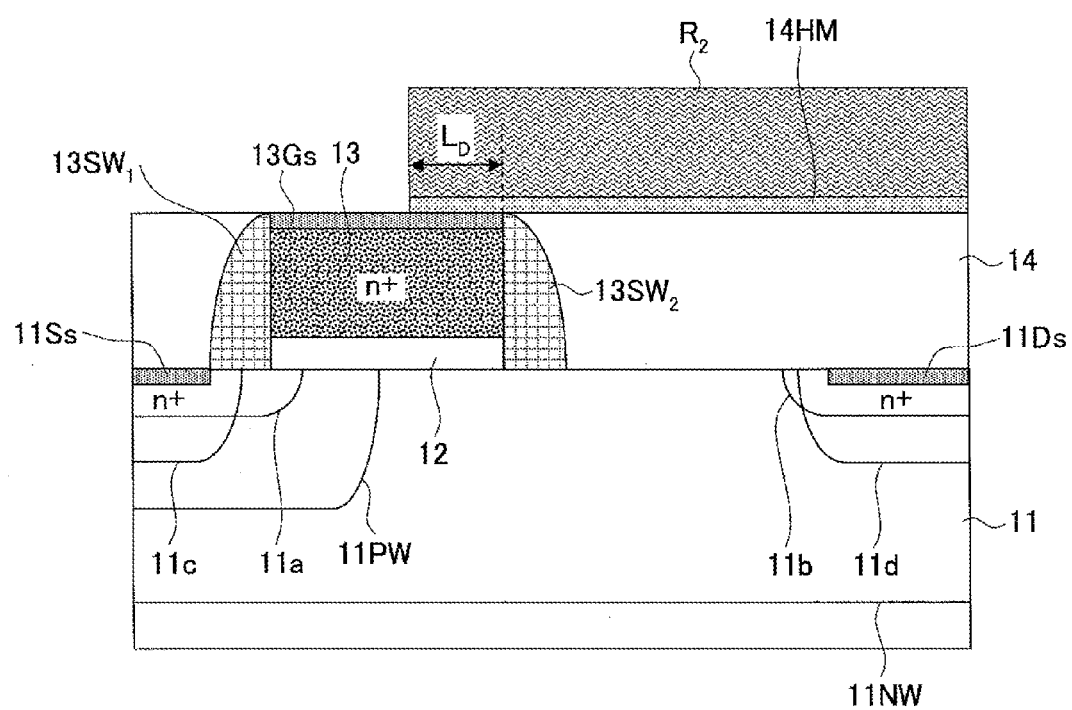

Next, in the step of FIG. 3H, a hard mask layer 14HM is formed over the interlayer insulation film 14 so as to cover the exposed silicide layer 13Gs with a thickness of 20 nm, for example. Further, while using a resist pattern $R_2$ as a mask, the hard mask layer 14HM is subjected to a patterning process, and with this, a part of the silicide layer 13Gs is exposed while the hard mask layer 14HM still covering the region $L_D$ at the drain region side of the polysilicon pattern 13 over the length of 0.2 μm, for example. Here, the region $L_D$ corresponds to the part of the gate insulation film $12G_2$ where the high electric field is induced at the time of operation of the high-voltage transistor 10.

Figure 3I:
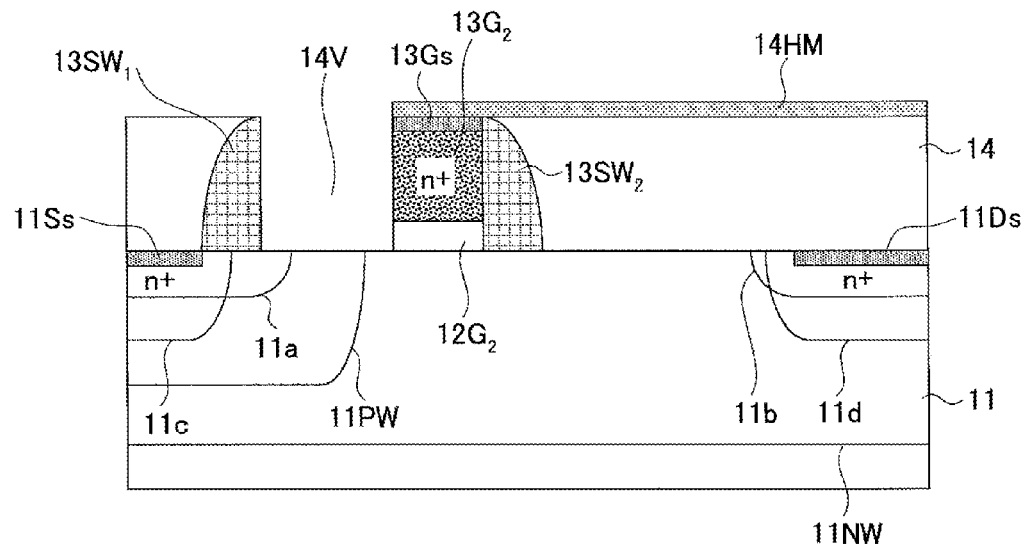

Further, in the step of FIG. 3I, the exposed part of the silicide layer 13Gs and the polysilicon pattern 13 underneath are removed by anisotropic dry etching process acting generally perpendicular to the surface of the silicon substrate 11 until the thermal oxide film 12 is exposed. With this, there is formed a void 14V in the polysilicon pattern 13. As a result of the anisotropic etching process, the polysilicon pattern 13 is patterned to form the second gate electrode $13G_2$ explained previously with reference to FIGS. 2A and 2B.

Further, in the step of FIG. 3I, the exposed thermal oxide film is removed by an isotropic etching process such as a wet etching that uses HF, for example, such that the silicon substrate 11 is exposed at the bottom of the void 14V. As a result of this isotropic etching process of FIG. 3I, the thermal oxide film 12 is patterned to form the second gate insulation film $12G_2$ explained with reference to FIG. 1B.

Figure 3J:
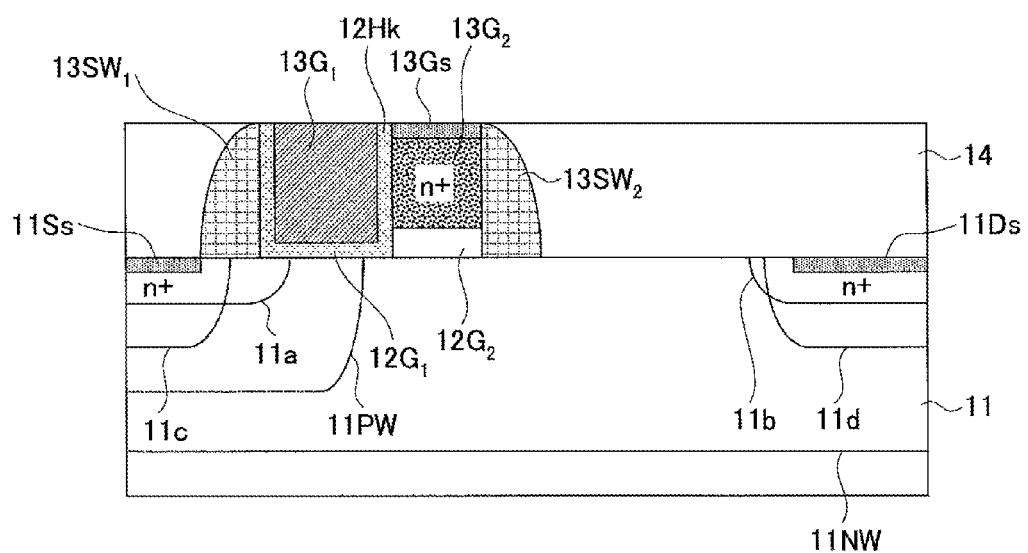

Next, in the step of FIG. 3J, there is deposited a high-K dielectric film such as a HfO$_2$ film on the surface of the void 14V of FIG. 3I by a CVD process or ALD process, and with this, the exposed surface of the silicon substrate 11 and the inner surfaces of the void 14V are covered with the high-K dielectric film 12Hk of the thickness of 5 nm, for example. Thereby, it should be noted that the part of the high-K dielectric film 12Hk covering the exposed surface of the silicon substrate 11 constitutes the first gate insulation film $12G_1$ explained with reference to FIG. 1B.

Further, the void 14V having the bottom surface and the sidewall surfaces thus covered with the high-K dielectric film 12HK is filled with a metal or conductive nitride of the metal such as a TiN film or Ti film by a sputtering process. After removing excess TiN film deposited on the interlayer insulation film 14 by a chemical mechanical polishing process, the first gate electrode $13G_1$ is obtained on the first gate insulation film $12G_1$ with separation from the second gate electrode $13G_2$ by the high-K dielectric film 12Hk.

Further, in the step of FIG. 3K, the interlayer insulation film 15 is formed on the interlayer insulation film 14, and the via-plugs 15A and 15B are formed in the interlayer insulation film 15 respectively in contact with the source silicide layer 11Ss and the drain silicide layer 11Ds Further, by forming the interlayer insulation film 16 and the interconnection patterns 16A, 16B and 16G over the structure of FIG. 3K, the high-voltage MOS transistor 10 explained with FIGS. 1A and 1B is obtained.

With the present embodiment, the same mask used at the time of the ion implantation process of the source region 11c and the drain region 11d is used also at the time of formation of the silicide layers 11Ss, 11Ds and 13Gs when forming the first and second gate electrodes $13G_1$ and $13G_2$ on the first and second gate insulation films $12G_1$ and $12G_2$. As a result, the fabrication process of the MOS transistor is simplified.

Further, with the present embodiment, the gate electrode $13G_1$, formed of a conductive metal nitride film or a metal film, is formed after formation of the source region 11c or drain region 11d and further after formation of the silicide layers 11Ss, 11Ds and 13Gs. Thus, there is no chance that the gate electrode $13G_1$ experiences thermal annealing process, and the reaction between the gate electrode $13G_1$ and the gate insulation film $12G_1$ of high-K dielectric film 12Hk is suppressed. Thereby, it becomes possible to suppress the deviation of operational characteristics of the high-voltage MOS transistor 10 from the designed values caused for example by Fermi level pinning, and the like.

[Second Embodiment]

Figure 4A:
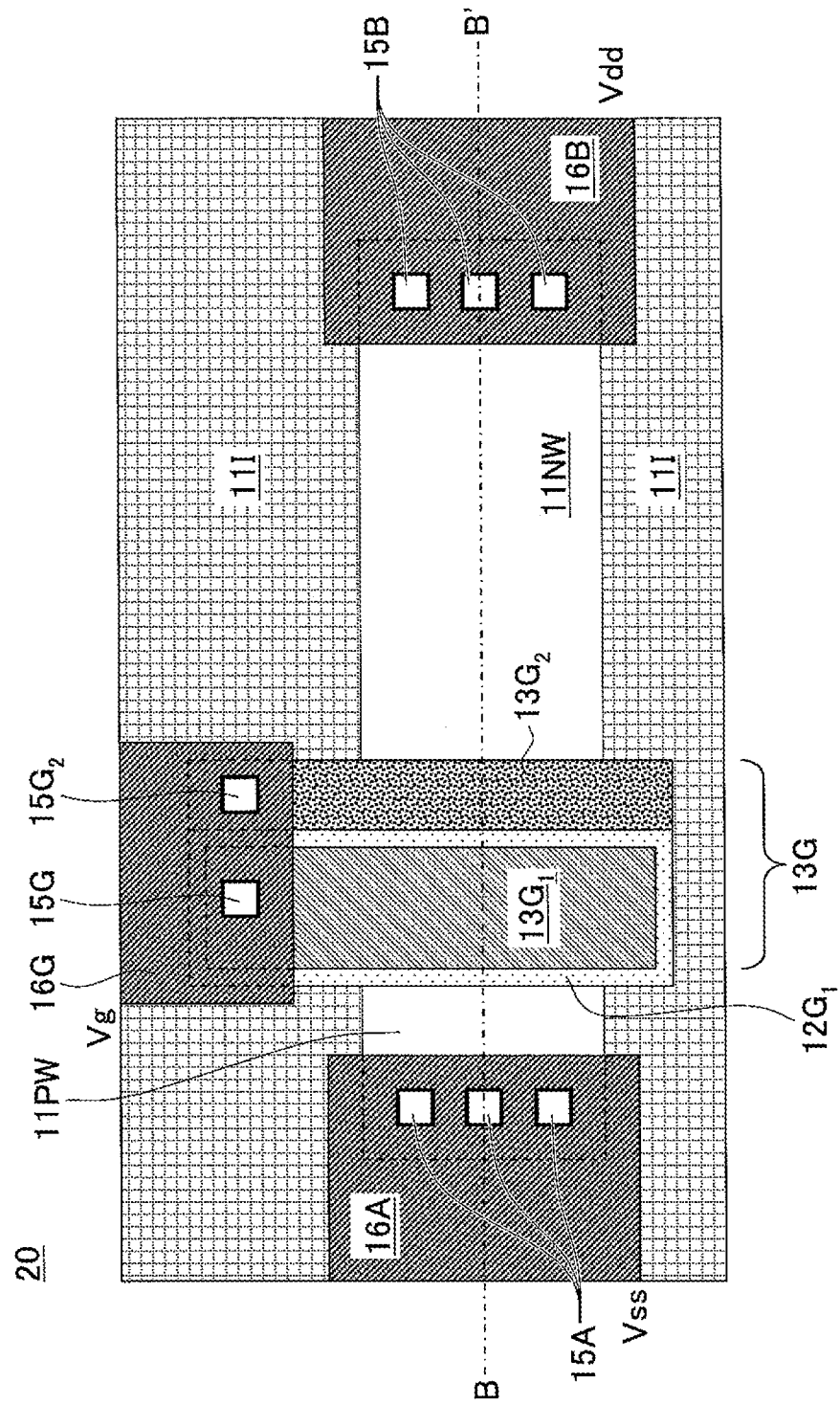
FIG. 4A is a plan view diagram representing a high-voltage MOS transistor according to a second embodiment.
Figure 4B:
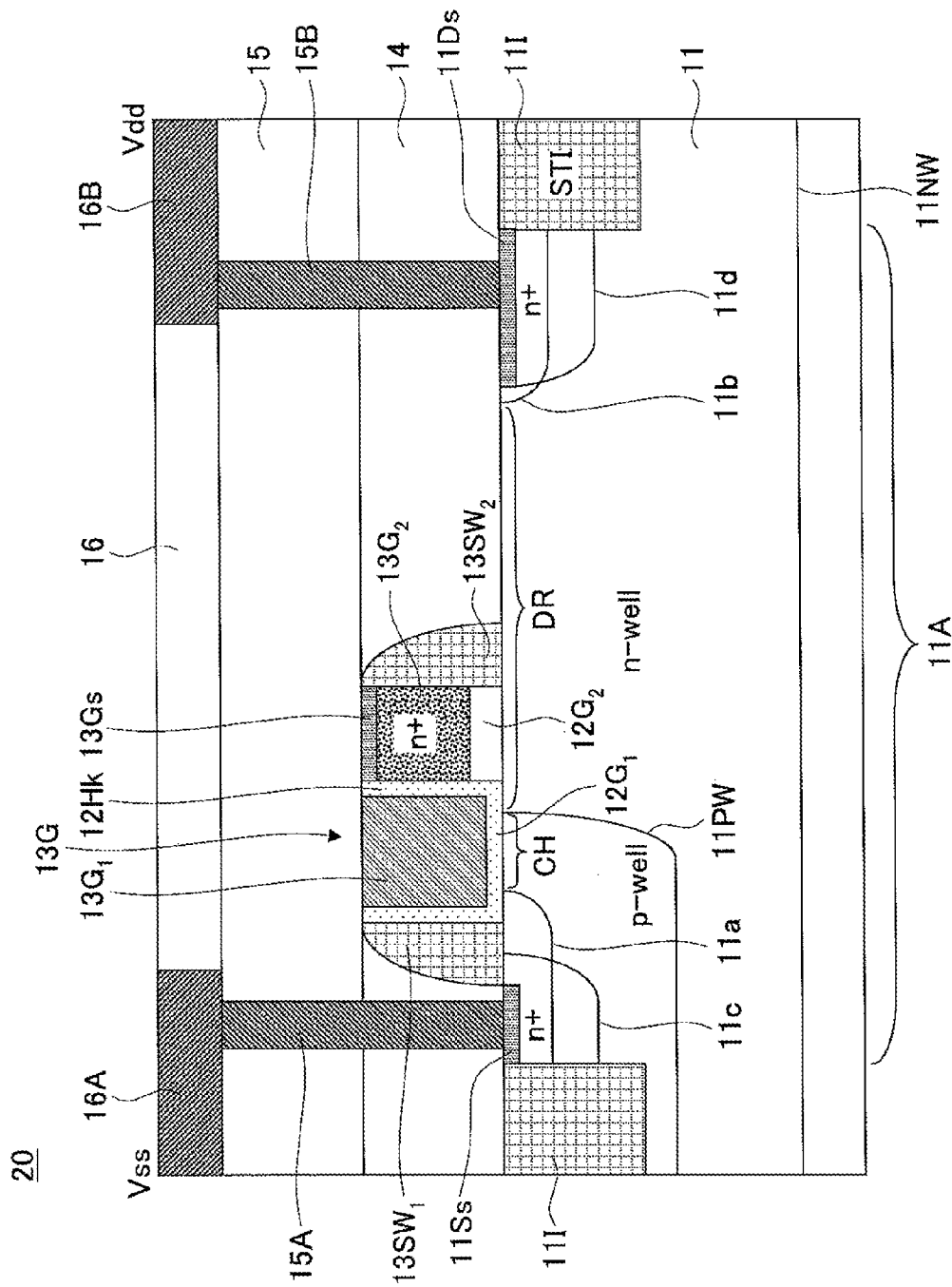
FIG. 4B is a cross-sectional diagram taken along a line B-B' of FIG. 4A.

FIG. 4A is a plan view diagram representing the construction of a high-voltage MOS transistor 20 according to a second embodiment while FIG. 4B is a cross-sectional diagram taken along a line B-B' of FIG. 4A. In the drawings, those parts explained before are designated by the same reference numerals and the description thereof will be omitted.

Referring to FIGS. 4A and 4B, the high-voltage MOS transistor 20 has a structure similar to that of the high-voltage MOS transistor 10 of the previous embodiment, except that the gate electrode $13G_2$ is connected to the gate interconnection pattern 16G by a via-plug $15G_2$.

Figure 5:
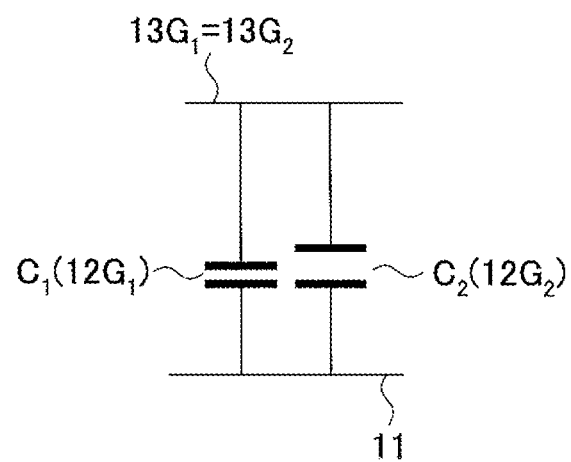
FIG. 5 is an equivalent circuit diagram of the gate insulation film of the high-voltage MOS transistor of FIGS. 4A and 4B.

FIG. 5 represents the equivalent circuit diagram of the first and second gate insulation films $12G_1$ and $12G_2$ of the gate electrode structure 13G of the high-voltage MOS transistor 20 of FIGS. 4A and 4B.

Referring to FIG. 5, there is formed a capacitor $C_1$ by the gate insulation film $12G_1$ right underneath the gate electrode $13G_1$ between the first gate electrode $13G_1$ and the silicon substrate 11, wherein it should be noted that, with the present embodiment, the capacitor $C_2$ of the second gate insulation film $12G_2$ is connected parallel to the capacitor $C_1$ in view of the fact that the first gate electrode 13G, and the second gate electrode $13G_2$ are connected commonly to the gate interconnection pattern 16G.

In the operational state of the high-voltage MOS transistor 20 of such a construction, there is also formed a channel region CH in the p-type well 11PW right underneath the first gate electrode $13G_1$, and the first gate electrode $13G_1$ controls formation of the inversion layer in the channel region CH in response to application of the gate electrode similarly to ordinary MOS transistor. On the other hand, it should be noted that there is formed a long drift region DR right underneath the second gate electrode $13G_2$ extending from the channel region CH to the drain region 11d, and the carriers, more specifically electrons, passed through the channel region CH migrate through the drift region DR toward the drain region 11d by drift when there is applied a positive voltage to the drain region 11d such that the positive voltage is higher than the voltage applied to the source region 11c.

Thereby, the drain region 11d is formed away from the gate electrode structure 13G, particularly from the first gate electrode $13G_1$, with a distance of 1 μm, for example. Thus, even in the operation under high supply voltage, it becomes possible to avoid excessive increase of electric field strength in the drift region DR.

While there is a possibility of occurrence of large electric field also in the high-voltage MOS transistor 10 of FIGS. 1A and 1B at the drain edge of the channel region CH when the transistor is operated under the supply voltage of 20V-50V or higher, the present embodiment, which forms the second gate electrode $13G_2$ on the second gate insulation film $12G_2$ of the increased thickness at the drain side of the gate electrode $13G_1$, can successfully diminish the effect of such electric field concentration in the gate insulation film $12G_2$.

With the high-voltage MOS transistor 10 of the previous embodiment, it should be noted that the second gate electrode $13G_2$ is in a floating state, and because of this, there is a possibility that, when the thickness of the second gate insulation film $12G_2$ is insufficient, the electrons accelerated upon passage of the channel region CH can reach the second gate electrode $13G_2$ by tunneling through the second gate insulation film $12G_2$. In such a case there has been a possibility that the operational characteristics of the high-voltage MOS transistor 10 may be changed.

In contrast, with the high-voltage MOS transistor 20 of the present embodiment, the second gate electrode $13G_2$ is connected to the interconnection pattern 16G, and there occurs no such accumulation of electrons.

Thus, the high-voltage MOS transistor 20 of the present embodiment is effective for the case when it is difficult to increase the film thickness of the second gate insulation film $12G_2$ sufficiently.

Further, with the present embodiment, too, the first gate electrode $13G_1$ and also the second gate electrode $13G_2$ are formed on the flat surface of the silicon substrate 11, and because of this, the electrons travel from the source region 11c to the drain region 11d along the flat surface of the silicon substrate 11 without taking a circumventing path. Further, in view of the fact that the gate insulation film $12G_1$ right underneath the first gate electrode $13G_1$ is formed of the high-K dielectric film 12Hk of large physical thickness yet small oxide-equivalent thickness, it becomes possible with the present embodiment to reduce the ON-resistance effectively and it becomes possible to obtain a large output current.

Further, with the present embodiment, too, because the electrons travel from the source region 11c to the drain region 11d along the flat surface of the silicon substrate 11 without taking a circumventing flow path as noted above, there occurs no concentration of electric field at the bend of the electron flow path.

[Third Embodiment]

Figure 6:
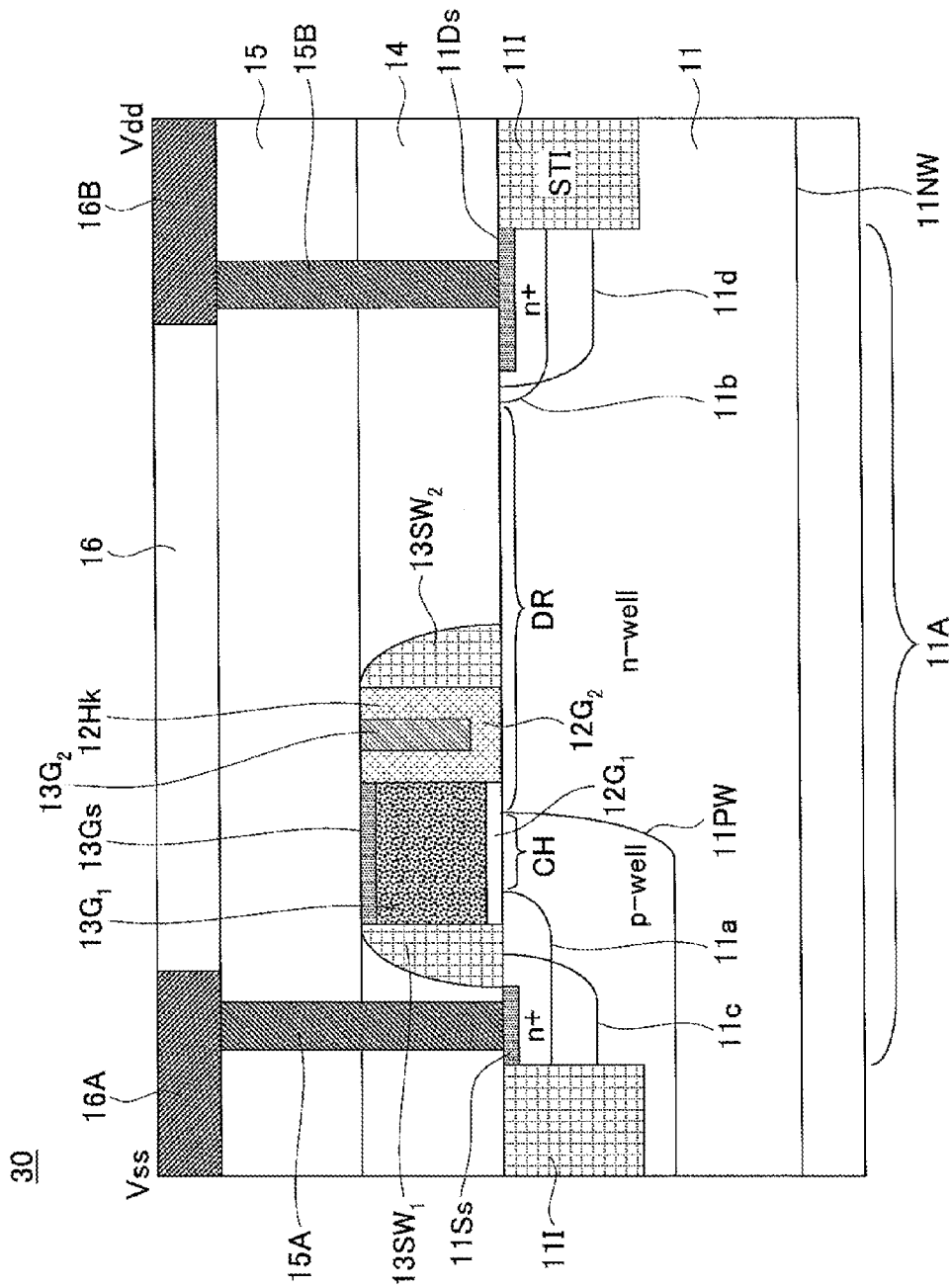
FIG. 6 is a cross-sectional view diagram representing a high-voltage MOS transistor according to a third embodiment.

FIG. 6 is a cross-sectional view diagram representing the construction of a high-voltage MOS transistor according to a third embodiment. The high-voltage MOS transistor 30 of the present embodiment is a modification of the high-voltage MOS transistor 10 of the previous embodiment and illustration of the plan view will be omitted. In the drawings, those parts explained before are designated by the same reference numerals and the description thereof will be omitted.

Referring to FIG. 6, the present embodiment forms the first gate electrode $13G_1$ by a polysilicon pattern of the thickness of 100 nm doped to the n+-type and carrying the silicide layer 13Gs on the top surface thereof and the second gate electrode $13G_2$ by a metal gate of a TiN film, or the like. In correspondence to this, the first gate insulation film $12G_1$ is formed of a thermal oxide film of the thickness of 3 nm, for example, while the second gate insulation film $12G_2$ is formed of a high-K dielectric film such as a $HfO_2$ film with a thickness of 30 nm, for example, for securing sufficient breakdown voltage.

According to such a construction, it becomes possible to form the first gate insulation film $12G_1$ similarly to the gate insulation film of general logic devices, and thus, it becomes possible to form the high-voltage MOS transistor 30 on a common silicon substrate together with other transistors constituting a high-speed logic device in the form of integrated circuit, for example. Further, because of this, it becomes also possible to reduce the ON-resistance of the transistor 30.

FIGS. 7A-7K are process flow diagrams depicting the fabrication process of the high-voltage MOS transistor 30 according to the present embodiment.

Referring to FIGS. 7A-7K, it will be noted that the process steps from FIG. 7A to FIG. 7G are identical to those explained previously except that the thickness t of the thermal oxide film 12 is set to 3 nm such that the film thickness of the thermal oxide film 12 is equal to the film thickness of the thermal oxide film constituting the gate insulation film of the logic devices formed on the same silicon substrate 11. Thus, the description thereof will be omitted. By forming the thermal oxide film 12 to have the thickness of 3 nm or less, it becomes possible to reduce the ON-resistance of the high-voltage MOS transistor 30 when it is completed.

Figure 7A:
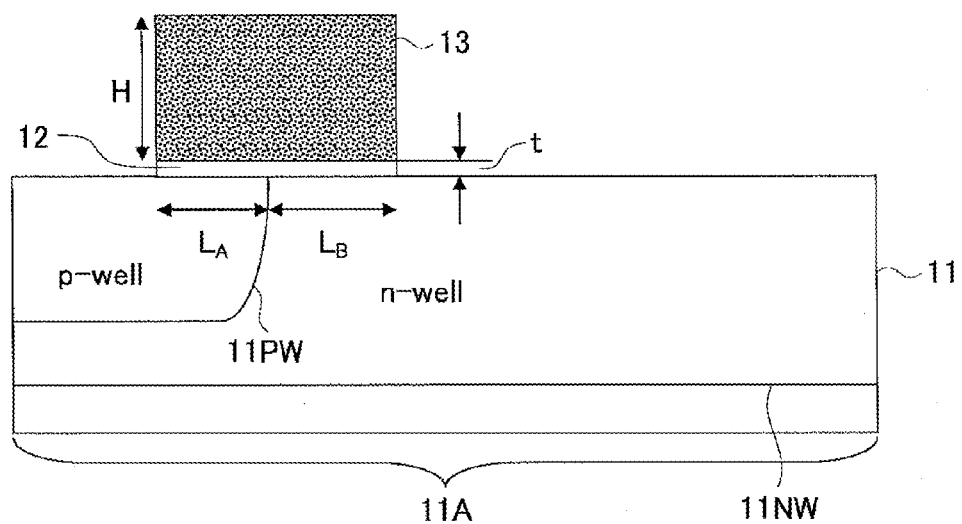
FIGS. 7A-7K are diagrams depicting the fabrication process of the high-voltage MOS semiconductor of the third embodiment.
Figure 7B:
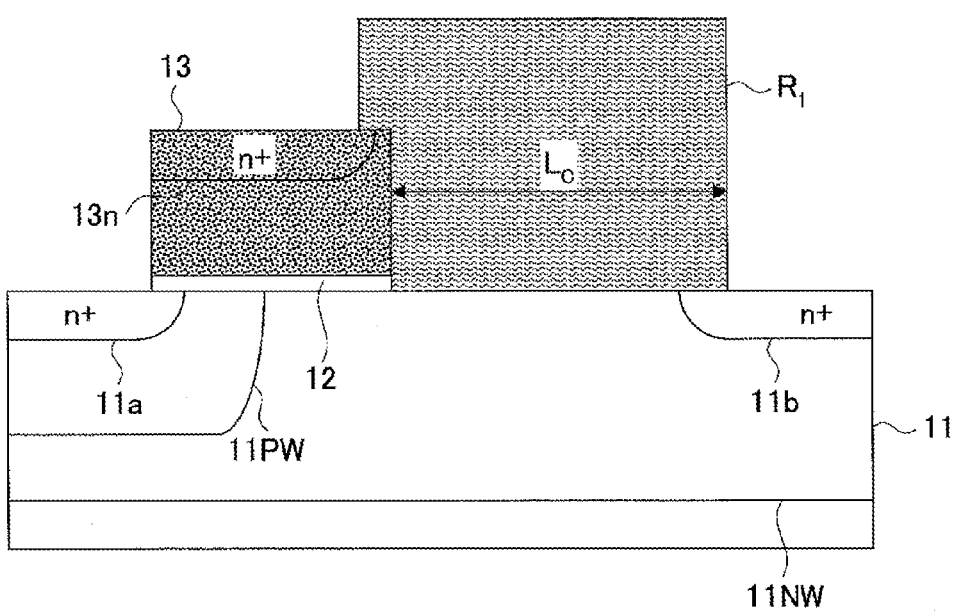
Figure 7C:
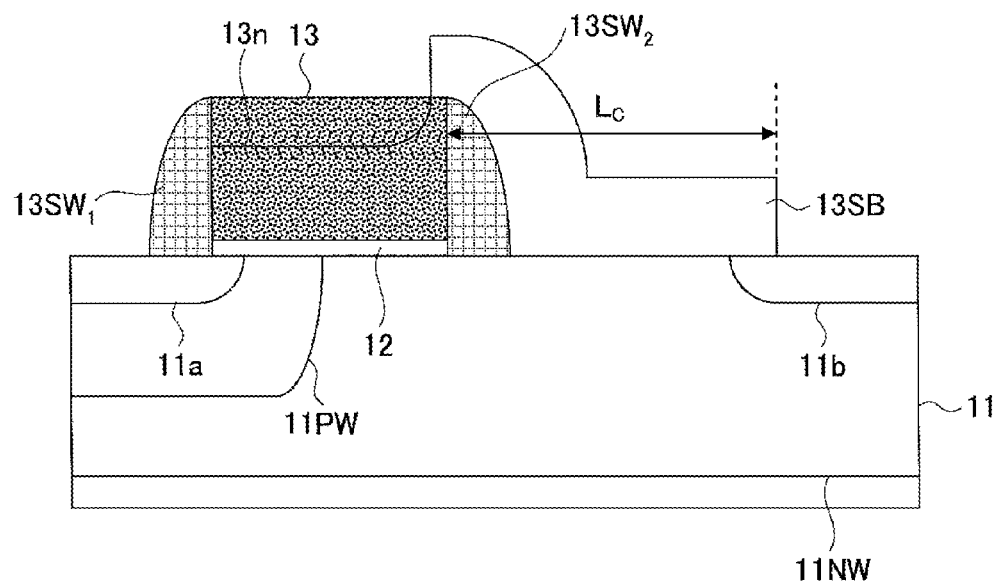
Figure 7D:
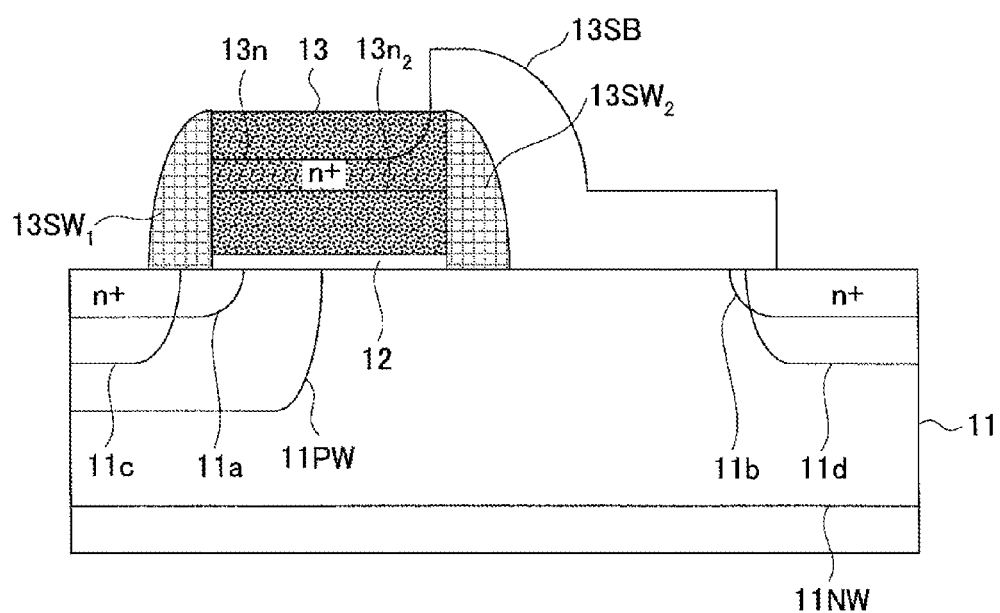
Figure 7E:
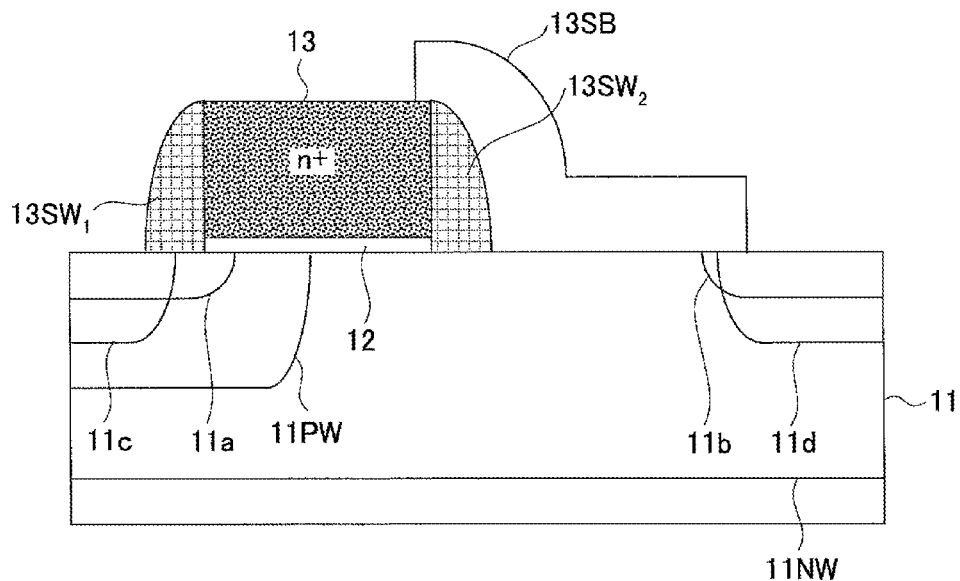
Figure 7F:
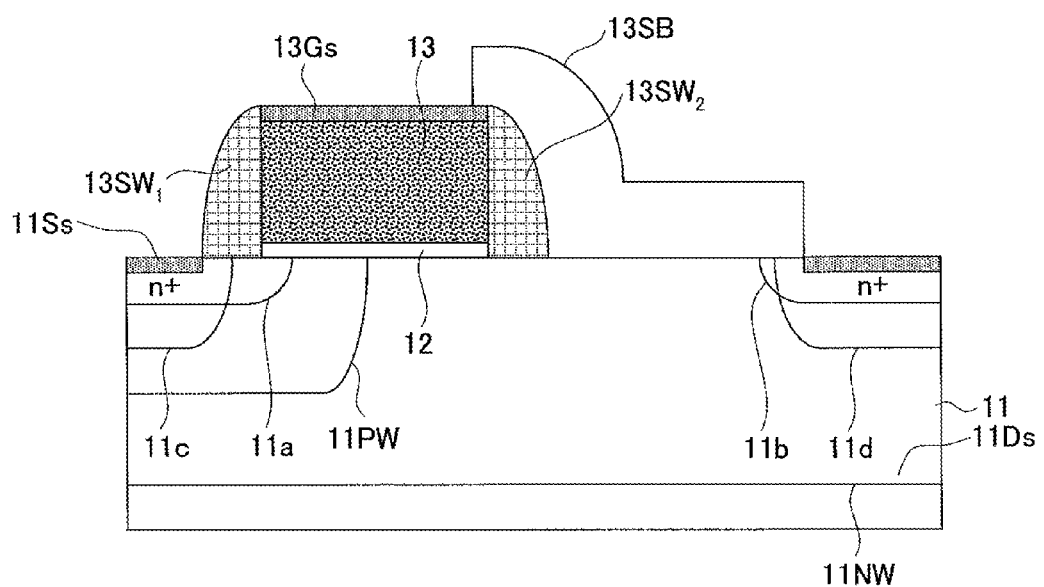
Figure 7G:
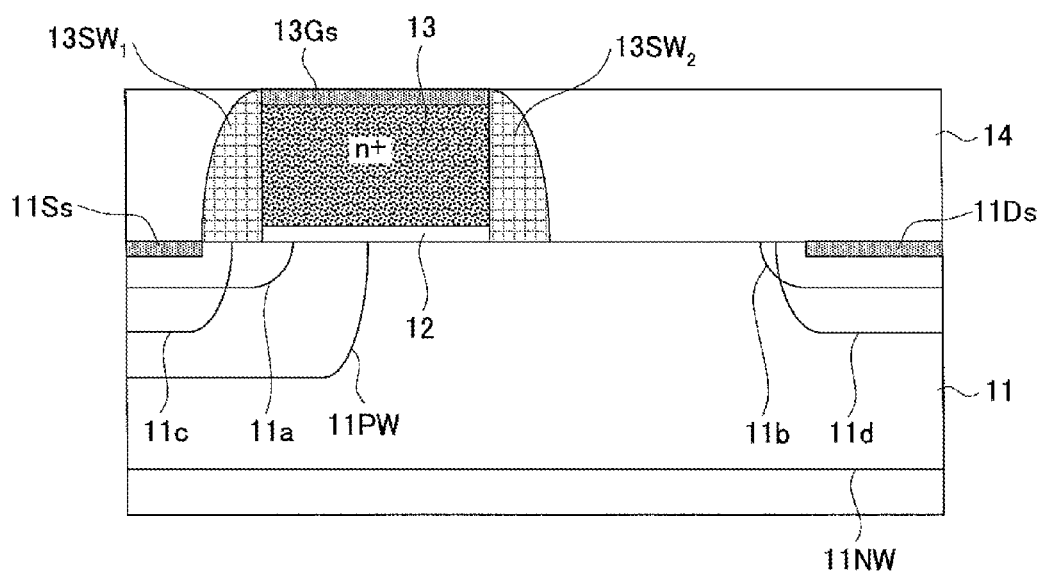
Figure 7H:
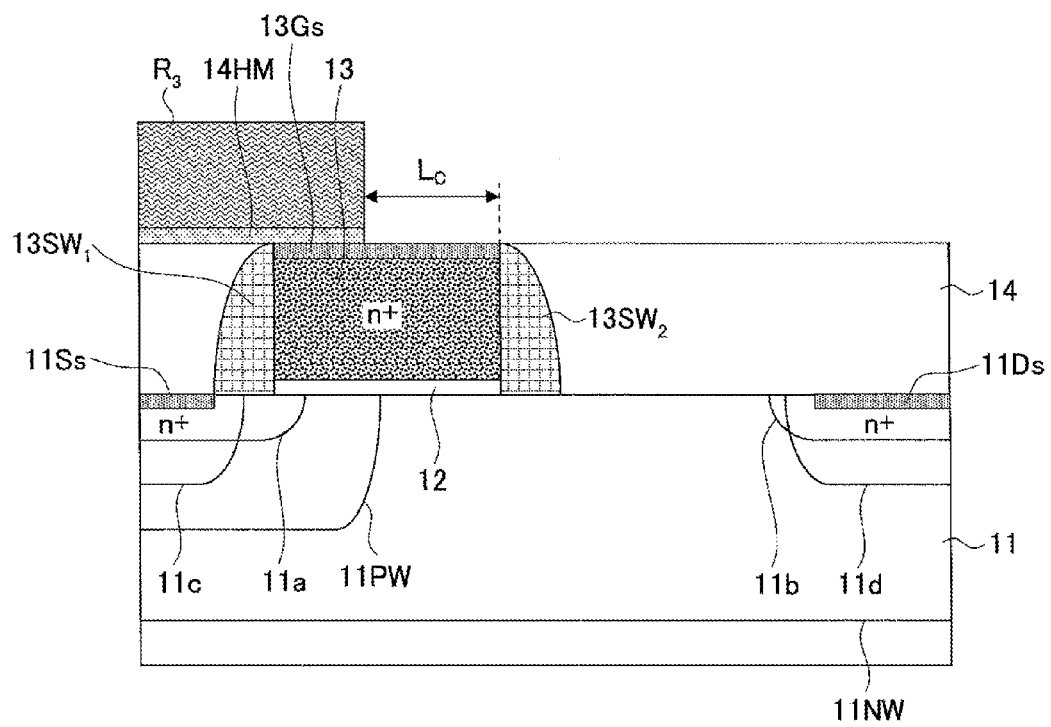

With the present embodiment, the hard mask layer 14HM of a silicon oxide film, or the like, is formed on the interlayer insulation film in the step of FIG. 7H, and after covering a part of the hard mask layer 14HM corresponding to the first gate electrode 13G, with a resist pattern $R_3$, the hard mask layer 14HM is removed by a dry etching process while using the resist pattern $R_3$ as a mask.

Figure 7I:
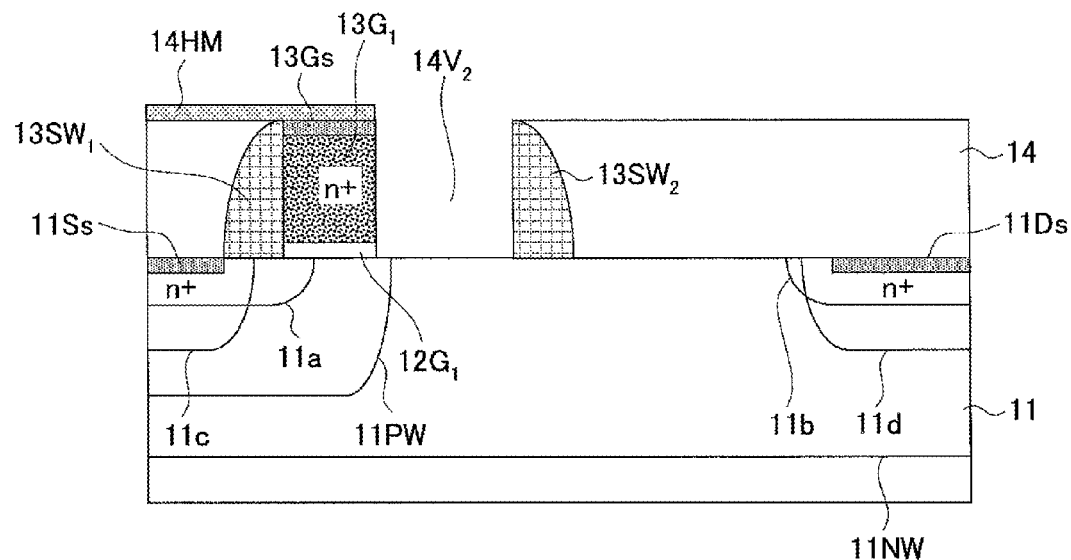

Next, in the step of FIG. 7I, the silicide layer 13Gs and the underlying polysilicon pattern 13 are removed by an anisotropic dry etching process acting generally perpendicularly to the surface of the silicon substrate 11 until the thermal oxide film 12 is exposed while using the hard mask layer 14HM as a mask. Further, the thermal oxide film 12 thus exposed is removed by a wet etching process while using HF, or the like. With this, the first gate electrode 13G, of polysilicon is formed in the part of the polysilicon pattern 13 at the side of the source region 11c together with the gate insulation film 12G$_1$ underneath by the thermal oxide film 12.

Figure 7J:
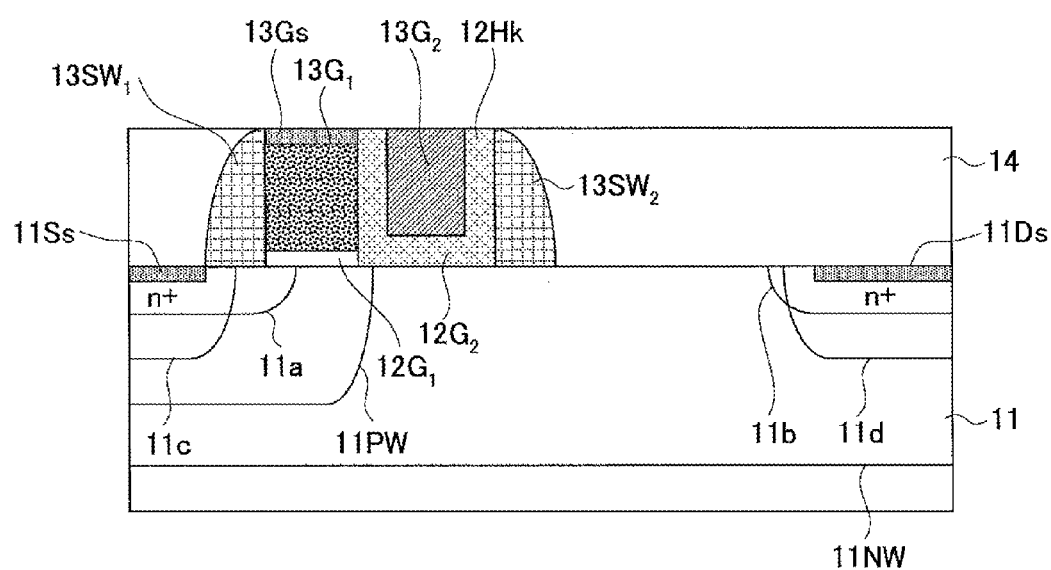
Figure 7K:
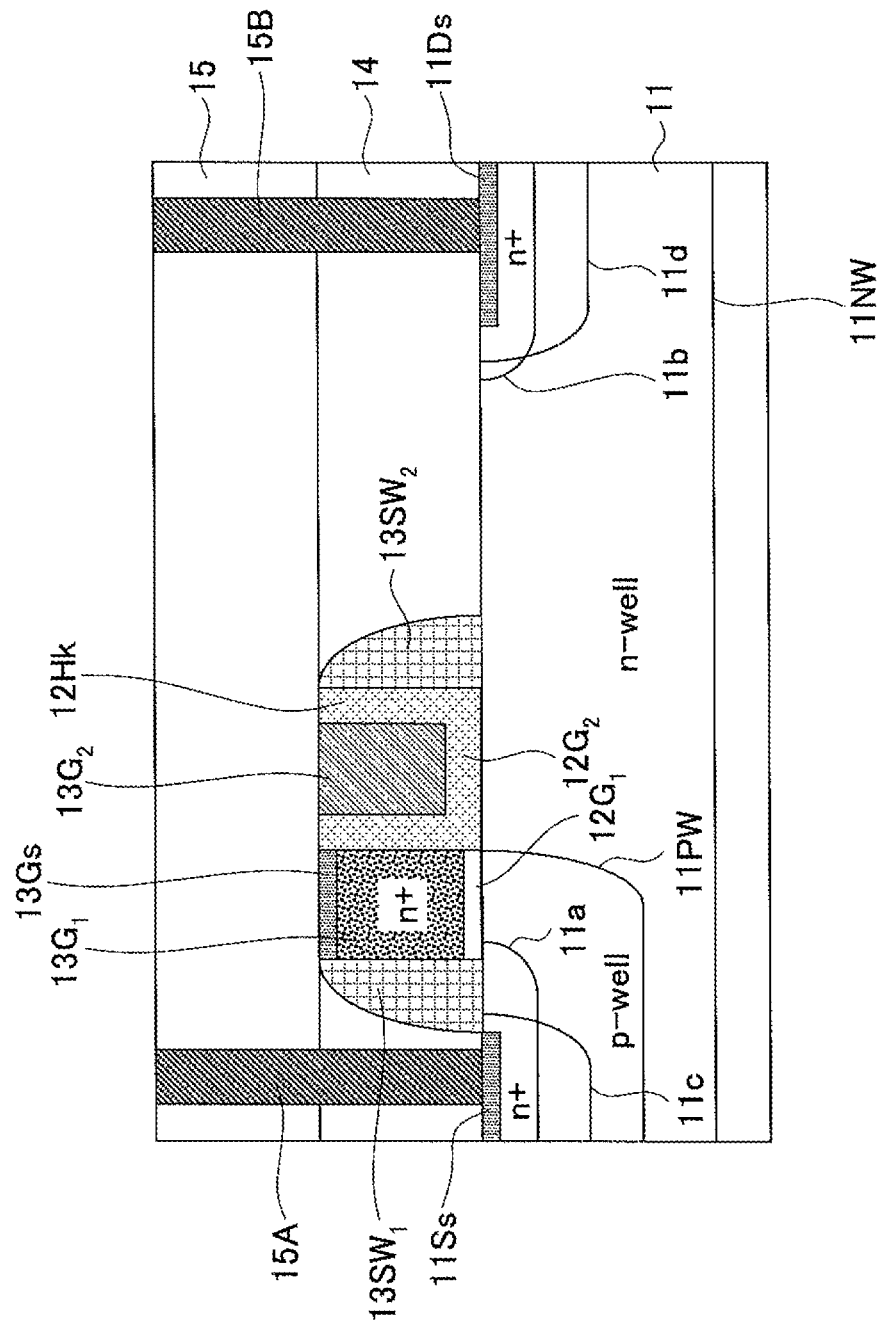

Further, in the step of FIG. 7J, the high-K dielectric film 12Hk is formed by a CVD process or ALD process to have a large thickness on the bottom surface and the sidewall surfaces of a void 14V$_2$ formed in the step of FIG. 7I at the drain region side of the first gate electrode 13G$_1$ such that the high-K dielectric film 12Hk has a thickness of 30 nm, for example, for securing sufficient breakdown voltage. It should be noted that the part of the high-K dielectric film 12Hk covering the bottom surface of the void 14V$_2$ constitutes the second gate insulation film 12G$_2$.

Further, the void 14V$_2$ having the bottom surface and the sidewall surfaces thus covered with the high-K dielectric film 12HK is filled with a metal or conductive nitride of the metal such as a TiN film or Ti film by a sputtering process. After removing excess TiN film or Ti film deposited on the interlayer insulation film 14 by a chemical mechanical polishing process, the second gate electrode 13G$_2$ is obtained on the first gate insulation film 12G$_2$ with separation from the first gate electrode 13G$_1$ by the high-K dielectric film 12Hk.

With the present embodiment, it is possible to carry out the step of forming the thermal oxide film 12 and the polysilicon pattern 13 of FIG. 7A together with the formation of other transistors on the same silicon substrate 11, such as the step of forming the gate insulation film and the polysilicon gate electrode of a logic transistor. Thus, the present embodiment is advantageous when forming the high-voltage transistor on the same silicon substrate 11 together with other transistors.

In the present embodiment, too, it is possible to form the second gate electrode 13G$_2$ in the floating state similarly to the high-voltage MOS transistor 10. Alternatively, it is possible to connect the second gate electrode 13G$_2$ to the gate interconnection 16G similarly to the case of the high-voltage transistor 20.

[Fourth Embodiment]

Figure 8B:
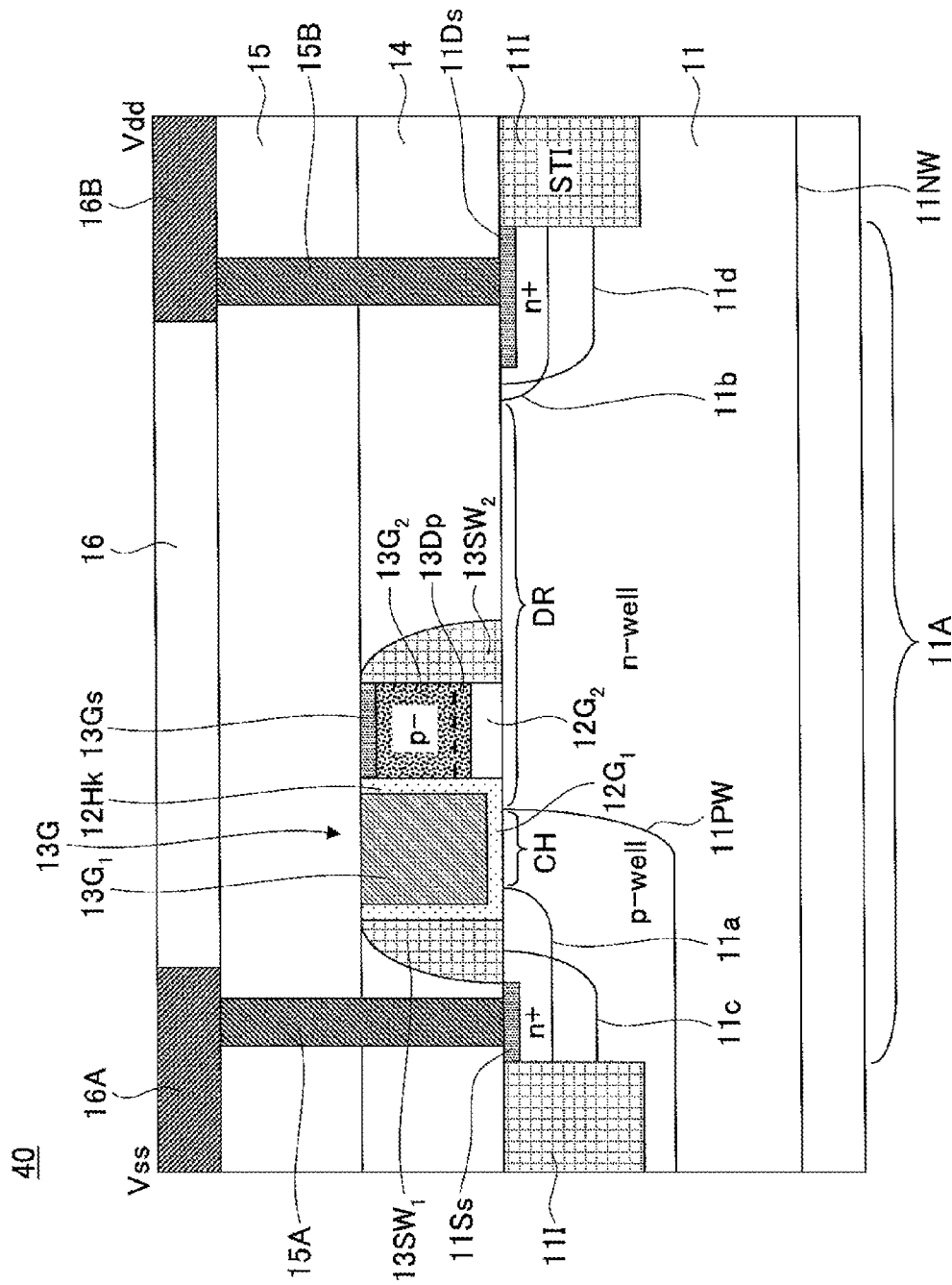
FIG. 8B is a cross-sectional diagram taken along a line C-C' of FIG. 8A.

FIG. 8A is a plan view diagram representing the construction of a high-voltage MOS transistor 40 according to a fourth embodiment while FIG. 8B is a cross-sectional diagram taken along a line A-A' of FIG. 8A. In the drawings, those parts explained before are designated by the same reference numerals and the description thereof will be omitted.

Referring to FIGS. 8A and 8B, the high-voltage MOS transistor 40 of the present embodiment has a construction similar to that of the high-voltage MOS transistor 20 of the previous embodiment, except that the second gate electrode 13G$_2$ is formed of polysilicon of p$^-$-type rather than the n$^+$-type.

Consider the case of the high-voltage MOS transistor 40 of such a construction is in a turned OFF state. In such a state, the high positive voltage Vdd is supplied to the drain region 11d, the ground voltage Vss is supplied to the source region 11c, and the gate voltage Vg of 0V is supplied to the first and second gate electrodes 13G$_1$ and 13G$_2$. In such a case, because of the positive voltage in the silicon substrate 11 right underneath the gate insulation film 12G$_2$, the holes in the p$^-$-type polysilicon constituting the gate electrode 13G$_2$ are expelled from the region in the vicinity of the interface between the gate insulation film 12G$_2$ and the polysilicon. As a result, there develops a depletion layer 13Dp in the vicinity of the interface between the polysilicon gate electrode 13G$_2$ and the gate insulation film 12G$_2$.

It should be noted that such a depletion layer 13Dp acts to increase the effective film thickness of the gate insulation film 12G$_2$, and because of this, it becomes possible to attain stable operation of the high-voltage transistor 40 particularly in the turned OFF state thereof in which a large electric field is applied to the gate insulation film 12G$_2$ and breakdown tends to occur, by suppressing the occurrence of such a breakdown.

Figure 9A:
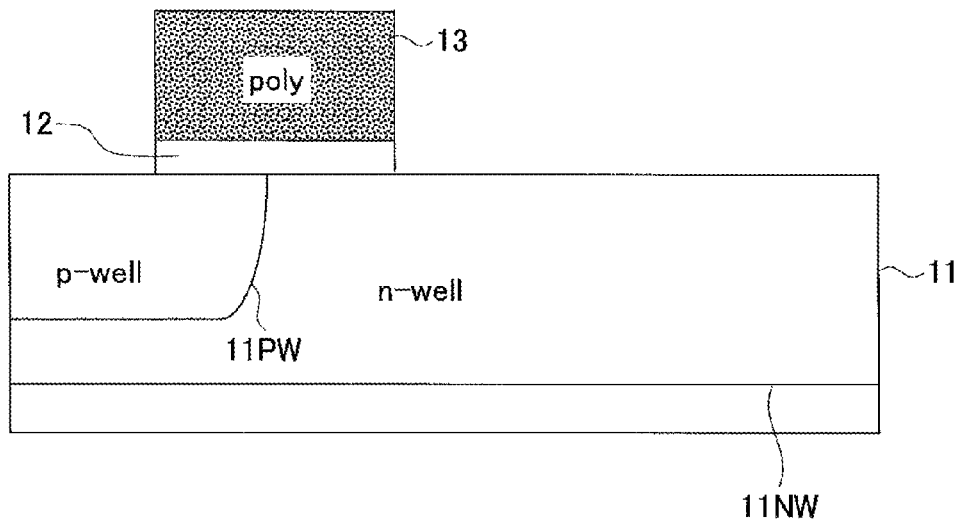
FIGS. 9A-9L are diagrams depicting the fabrication process of the high-voltage MOS semiconductor of the fourth embodiment.

Hereinafter, the fabrication process of the high-voltage MOS transistor 40 according to FIGS. 8A and 85 will be explained with reference to FIGS. 9A-9L. In FIGS. 9A and 9L, those parts corresponding to the parts explained before are designated by the same reference numerals and the description thereof will be omitted.

Referring to FIG. 9A, the polysilicon pattern 13 is formed over the silicon substrate 11 via the thermal oxide film 12 such that the polysilicon pattern 13 extends from the p-type well 11PW to the n-type well 11NW in the silicon substrate 11, similarly to the case of FIG. 3A.

Figure 9B:
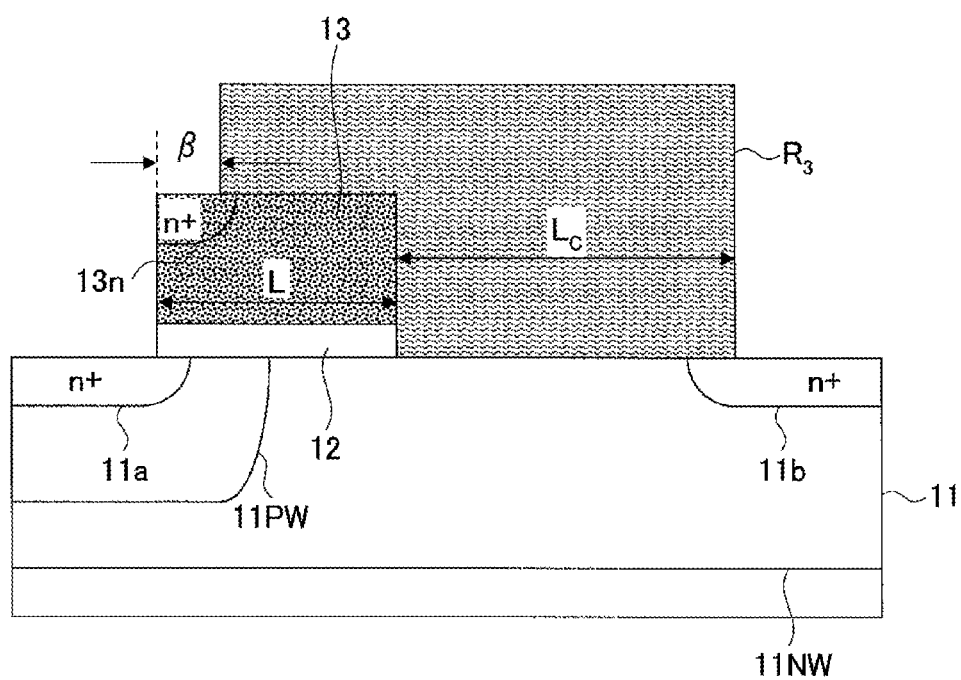

Next, in the step of FIG. 9B, the source extension region 11a is formed adjacent to the polysilicon pattern 13 and the drain region 11b is formed with offset from the polysilicon pattern by conducting an ion implantation process of P into the silicon substrate 11 similarly to the step of FIG. 3B, except that, with the present embodiment, the ion implantation process is carried out while using a resist pattern R$_3$ covering a majority of the part of the polysilicon pattern 13 instead of the resist pattern R$_1$ of FIG. 3B.

In the illustrated example, the resist pattern R$_3$ exposes a limited part β of the polysilicon pattern 13 at the source region side, and there is formed an n-type region 13n in the polysilicon pattern 13 in correspondence to the exposed region β. It should be noted that this is to make sure that the source extension region 11a is formed adjacent to the polysilicon pattern 13 even in the case there is an error in the position of the resist pattern R$_3$. Thus, the region β has a width of only 0.1 µm at the largest when the polysilicon pattern 13 has a width L of 1 µm. -{ }-

Figure 9C:
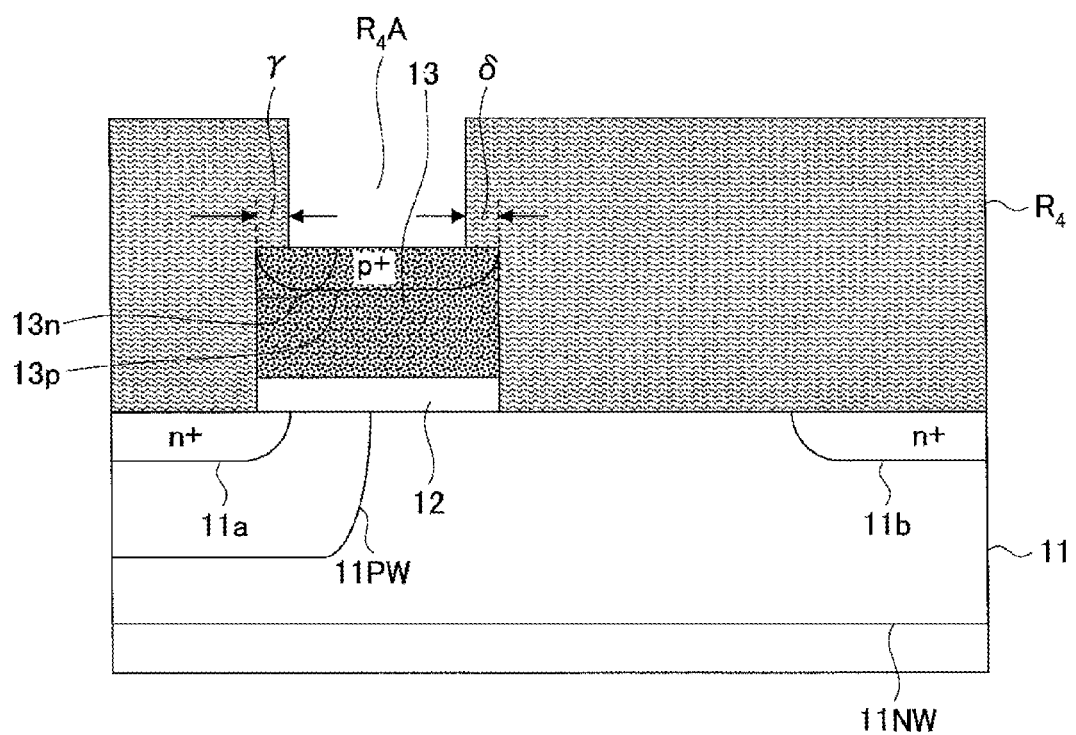

Next, in the step of FIG. 9C, the resist pattern R$_3$ is removed, and another resist pattern R$_4$ is formed over the silicon substrate 11 so as to cover the polysilicon pattern 13. Further, the resist pattern R$_4$ is formed with a resist opening R$_4$A exposing the majority part of the polysilicon pattern 13, and boron ions are introduced further in the step of FIG. 9C by an ion implantation process conducted under the acceleration voltage of 3 keV and the dose of $5 \times 10^{13}$ cm$^{-2}$ while using the resist pattern R$_4$ as a mask, such that the boron ions are introduced to a top region 13p of the polysilicon pattern 13 in correspondence to the resist opening R$_4$A. In the step of FIG. 9C, too, it should be noted that the resist opening R$_4$A is formed to be slightly smaller than the resist pattern 13 in view of possible positional errors, and as a result, the resist pattern R$_4$ covers the polysilicon pattern 13 at the regions γ and δ with respective widths of about 0.1 µm.

Figure 9D:
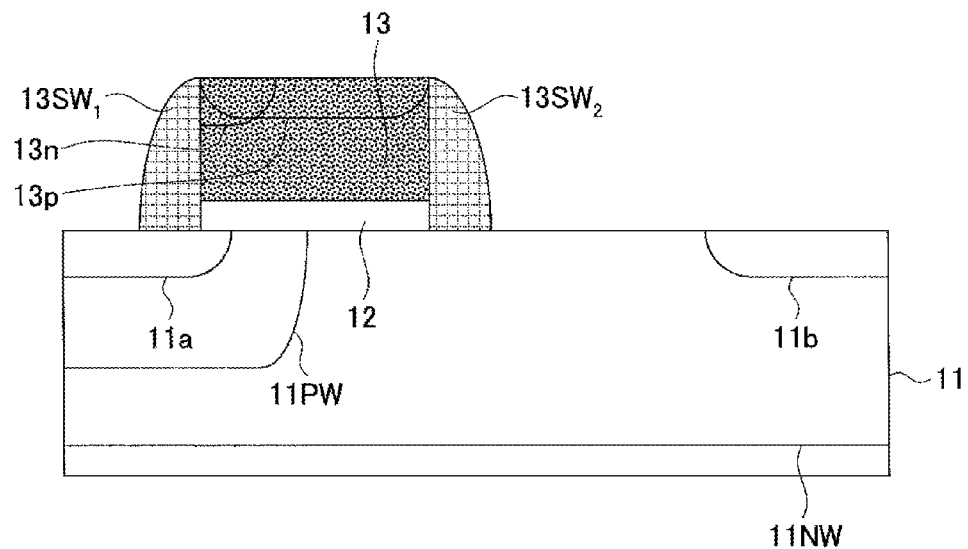
Figure 9E:
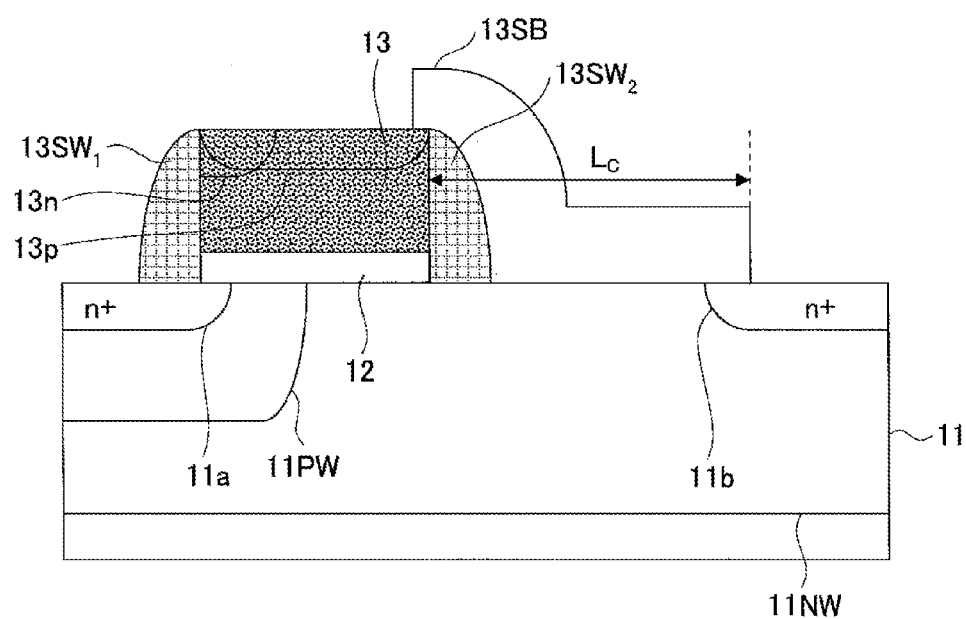

Further, in the step of FIG. 9D, the sidewall insulation films 13SW$_4$ and 13SW$_2$ are formed on the respective sidewall surfaces of the polysilicon pattern 13 at the source region side and the drain region side, and in the step of FIG. 9E, formation of the silicide block pattern 13SB of a silicon oxide film is conducted on the silicon substrate 11 similarly to the step of FIG. 3C such that the silicide block pattern 13SB covers a region of the distance Lc of 1 µm, for example, from the sidewall surface of the polysilicon pattern 13 at the drain region side.

Figure 9F:
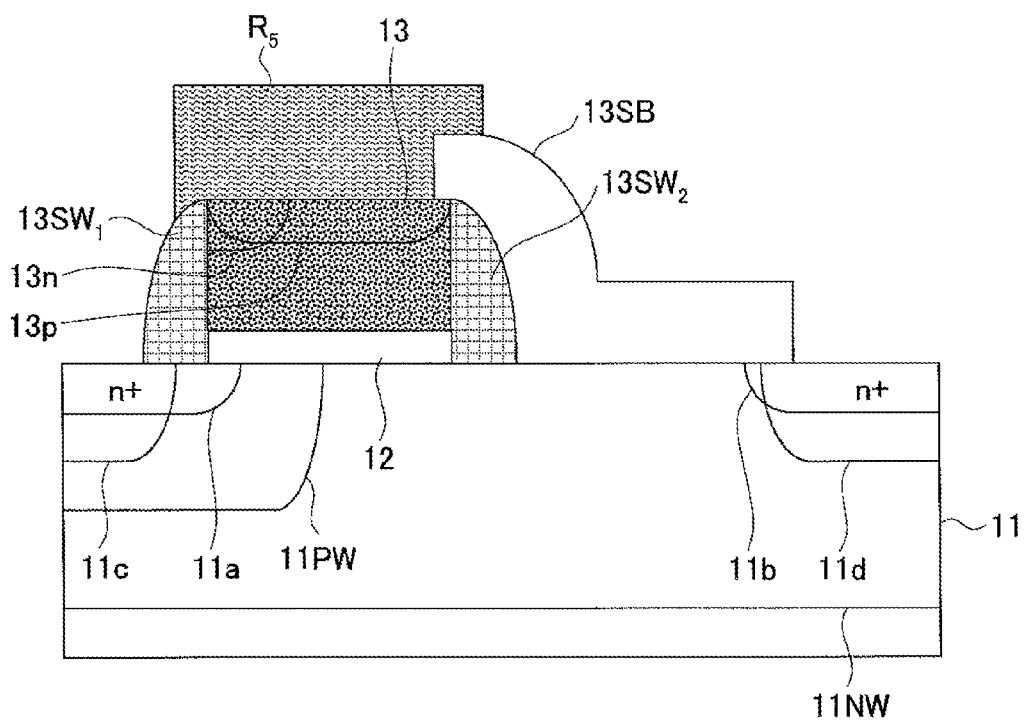

Further, in the step of FIG. 9F, the polysilicon pattern 13 is covered with a resist pattern R$_5$ and ion implantation of phosphorus is conducted into the silicon substrate 11 under the acceleration voltage of 15 keV and the dose of $2 \times 10^{15}$ cm$^{-2}$ while using the polysilicon pattern 13, the resist pattern R$_5$ and the silicide block 13SB as a mask. As a result, the source region 11c and the drain region 11d are formed similarly to the step of FIG. 3D explained before.

Figure 9G:
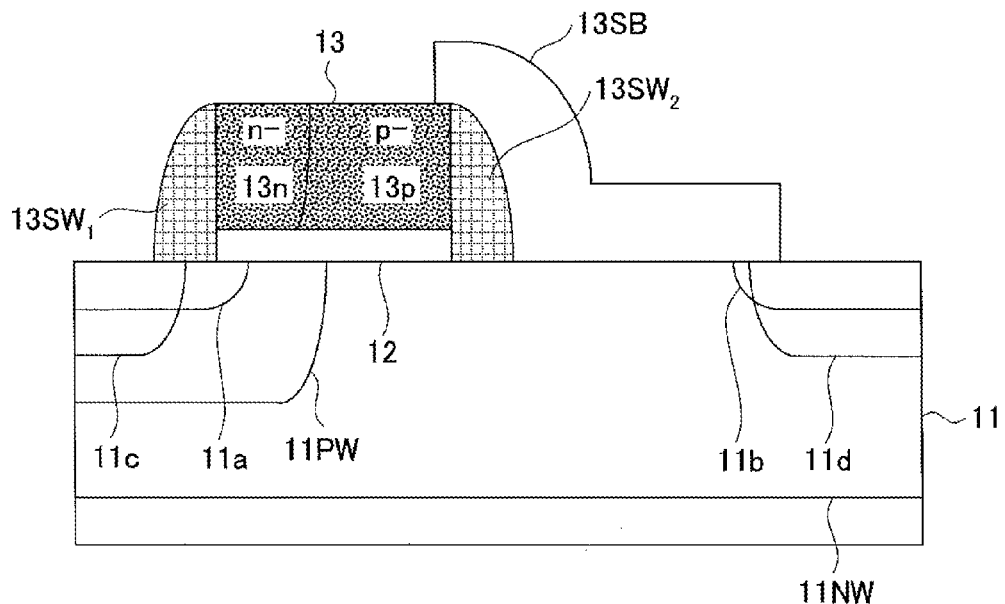

Further, in the step of FIG. 9G, the structure obtained in the step of FIG. 9F is subjected to a thermal annealing process after removing the resist pattern $R_5$ at 1000° C. for 10 seconds, for example. With this, the dopant ions introduced by the ion implantation process are activated.

As a result of such activation, the phosphorus ions and the boron ions that have been introduced previously cause diffusion in the polysilicon pattern 13, and as a result, the $p^+$-type region 13p spreads at least to the part of the polysilicon pattern 13 at the side of the drain region to form a $p^-$-type region. Further, the $n^-$-type region 13n spreads to the part of the polysilicon pattern 13 at the source region side and forms an $n^-$-type region. Here, it should be noted that the $n^-$-type region 13n is formed merely in anticipation of the positional error of the resist pattern $R_3$ as will be understood from the explanation of FIG. 9B and may not be formed in the case high precision resist patterning is possible.

Figure 9H:
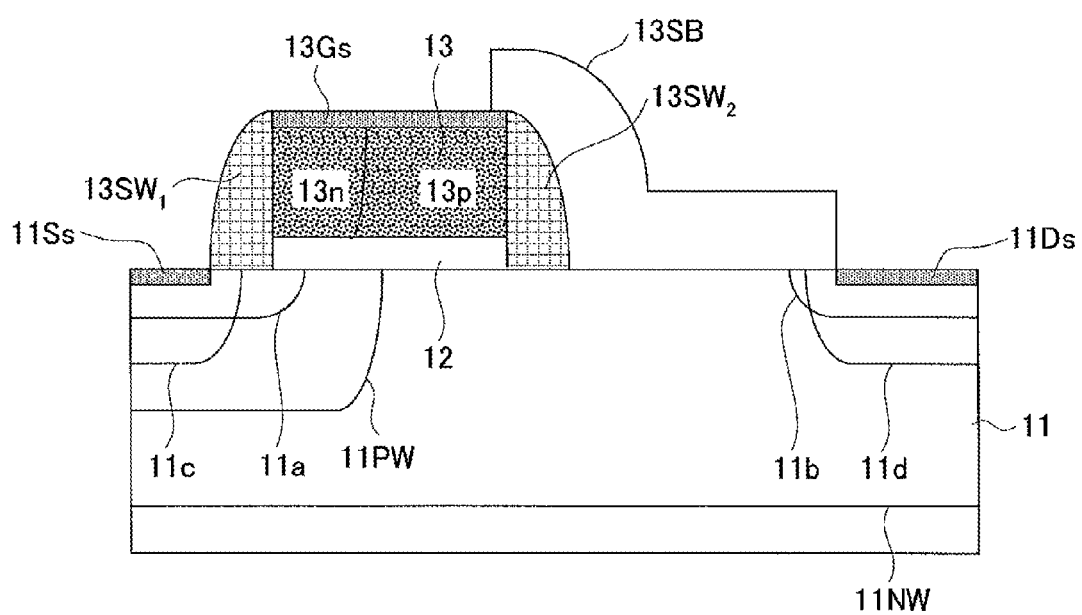

Next, in the step of FIG. 9H, the gate silicide layer 13Gs is formed on the polysilicon pattern 13 by a salicide process. Further, the source silicide region 11Ss is formed on the source region 11c and the drain silicide region 11Ds is formed on the drain region 11d. Because of formation of the silicide block pattern 13SB, it should be noted that the drain silicide region 11Ds is formed with an offset of the distance $L_C$ from the drain side edge of the polysilicon pattern 13 also in the present embodiment.

Figure 9I:
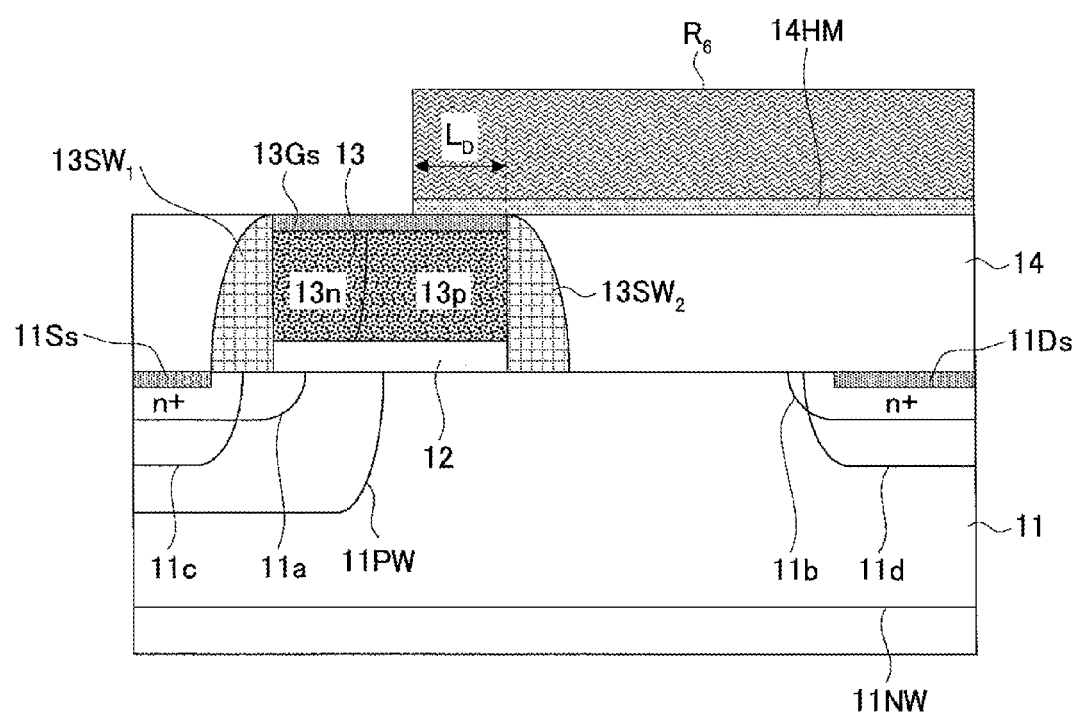
Figure 9J:
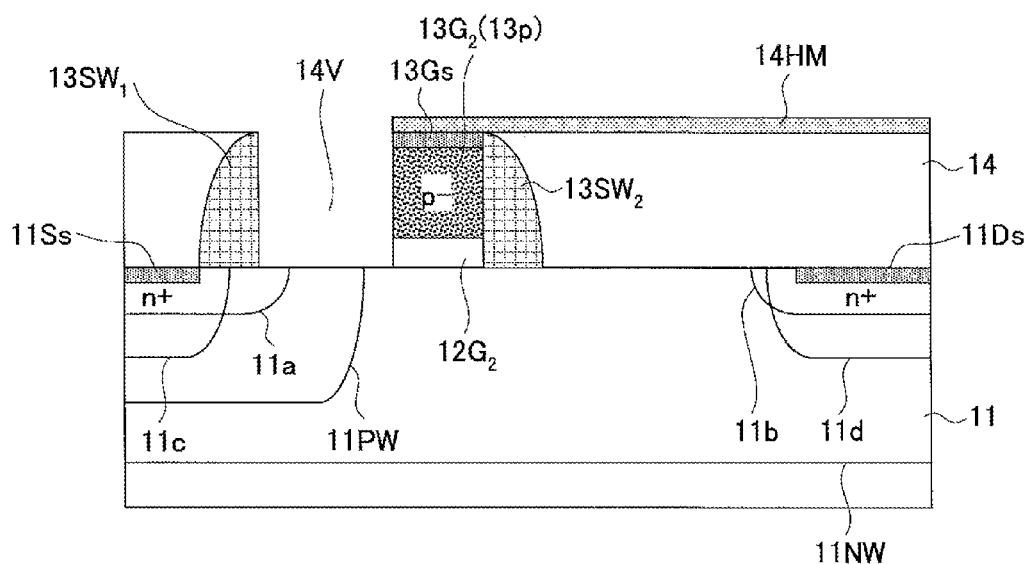

Next, in the step of FIG. 9I, the interlayer insulation film 14 is formed on the structure of FIG. 9H by a silicon oxide film, or the like, similarly to the step of FIG. 3G, and the silicide layer 13Gs of the polysilicon pattern 13 is exposed by conducting the planarization by a chemical mechanical polishing process. In the step of FIG. 9I, the hard mask layer 14HM is formed on the interlayer insulation film 14 similarly to the step of FIG. 3H, and the hard mask layer 14HM is patterned while using a resist pattern $R_6$ as a mask such that the polysilicon pattern 13 is exposed except for a part located at the side of the drain region with a length $L_D$. Further, while using the hard mask layer 14HM thus patterned as a mask, the silicide layer 13Gs, the polysilicon pattern 13G and the thermal oxide film 12 are removed by a dry etching process and further a wet etching process similarly to the step of FIG. 3I. With this, the void 14V is formed in the polysilicon pattern 13. With this, the second gate electrode $13G_2$ is formed by the $p^-$-type part 13p of the polysilicon pattern together with the second gate insulation film $12G_2$ underneath.

Figure 9K:
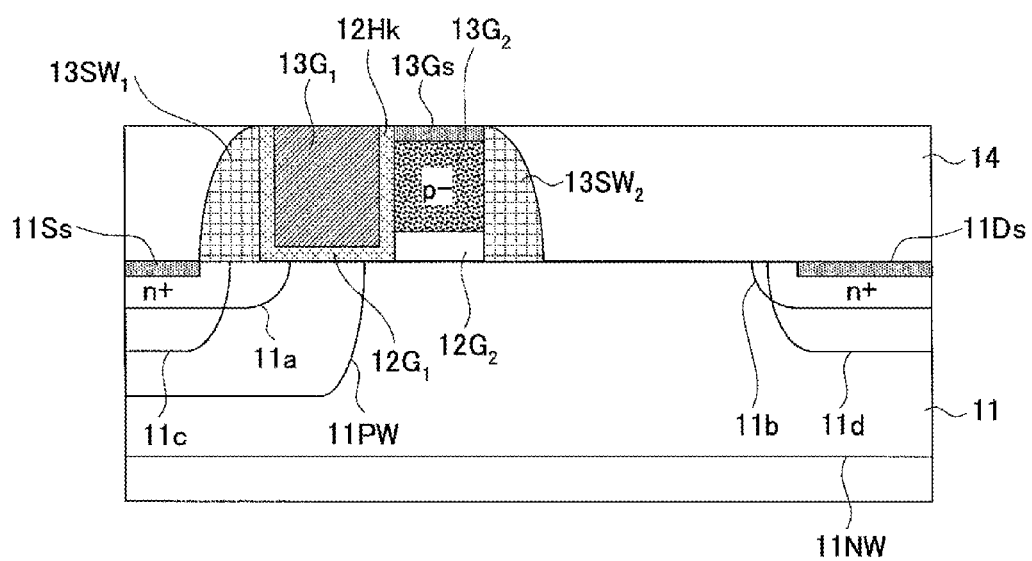
Figure 9L:
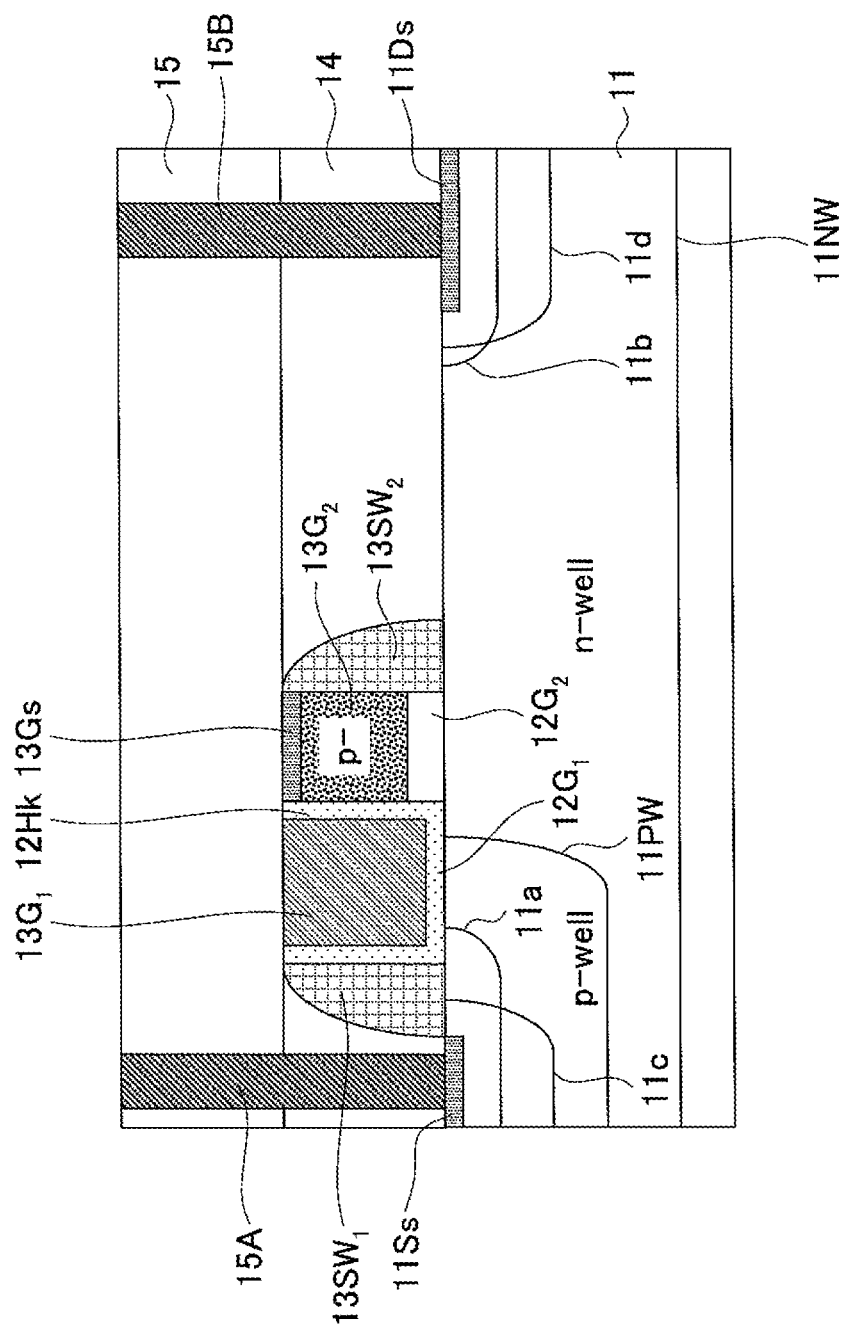

Further, in the step of FIG. 9K, the high-K dielectric film 13HK of $HfO_2$ of $HfSiO_4$ is formed in the void 14V so as to cover the sidewall surfaces and the bottom surfaces continuously similarly to the step of FIG. 3J by a CVD process or ALD process with a thickness of 2.5 nm, for example. Further, the void 14V is filled with a conductive nitride film such as TiN or a metal film such as Ti with a thickness of 100 nm, for example. Further, the excess conductive nitride film or metal film on the interlayer insulation film 14 is removed by a chemical mechanical polishing process conducted until the silicide layer 13Gs is exposed, and with this, the first gate electrode $13G_1$ is formed.

Further, in the step of FIG. 9L, the next interlayer insulation film 15 is formed on the interlayer insulation film 14 similarly to the step of FIG. 3K, and the via-plug 15A is formed in the interlayer insulation film 15 to contact with the silicide layer 11Ss in the source region 11c, the via-plug 15B is formed in the interlayer insulation film 15 to contact with the silicide layer 11Ds in the drain region 11d. Further, while not illustrated in the cross-section of FIG. 9L, the via-plugs 15G and $15G_2$ respectively contacting with the first gate electrode 13G, and the second gate electrode $13G_2$. With this, the high-voltage MOS transistor 40 of the present embodiment is obtained.

In the present embodiment, it should be noted that the ion implantation process of FIG. 9C introducing boron into the polysilicon pattern 13 can be conducted also in the step of FIG. 9D or FIG. 9E.

[Fifth Embodiment]

Figure 10:
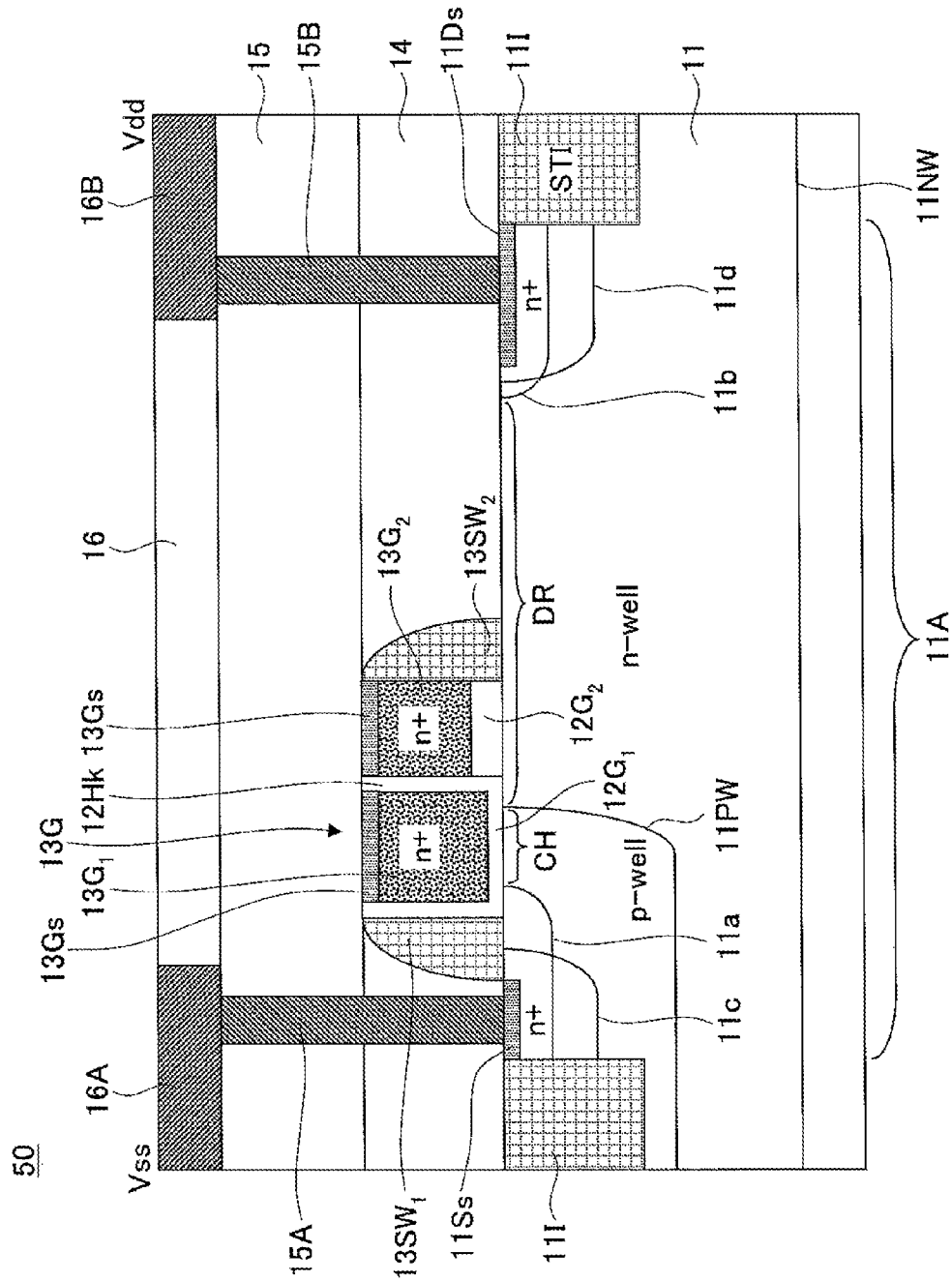
FIG. 10 is a cross-sectional view diagram representing a high-voltage MOS transistor according to a fifth embodiment.

FIG. 10 is a cross-sectional view diagram representing the construction of a high-voltage MOS transistor 50 according to a fifth embodiment. In FIG. 10, those parts explained before are designated by the same reference numerals and the description thereof will be omitted.

Referring to FIG. 10, the high-voltage MOS transistor 50 of the present embodiment has a construction similar to that of the high-voltage MOS transistor 10 or the high-voltage MOS transistor 20 of the previous embodiments, except that polysilicon doped to $n^+$-type is used for the first gate electrode 13G, in place of the conductive metal nitride such as TiN or the refractory metal such as Ti. Associated with this, the first gate insulation film $12G_1$ is formed of a thermal oxide film similarly to the second gate insulation film $12G_2$, except that the thermal oxide film constituting the first gate insulation film $12G_1$ has a much thinner film thickness such as 3 nm, for example.

Further, with the construction of FIG. 10, the silicide layer 13Gs is formed not only on the gate electrode $13G_2$ but also on the gate electrode $13G_1$.

According to the present embodiment, it becomes possible to fabricate the high-voltage MOS transistor 50 without using a conductive metal nitride film or metal film for the gate electrode and without using a high-K dielectric film for the gate insulation film. Thus, it becomes further possible to produce the high-voltage MOS transistor efficiently together with other MOS transistors on the same silicon substrate by an established process that uses polysilicon and thermal oxidation process.

Hereinafter, the fabrication process of the high-voltage MOS transistor 10 of FIG. 10 will be explained with reference to FIGS. 11A-11H depicting the process flow diagram.

Figure 11A:
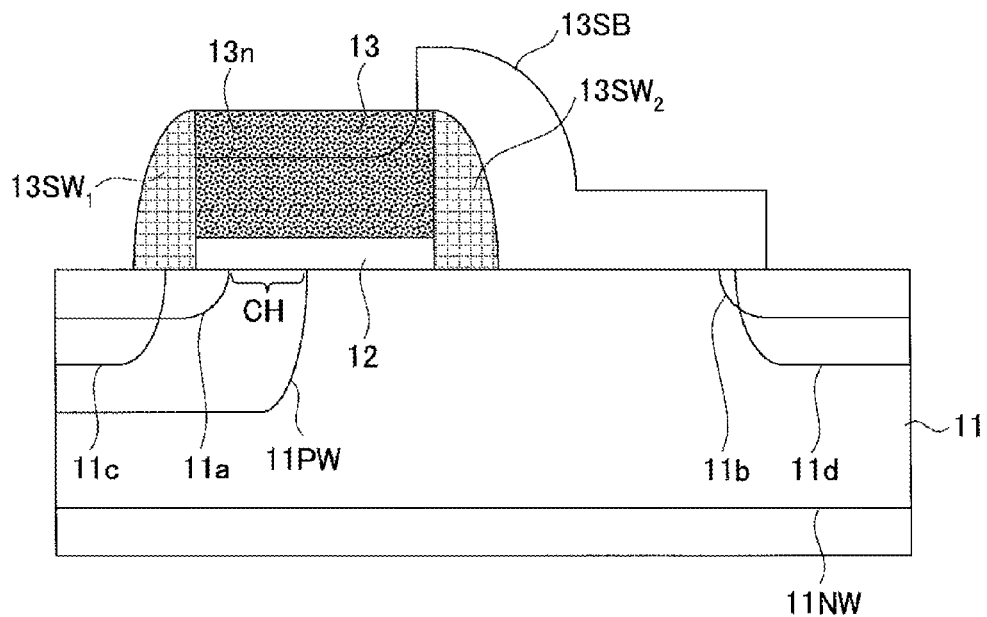
Figure 11B:
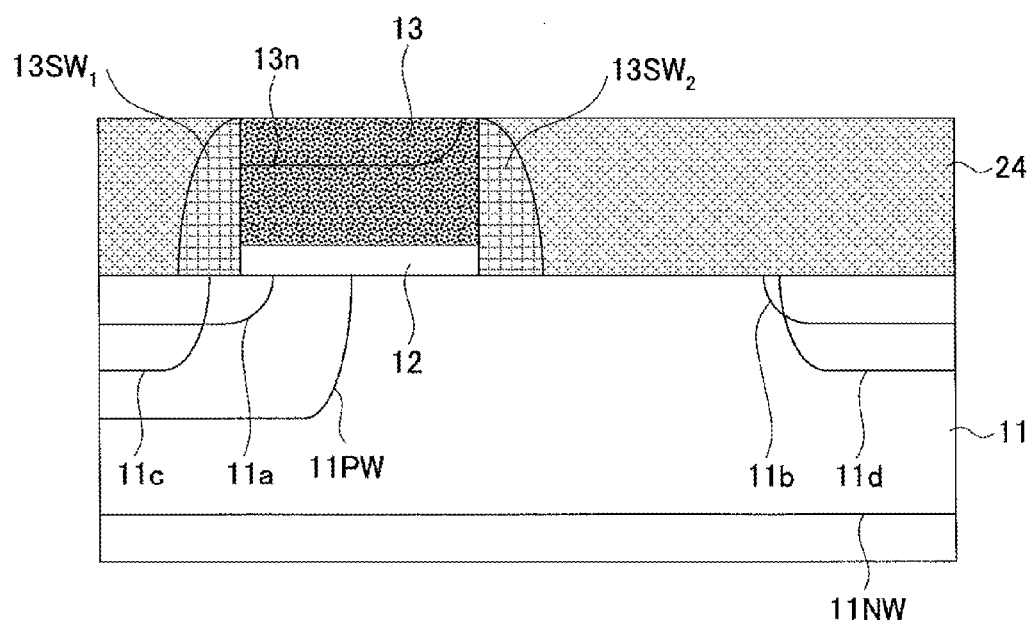

FIG. 11A is a step corresponding to that of FIG. 3D, and thus, the source region 11c and the drain region 11d are formed similarly to the case of FIG. 3D by conducting an ion implantation process of phosphorus into the silicon substrate 11 while using the silicide block pattern 13SB, the polysilicon pattern 13 and the sidewall insulation film $13SW_1$ as a mask.

Next, the silicide block pattern 13SB is removed, and an insulation film 24 having an etching selectivity with respect to the sidewall insulation films $13SW_1$ and $13SW_2$, such as an SiN film, is formed on the structure of FIG. 11A by a CVD process such that the polysilicon pattern 13 is covered with a thickness of 150 nm, for example. Here, the insulation film 24 serves for a provisional interlayer insulation film. The provisional interlayer insulation film 24 is then planarized by a chemical mechanical polishing process.

Figure 11C:
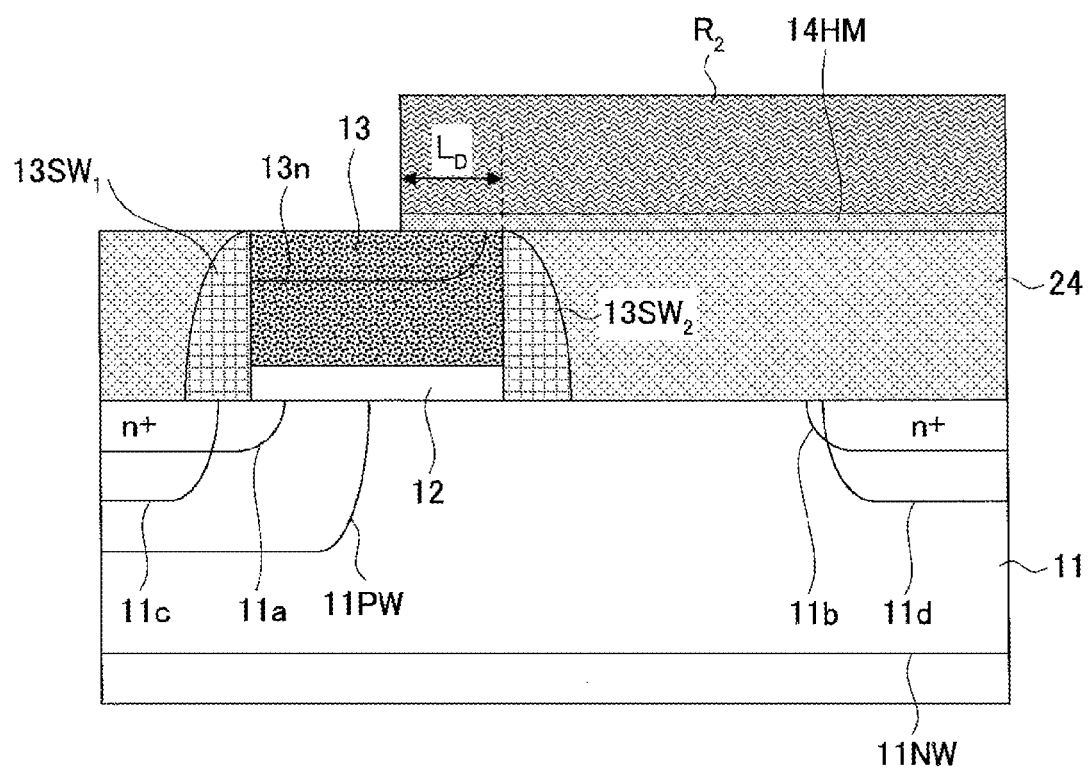

Further, in the step of FIG. 11C, the hard mask layer 14HM of a silicon oxide film is formed on the provisional interlayer insulation film 24 by a CVD process with a thickness of 20 nm, for example, and the hard mask layer 14HM is patterned further by using the resist pattern $R_2$ as a mask, such that the part of the polysilicon pattern 13 excluding the region $L_D$ is exposed. Similarly to the explanation made before, the region $L_D$ corresponds to the region where high electric field is induced in the silicon substrate 11 at the time of operation of the high-voltage transistor 50.

Figure 11D:
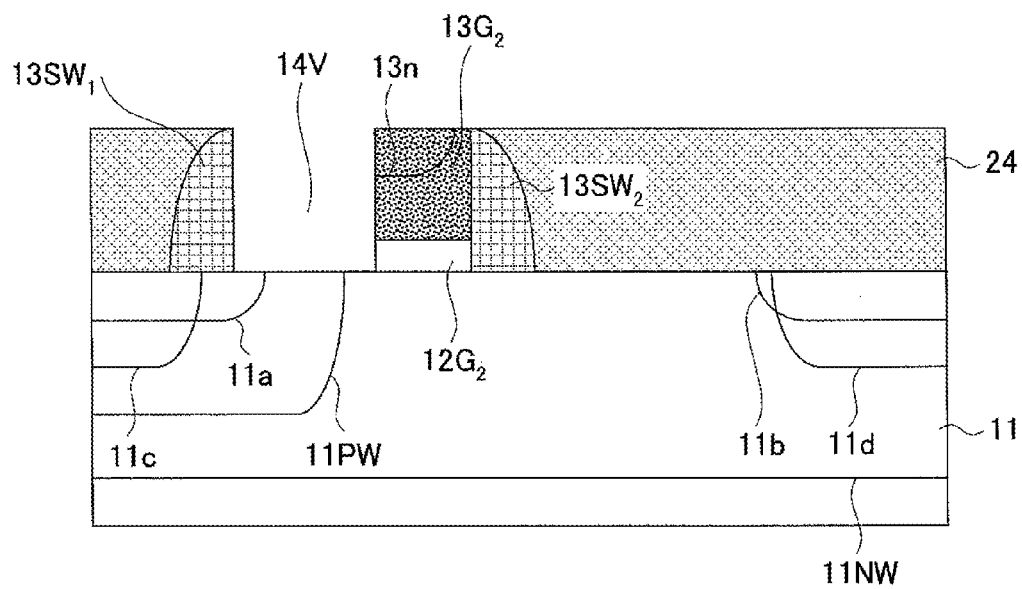

Further, similarly to the process of FIG. 3I, the polysilicon pattern 13 and the underlying thermal oxide film 12 are patterned in the step of FIG. 11D while using the hard mask layer 14 as a mask, and the void 14V is formed such that the surface of the silicon substrate 11 is exposed.

Figure 11E:
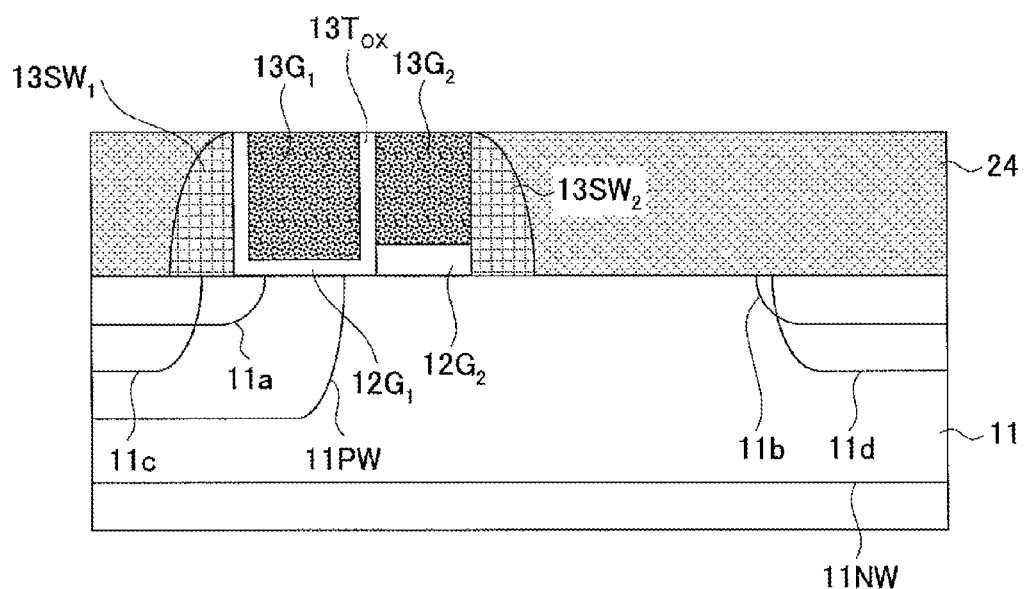

In the present embodiment, the hard mask layer 14 is removed in the subsequent step of FIG. 11E. Further, a thermal oxidation process is conducted, and as a result, a thermal oxide film 13Tox is formed so as to cover the sidewall surfaces and the bottom surface of the void 14V continuously, wherein the thermal oxide film 13Tox is formed with a thickness such as 3 nm, for example, for reducing the ON-resistance.

Further, in the step of FIG. 11E, the void 14V is filled with a polysilicon film via the thermal oxide film 13Tox thus formed, and the polysilicon film 13 is removed by a chemical mechanical polishing process until the insulation film 24 is exposed. As a result, there is obtained the structure in which the void 14V is filled with first gate electrode $13G_1$ of polysilicon.

In the step of FIG. 11E, it should be noted that the thermal oxide film 13Tox formed between the first gate electrode $13G_1$ and the sidewall insulation film $13SW_1$ is an oxide film formed by modification of the CVD insulation film constituting the sidewall insulation film $13SW_1$ by the thermal oxidation process. Even so, the insulation film has excellent leakage characteristics similar to that of a thermal oxide film as a result of the modification.

Figure 11F:
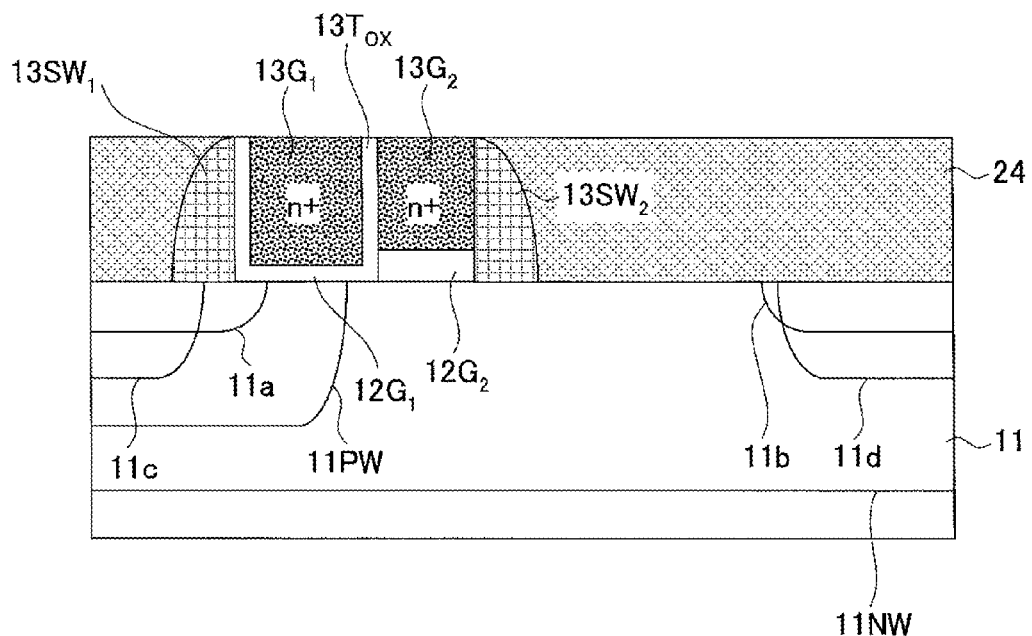

Next, in the step of FIG. 11F, phosphorus is introduced to the structure of FIG. 11E by an ion implantation process conducted under the acceleration voltage of 15 keV and the dose of $2 \times 10^{15}$ cm$^{-2}$. With this, the first and second polysilicon gate electrodes $13G_1$ and $13G_2$ are doped to the n$^+$-type.

Figure 11G:
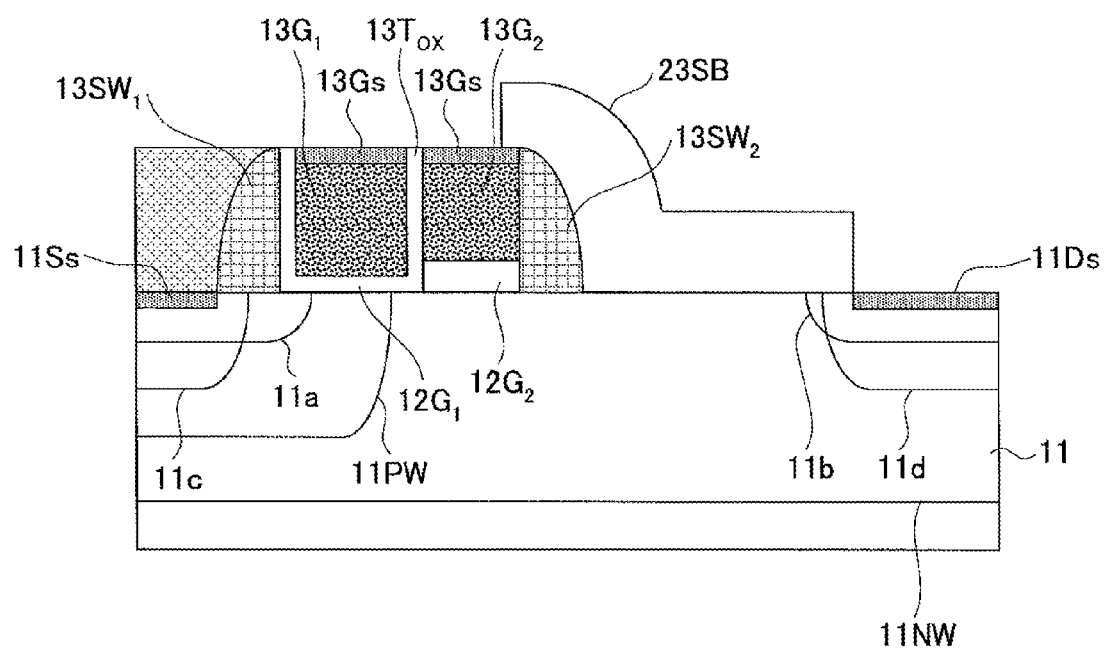

Further, in the step of FIG. 11G, the provisional interlayer insulation film 24 is removed from the surface of the silicon substrate 11 by a wet etching process while leaving the sidewall insulation films $13SW_1$ and $13SW_2$, the polysilicon gate electrodes $13G_1$ and $13G_2$ and the thermal oxide film 13Tox as they are. Further, there is formed a silicide block pattern 23S similar to the silicide block pattern 13SB on the exposed silicon substrate 11 so as to cover the part between the source region 11d and the second gate electrode $13G_2$.

Further, while using the silicide block pattern 23SB as a mask, the silicide layers 13Gs, 11Ss and 11Ds are formed respectively on the top surfaces of the first and second gate electrodes $13G_1$ and $13G_2$ and the top surfaces of the source region 11c and the drain region 11d by a salicide process.

Further, in the step of FIG. 11H, there is formed an interlayer insulation film 25 over the silicon substrate 11 so as to cover the first and second gate electrodes $13G_1$ and $13G_2$ and further the silicide block pattern 23B, and the interlayer insulation film 25 is subsequently planarized by a chemical mechanical polishing process. Further, by forming the via-plugs 15A and 15B respectively in contact with the silicide layer 11Ss in the source region 11c and the silicide layer 11Ds in the drain region 11d, and further by forming the via-plugs 15G and $15G_2$ not illustrated respectively in contact with the first and second gate electrodes $13G_1$ and $13G_2$ similarly to the plan view of FIG. 8A, the high-voltage MOS transistor 50 is obtained.

[Sixth Embodiment]

In the embodiments described heretofore, explanation has been made with regard to the examples in which the gate electrode structure is formed of two gate electrodes isolated with each other by an insulation film. However, it is also possible to form the gate electrode structure by three or more crate electrodes.

Figure 12:
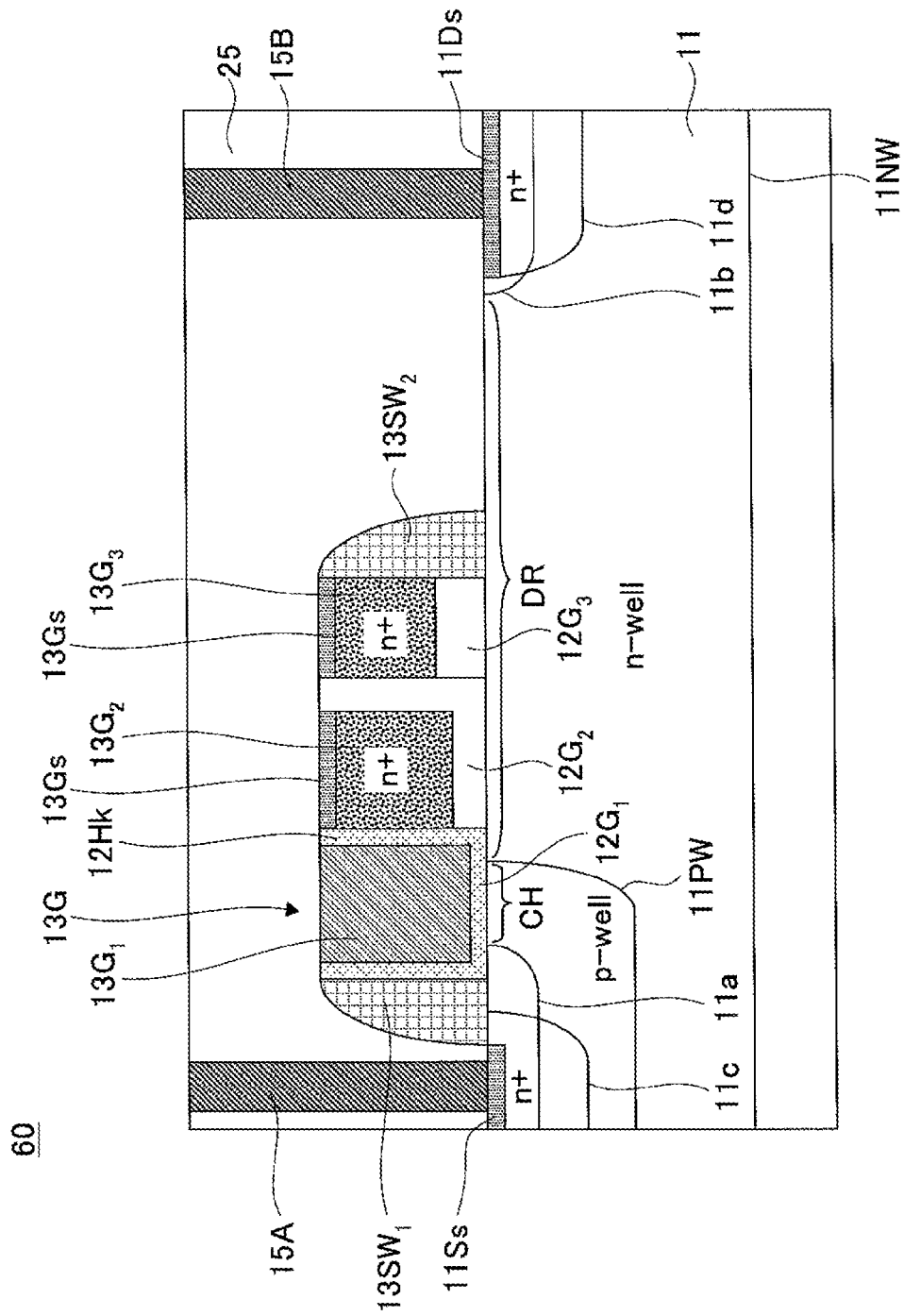
FIG. 12 is a cross-sectional view diagram representing a high-voltage MOS transistor according to a sixth embodiment.

FIG. 12 is a cross-sectional diagram representing the construction of a high-voltage MOS transistor 60 according to a sixth embodiment in which the gate electrode structure is formed of three gate electrodes. In the drawings, those parts explained before are designated by the same reference numerals and the description thereof will be omitted.

Referring to FIG. 12, the high-voltage MOS transistor 60 has a construction similar to that of the high-voltage MOS transistor 10 in that the first gate electrode $13G_1$ and the second gate electrode $13G_2$ are formed respectively on the first gate insulation film $12G_1$ and the second gate insulation film $12G_2$, wherein it should be noted that there is further formed a third gate electrode $13G_3$ of n$^+$-type polysilicon on a third gate insulation film $12G_3$ of a thermal oxide film of the thickness of 60 nm at the drain region side of the second gate electrode $13G_2$ such that the third gate electrode $13G_3$ is isolated from the second gate electrode $13G_2$ by a thermal oxide film having a thickness of 30 nm similarly to the second gate insulation film $12G_2$.

With the high-voltage MOS transistor of such a construction, there is attained significant improvement in the breakdown voltage at the drain edge of the gate electrode structure 13G and normal operation is guaranteed even when operated under a high supply voltage.

Hereinafter, the fabrication process of the high-voltage MOS transistor 60 of FIG. 12 will be explained with reference to the process flow diagram of FIGS. 13A-13H.

Referring to FIG. 13A, it can be seen that the polysilicon pattern 13 is formed on the silicon substrate 11 with a width L2 of 1.2 μm larger than the width L of FIG. 1 and a height H of 100 nm continuously from the p-type well 11PW to the n-type well 11NW, wherein the polysilicon pattern 13 covers the p-type well 11PW over the distance $L_A$ of 0.6 μm similarly to the embodiment of FIG. 1 while the polysilicon pattern 13 further covers the n-type well 11NW over a distance $LB_2$ of 0.6 μm larger than the distance $L_B$ of FIG. 1.

Next, in the step of FIG. 13B, an impurity element of phosphorus, or the like, is introduced into the silicon substrate 11 similarly to the process of FIG. 1B by an ion implantation process, and the source extension region of n$^+$-type is formed in the silicon substrate 11 at the source region side of the polysilicon pattern and the drain extension region 11b of n$^+$-type is formed in the silicon substrate 11 at the drain region side of the polysilicon pattern 13 but with offset therefrom.

Further, in the step of FIG. 13B, the sidewall insulation films $13SW_1$ and $13SW_2$ of a silicon oxide film is formed on the sidewall surfaces of polysilicon pattern 13 of FIG. 13A at the source region side and the drain region side, and the source region 11c of the n$^+$-type and the drain region 11d of the n$^+$-type are formed by introducing phosphorus into the silicon substrate 11 by an ion implantation process while using the polysilicon pattern 13, the sidewall insulation films $13SW_1$ and $13SW_2$ and the silicide block pattern 13SB as a mask similarly to the case explained with reference to FIG. 3D.

Further, in the step of FIG. 13B, a provisional interlayer insulation film 24 formed for example of SiN, or the like, and showing etching selectivity with regard to the sidewall insulation films $13SW_1$ and $13SW_2$, is formed on the silicon substrate 11 with a thickness of 150 nm, for example, so as to cover the polysilicon pattern 13.

Further, in the step of FIG. 13B, the provisional interlayer insulation film 24 thus formed is subjected to a chemical mechanical polishing process such that the top surface of the polysilicon pattern 13 is exposed. The polysilicon pattern 13 is then subjected to a dry etching process and is removed except for a part $L_E$ corresponding to the region of the silicon substrate 11 in which there is induced a high electric field. Further, the exposed thermal oxide film 12 is removed by a wet etching process, and the void 14V is formed. As a result of formation of the void 14V, the polysilicon pattern 13 is patterned to form the third gate electrode 13G$_3$ of n$^+$-type, and the thermal oxide film 12 forms the third gate insulation film 12G$_3$.

Next, in the step of FIG. 13C, a thermal oxidation process is conducted on the structure of FIG. 13B, and as a result, the thermal oxide film 12Tox is formed similarly to the step of FIG. 11E such that the thermal oxide film 12Tox covers the exposed surface of the silicon substrate 21 at the bottom of the void 14, the inner wall surface of the sidewall insulation film 13SW$_1$, and further the sidewall surface of the polysilicon pattern constituting the third gate electrode 13G$_3$, but with a thickness of 3 nm, for example. Further, the void 14V is filled with a polysilicon film (not illustrated).

Further, the part of the polysilicon film deposited on the provisional interlayer insulation film 24 is removed by a chemical mechanical polishing process, and as a result, there is obtained a structure depicted in FIG. 13C in which the void 14V is filled with a polysilicon pattern 13$_1$ via the thermal oxide film 12Tox.

Further, in the step of FIG. 13D, the polysilicon pattern 13$_1$ and the third gate electrode 13G$_3$ are doped to the n$^+$-type by introducing thereto phosphorus by an ion implantation process. Further, in the step of FIG. 13E, the hard mask layer 14HM is formed on the provisional insulation film 24 so as to cover the polysilicon pattern 13$_1$ and the third gate electrode 13G$_3$.

Figure 13E:
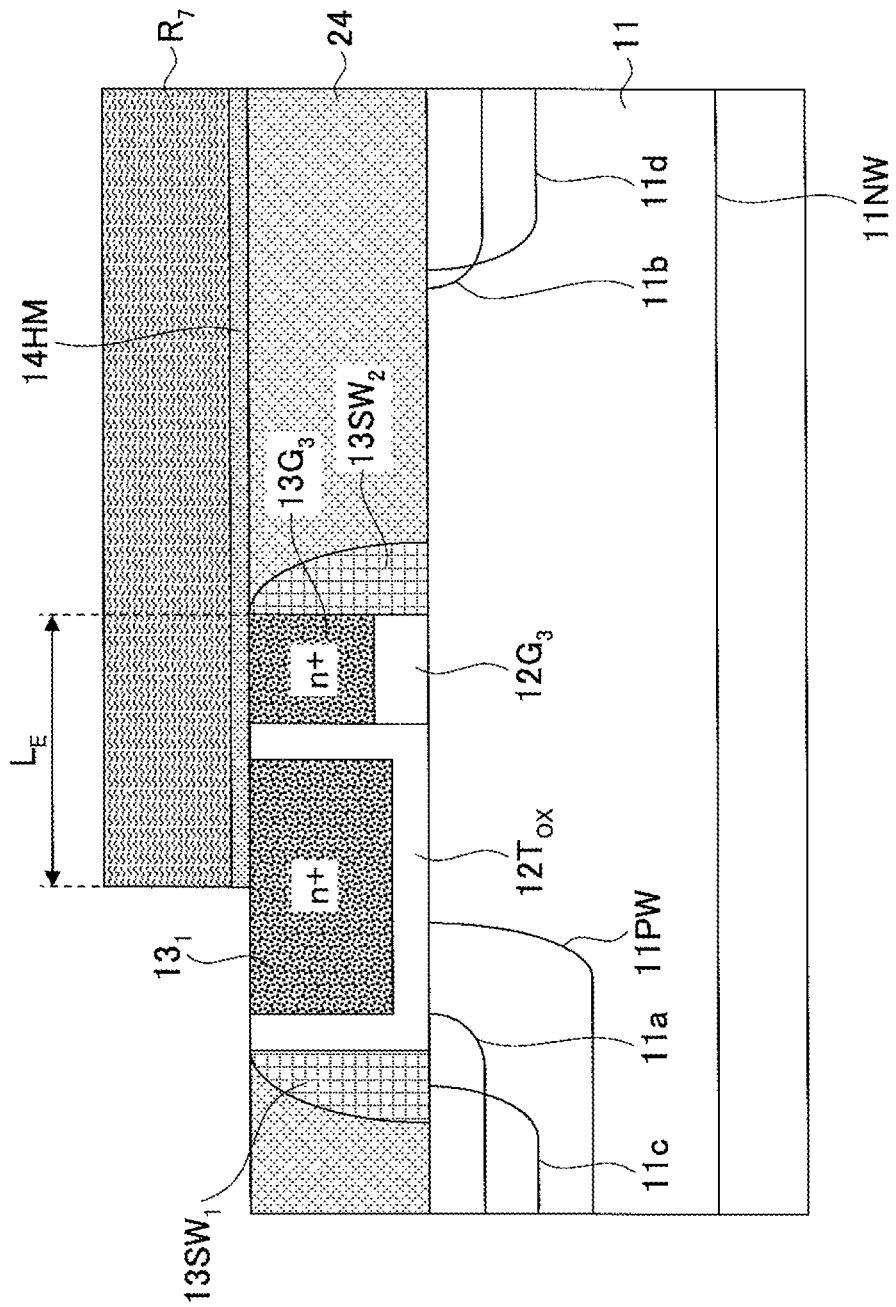

Further, in the step of FIG. 13E, the hard mask layer 14HM is patterned while using a resist pattern R$_7$ corresponding to the resist pattern R$_2$ of FIG. 3H as a mask. As a result of the patterning, the hard mask layer 14HM is left in corresponding to the region L$_E$ that includes the region L$_D$ and corresponds to the region where a high electric field is induced in the silicon substrate 11.

Figure 13F:
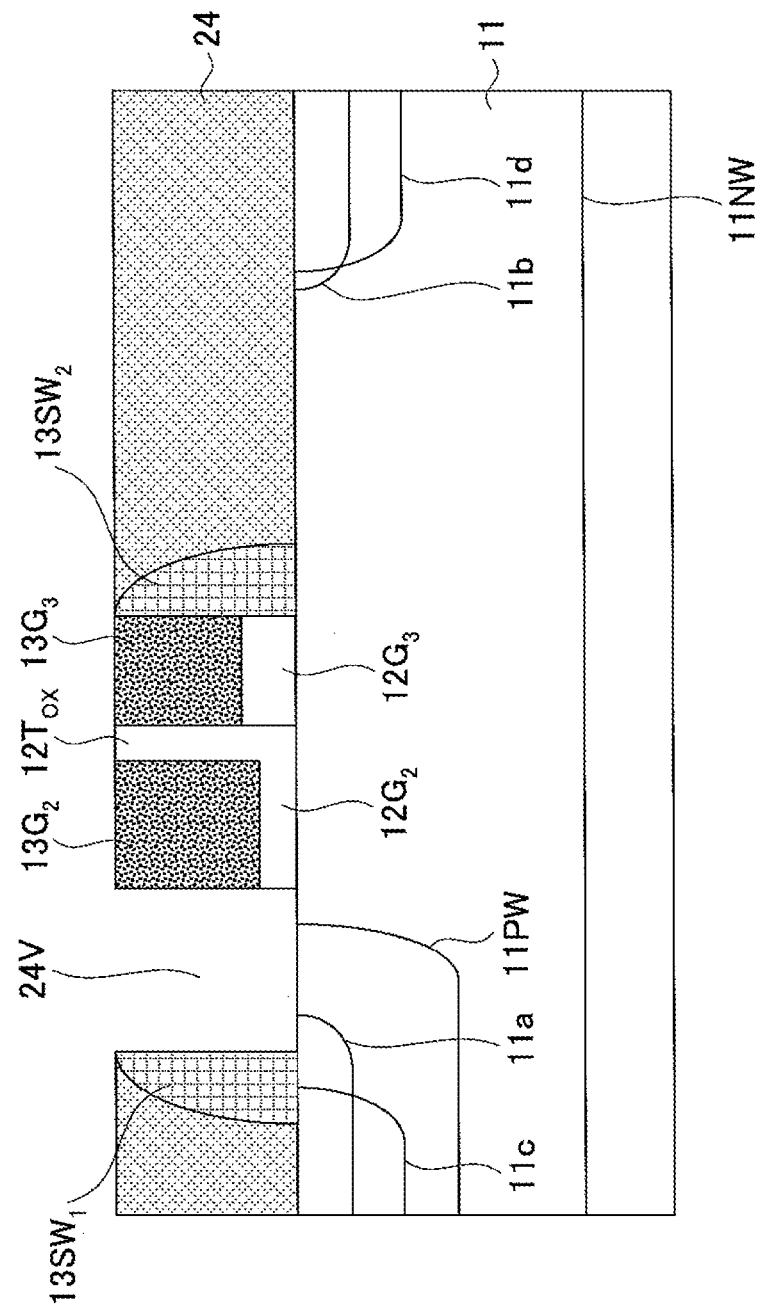

Further, in the step of FIG. 13F, the polysilicon pattern 131 is removed by a dry etching process while using the hard mask pattern 14HM as a mask, and the void 24V is formed to expose the surface of the silicon substrate 11 at the bottom thereof by further removing the exposed thermal oxide film 12Tox by a wet etching process. With this, the polysilicon pattern 13$_1$ is patterned to form the second gate electrode 13G$_2$ of n$^+$-type and the thermal oxide film 12Tox forms the second gate electrode 12G$_2$. Further, the thermal oxide film 12Tox intervenes between the gate electrode 12G$_2$ and the gate electrode 12G$_3$ and isolates the same form each other.

Figure 13G:
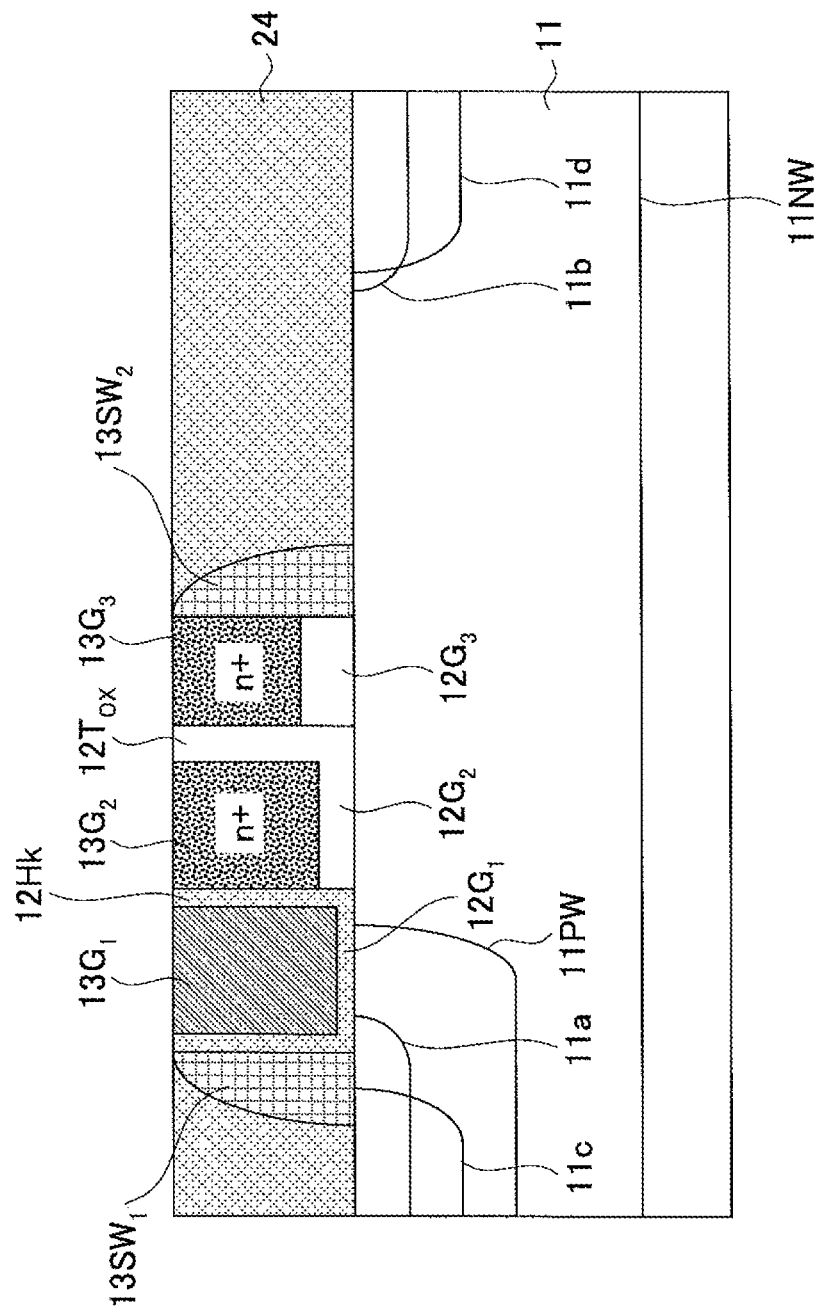

Further, in the step of FIG. 13G, the high-K dielectric film 12Hk of HfO$_2$ or HfSiO$_4$ is formed to cover the bottom surface and the sidewall surfaces of the void 24V by a CVD process or ALD process similarly to the step of FIG. 3J, and the void 24V is then filled with conductive film (not illustrated) such as a conductive nitride film of TiN, or the like or a refractory metal such as Ti via the high-K dielectric film 12Hk. Further, by removing the conductive film by a chemical mechanical polishing process until the top surface of the provisional interlayer insulation film 24 is exposed, the first gate electrode 13G$_1$ is formed so as to fill the void 24V via the high-K dielectric film 12Hk. Further, the first gate insulation film 12G$_1$ is formed right underneath the first gate electrode 13G$_1$ by the high-K dielectric film 12Hk.

Figure 13H:
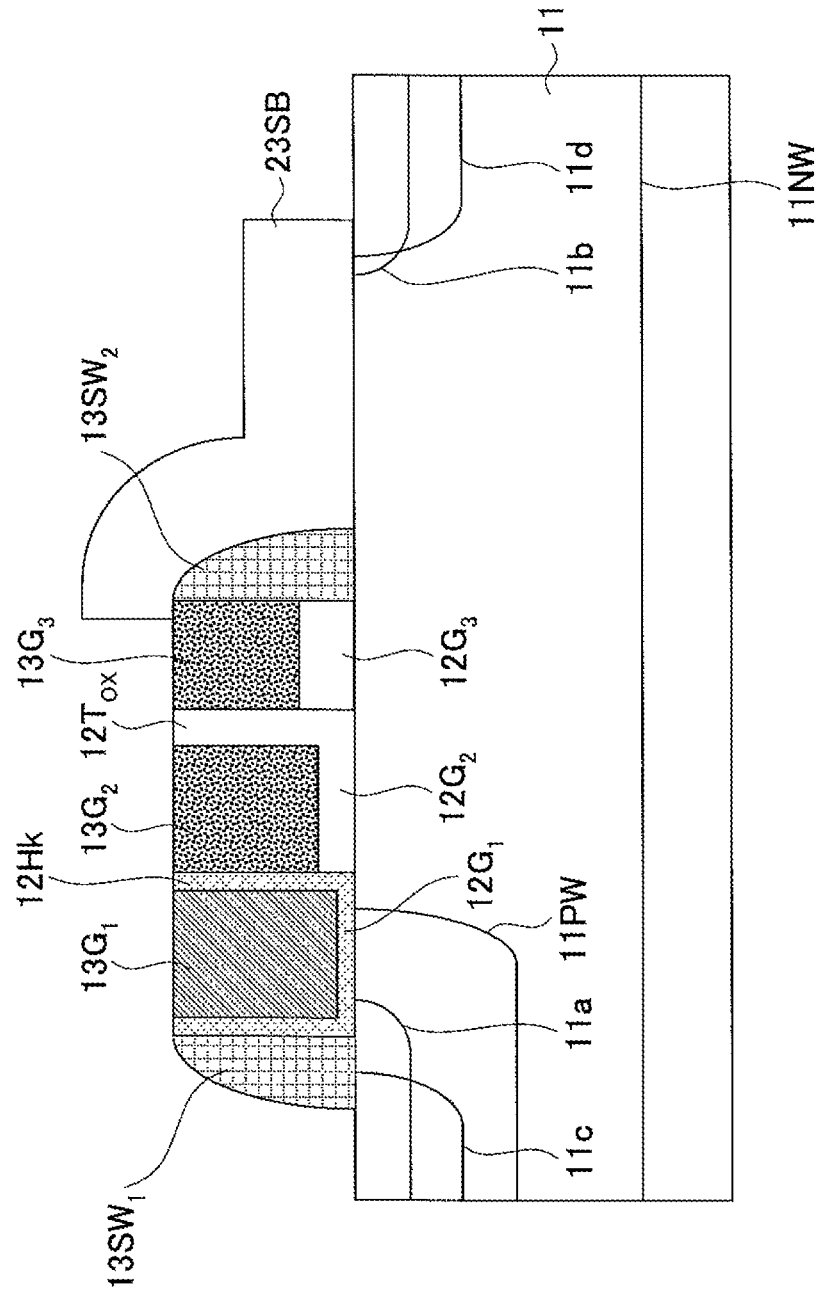
Figure 13I:
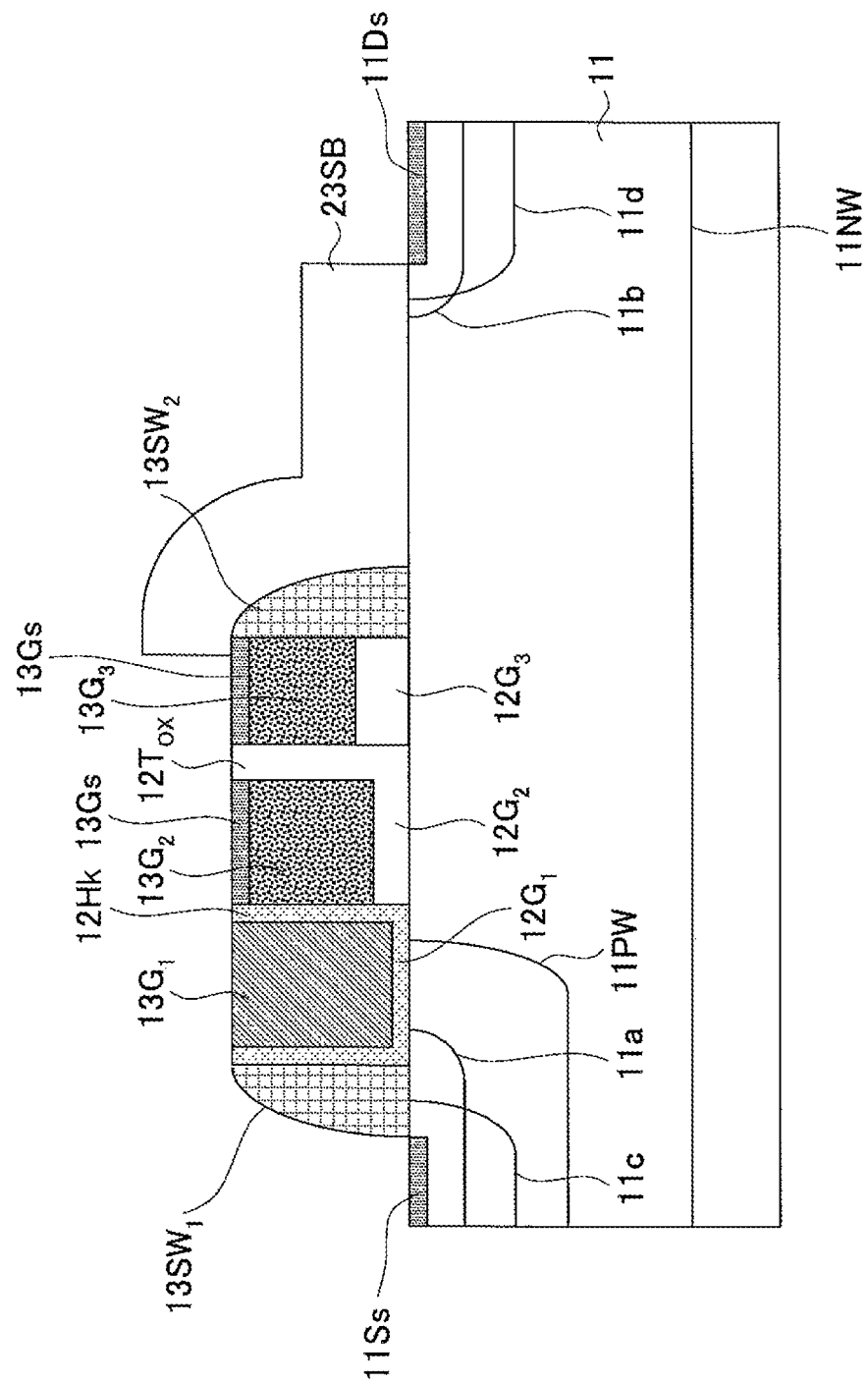

Further, in the step of FIG. 13H, the provisional interlayer insulation film 24 is removed and the part of the silicon substrate between the third gate electrode 13G$_3$ and the drain region 13d is covered by the silicide block pattern 23SB similar to the silicide block pattern 13SB. Further, by conducting silicide formation while using the silicide block pattern 23SB as a mask, the second and third gate electrodes 13G$_2$ and 13G$_3$ of polysilicon are formed with respective gate silicide layers 13Gs, and the source region 11c and the drain region 11d are formed respectively with the source silicide layer 11Ss and the drain silicide layer 11Ds.

While the present embodiment has been explained based on the first embodiment of FIG. 1, it is also possible to form the third gate electrode 13G$_3$ and the third gate insulation film 12G$_3$ similarly also in other embodiments.

Further, while the foregoing embodiments have been explained with regard to an n-channel high-voltage MOS transistor, it is also possible to fabricate a p-channel high-voltage MOS transistor by exchanging the p-type and n-type.

While the present invention has been explained for preferred embodiments, the present invention is not limited to such specific embodiments and various variations and modifications may be made within the scope of the invention described in patent claims.

According to the embodiments explained heretofore, it becomes possible to increase the ON-current and also the breakdown voltage of the semiconductor device as a result of constructing the gate insulation film by the first gate insulation film and the second gate insulation film of a larger thickness. Further, by isolating the first gate electrode and the second gate electrode with the insulation film, it becomes possible to increase the effective film thickness of the second gate insulation film further.

Thus, the present disclosures have been described herein with reference to preferred embodiments. While the present disclosures have been shown and described with particular examples, it should be understood that various changes and modifications may be made to the particular examples without departing from the scope of the broad spirit and scope of the present disclosures as defined in the claims.

All examples and conditional language used herein are intended for pedagogical purposes to aid the reader in understanding the principles of the disclosures and the concepts contributed by the inventor to furthering the art, and are to be construed as being without limitation to such specifically recited examples and conditions, nor does the organization of such examples in the specification relate to a showing of the superiority or inferiority of the disclosures. Although the embodiment of the present disclosures has been described in detail, it should be understood that various changes, substitutions, and alterations could be made hereto without departing from the spirit and scope of the disclosures.

What is claimed is:

1. A MOS transistor comprising:
   a semiconductor substrate formed with a first well of a first conductivity type;
   a second well formed in said first well in adjacent to said first well, said second well including a channel region of a second conductivity type adjacent to said first well;
   a source extension region of said first conductivity type formed in said second well at a first side of said channel region in contact with said channel region;
   a drain extension region of said first conductivity type formed in said first well at a second side opposite to said first side of said channel region with a separation from said channel region; and
   a gate electrode structure formed on said semiconductor substrate to cover said channel region and a part of said first well at said second side of said channel region,
   said gate electrode structure at least comprising: a first gate insulation film extending over said semiconductor substrate from a first side to a second side of said channel region, said first gate insulation film covering said channel region with a first film thickness, and a second gate insulation film adjacent to said first gate insulation film at said second side of said channel region, said second gate insulation film covering said part of said first well with a second film thickness larger than said first film thickness, said gate electrode structure further comprising a first gate electrode on said first gate insulation film, and a second gate electrode on said second gate insulation film, said first gate electrode and said second gate electrode being isolated from each other by an insulation film extending from said first gate insulation film, wherein said first gate electrode comprises a first conductive material, said first gate insulation film comprises a first insulating material, said second gate electrode comprises a second conductive material different from said first conductive material, and said second gate insulation film comprises a second insulating material different from said first insulating material.

2. A MOS transistor as claimed in claim 1, wherein said source extension region and said drain extension region include respectively a source region and a drain region of said first conductivity type, said source region and said drain region carrying respective silicide layers.

3. The MOS transistor as claimed in claim 1, wherein said first conductive material comprises a conductive metal nitride or a refractory metal, said first insulating material is an insulating metal oxide film, said second conductive material is a polysilicon of said first conductivity type, and said second insulating material is a silicon oxide film.

4. The MOS transistor as claimed in claim 1, wherein said first gate electrode comprises a conductive metal nitride or a refractory metal, said first gate insulation film comprises an insulating metal oxide film or a metal silicate film, said second gate electrode comprises a polysilicon of second conductivity type, said second gate insulation film comprises a silicon oxide film, and there is formed a depletion layer in said second gate electrode along an interface to said second gate insulation film.

5. The MOS transistor as claimed in claim 1, wherein said first gate electrode comprises a polysilicon of said first conductivity type, said second gate electrode comprises a conductive nitride film or a refractory metal, said first gate insulation film comprises a silicon oxide film, and said second gate insulation film comprises an insulating metal oxide film or a metal silicate film.

6. The MOS transistor as claimed in claim 3, further comprising an interlayer insulation film formed over said semiconductor substrate so as to cover said gate electrode structure and a gate interconnection pattern formed over said interlayer insulation film, wherein only said first gate electrode is connected electrically to said gate interconnection pattern via a via-contact in said interlayer insulation film.

7. The MOS transistor as claimed in claim 3, further comprising an interlayer insulation film formed over said semiconductor substrate so as to cover said gate electrode structure and a gate interconnection pattern formed over said interlayer insulation film, wherein said first gate electrode and said second gate electrode are connected electrically to said gate interconnection pattern via first and second via-contacts in said interlayer insulation film respectively.

8. The MOS transistor as claimed in claim 1, further comprising a third gate insulation film adjacent to said second gate insulation film at a side of said drain extension region with a third film thickness thicker than said second film thickness, and wherein there is formed a third gate electrode on said third gate insulation film with an isolation from said second gate electrode by an insulation film extending from said second gate insulation film.

* * * * *